(12) United States Patent
Fukuzumi

(10) Patent No.: US 7,205,590 B2
(45) Date of Patent: Apr. 17, 2007

(54) SEMICONDUCTOR MEMORY DEVICE PROVIDED WITH MAGNETO-RESISTIVE ELEMENT AND METHOD FOR FABRICATING THE SAME

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 10/880,641

(22) Filed: Jul. 1, 2004

(65) Prior Publication Data

US 2005/0205908 A1 Sep. 22, 2005

(30) Foreign Application Priority Data

Mar. 18, 2004 (JP) ............................. 2004-077760

(51) Int. Cl.
*H01L 27/10* (2006.01)
(52) U.S. Cl. .................... 257/211; 257/3; 257/208; 257/295
(58) Field of Classification Search ................ 257/295, 257/3, 208, 211
See application file for complete search history.

(56) References Cited

U.S. PATENT DOCUMENTS 6,590,244 B2 * 7/2003 Asao et al. ................ 257/295

OTHER PUBLICATIONS

Roy Scheuerlein, et al., "A 10ns Read and Write Non-Volatile Memory Array Using a Magnetic Tunnel Junction and FET Switch in each Cell", ISSCC 2000/SESSION 7/TD: Emerging Memory & Device Technologies.Paper TA 7.2, 2000, pp. 128-129.

Masashige Sato, et al., "Spin-Valve-Like Properties of Ferromagnetic Tunnel Junctions", Jpn. J. Appl. Phys, vol. 36, Part 2, No. 2B, Feb. 15, 1997 pp. 200-201.

* cited by examiner

*Primary Examiner*—Doug Menz
(74) *Attorney, Agent, or Firm*—Oblon, Spivak, McClelland, Maier & Neustadt, P.C.

(57) ABSTRACT

A semiconductor memory device includes a first wiring layer, a second wiring layer, a memory cell, and a contact plug. The first wiring layer is formed in an interlayer insulating film. The second wiring layer is formed on the interlayer insulating film. The memory cell includes a first ferromagnetic film formed on the second wiring layer, a tunnel barrier film formed on the first ferromagnetic film, and a second ferromagnetic film formed on the tunnel barrier film. The contact plug is formed on the first wiring layer and connects the first wiring to the second wiring layer, and the upper surface of the contact plug is in a position higher than that of the second wiring layer.

5 Claims, 43 Drawing Sheets

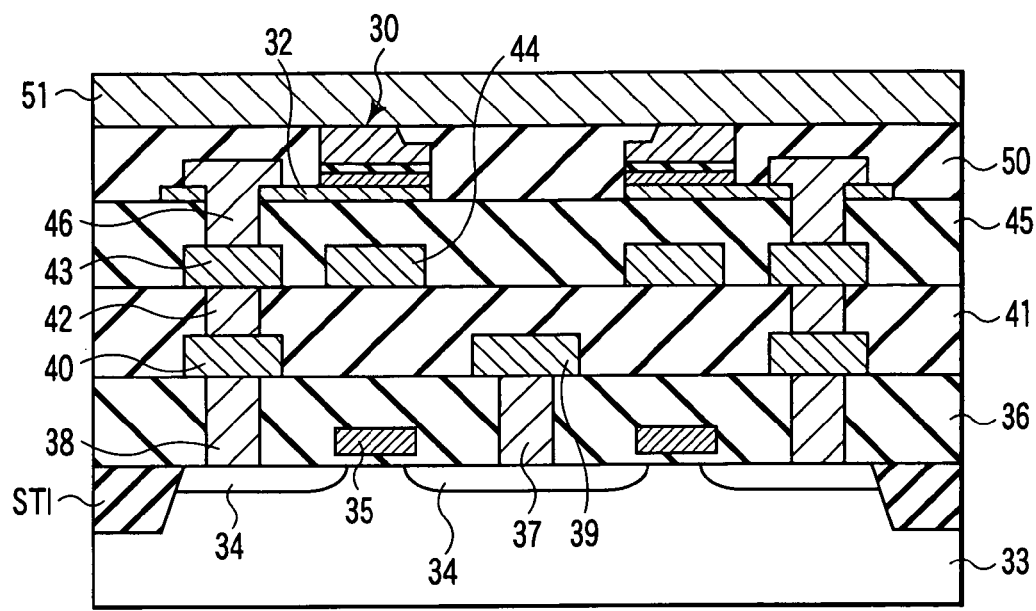
F I G. 3 5
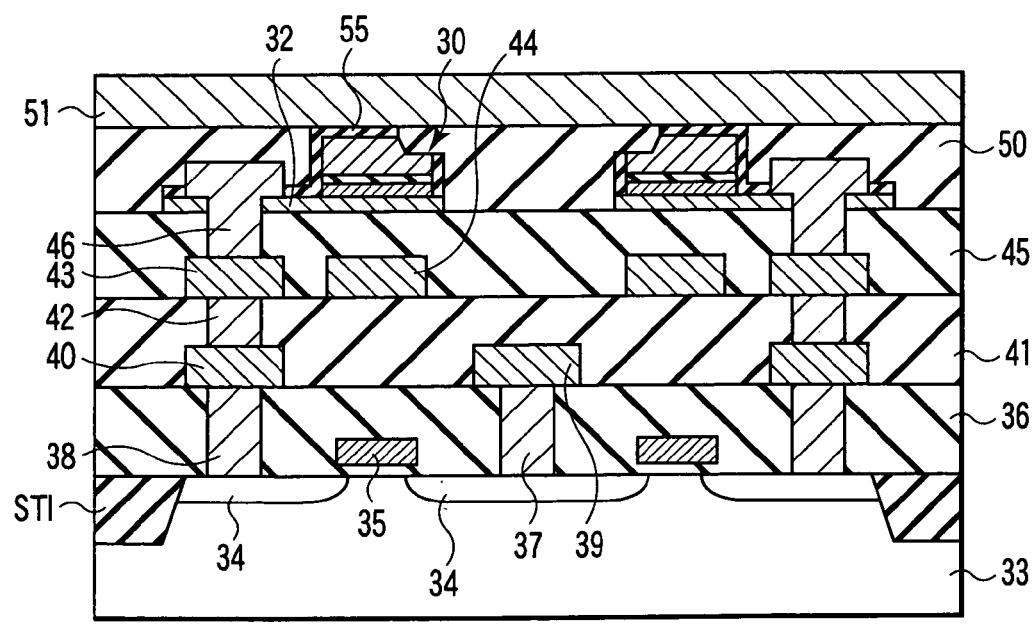
F I G. 3 6

To first MRAM data rewrite control section

SEMICONDUCTOR MEMORY DEVICE PROVIDED WITH MAGNETO-RESISTIVE ELEMENT AND METHOD FOR FABRICATING THE SAME

CROSS-REFERENCE TO RELATED APPLICATIONS

This application is based upon and claims the benefit of priority from prior Japanese Patent Application No. 2004-077760, filed Mar. 18, 2004, the entire contents of which are incorporated herein by reference.

BACKGROUND OF THE INVENTION

1. Field of the Invention

The present invention relates to a semiconductor memory device and a method for fabricating the device, particularly to a magneto-resistive element disposed in a magneto-resistive random access memory (MRAM) and a peripheral structure.

2. Description of the Related Art

An MRAM is a generic name of a solid-state memory using a magnetization direction of a ferromagnetic body as a recording carrier of information and capable of rewriting, holding, or reading recorded information as occasion demands.

A memory cell of the MRAM has a structure in which a plurality of ferromagnetic films are usually laminated. The information is recorded depending on whether a relative arrangement of magnetization of a plurality of ferromagnetic films forming the memory cell is parallel or anti-parallel in accordance with binary data of "1", "0". The magnetization directions of the ferromagnetic films of each memory cell are reversed by a current magnetic field to write the data.

In the MRAM whose practical use has been studied at present, a magnetic tunnel junction (hereinafter abbreviated as MTJ) is used in the memory cell. This structure has been described, for example, in "IEEE International Solid-State Circuits Conference 2000 Digest Paper", TA7.2. The MTJ comprises a three layer film mainly formed of a ferromagnetic layer/insulating layer/ferromagnetic layer, and a tunnel current flows through the insulating layer. A resistance value of the junction changes in proportion to a cosine of a relative angle of magnetization of both ferromagnetic layers. Moreover, the resistance value of the junction takes a maximum value in a case where the directions of magnetization of both the ferromagnetic layers are anti-parallel. This is a tunnel magneto-resistive effect. One type of the MTJ has a structure that retains data utilizing a difference in magnetic coercive force between both ferromagnetic films. Another type of the MTJ has a so-called spin valve structure in which an antiferromagnetic layer is disposed adjacent to one of the ferromagnetic films to fix the direction of the magnetization for a purpose of improvement of a magnetic sensitivity or reduction of a write current. This structure is described, for example, in "Japanese Journal of Applied Physics", 1997, No. 36, p. 200.

However, in general, since a material for use in forming an MTJ element has a low vapor pressure, RIE having a high power is used in manufacturing process. Therefore, a charge damage with respect to the MTJ element raises a serious problem.

BRIEF SUMMARY OF THE INVENTION

A semiconductor memory device according to an aspect of the present invention comprises:

a first wiring layer formed in an interlayer insulating film;

a second wiring layer formed on the interlayer insulating film;

a memory cell comprising a first ferromagnetic film formed on the second wiring layer, a tunnel barrier film formed on the first ferromagnetic film, and a second ferromagnetic film formed on the tunnel barrier film; and a contact plug which is formed on the first wiring layer and which connects the first wiring layer to the second wiring layer, an upper surface of the contact plug being in a position higher than that of the second wiring layer.

A method for fabricating a semiconductor memory device according to an aspect of the present invention comprises:

forming a first interlayer insulating film on a semiconductor substrate;

forming a first wiring layer on the first interlayer insulating film;

forming a second wiring with which the first wiring layer is covered on the first interlayer insulating film;

forming a first ferromagnetic layer on the second wiring layer;

forming a tunnel barrier film on the first ferromagnetilovelostc layer;

forming a second ferromagnetic layer on the tunnel barrier film;

patterning the first and second ferromagnetic layers and the tunnel barrier film to form a magneto-resistive element;

patterning the second wiring layer;

forming a second interlayer insulating film with which at least side surfaces of the first and second ferromagnetic layers and the tunnel barrier film are covered on the first interlayer insulating film; and making contact plugs which connect the first wiring layer to the second wiring layer in the first and second interlayer insulating films.

BRIEF DESCRIPTION OF THE SEVERAL VIEWS OF THE DRAWING

FIGS. 34 to 36 are sectional views of the MRAM according to first to third modifications of the third embodiment of the present invention;

DETAILED DESCRIPTION OF THE INVENTION

Figure 1:
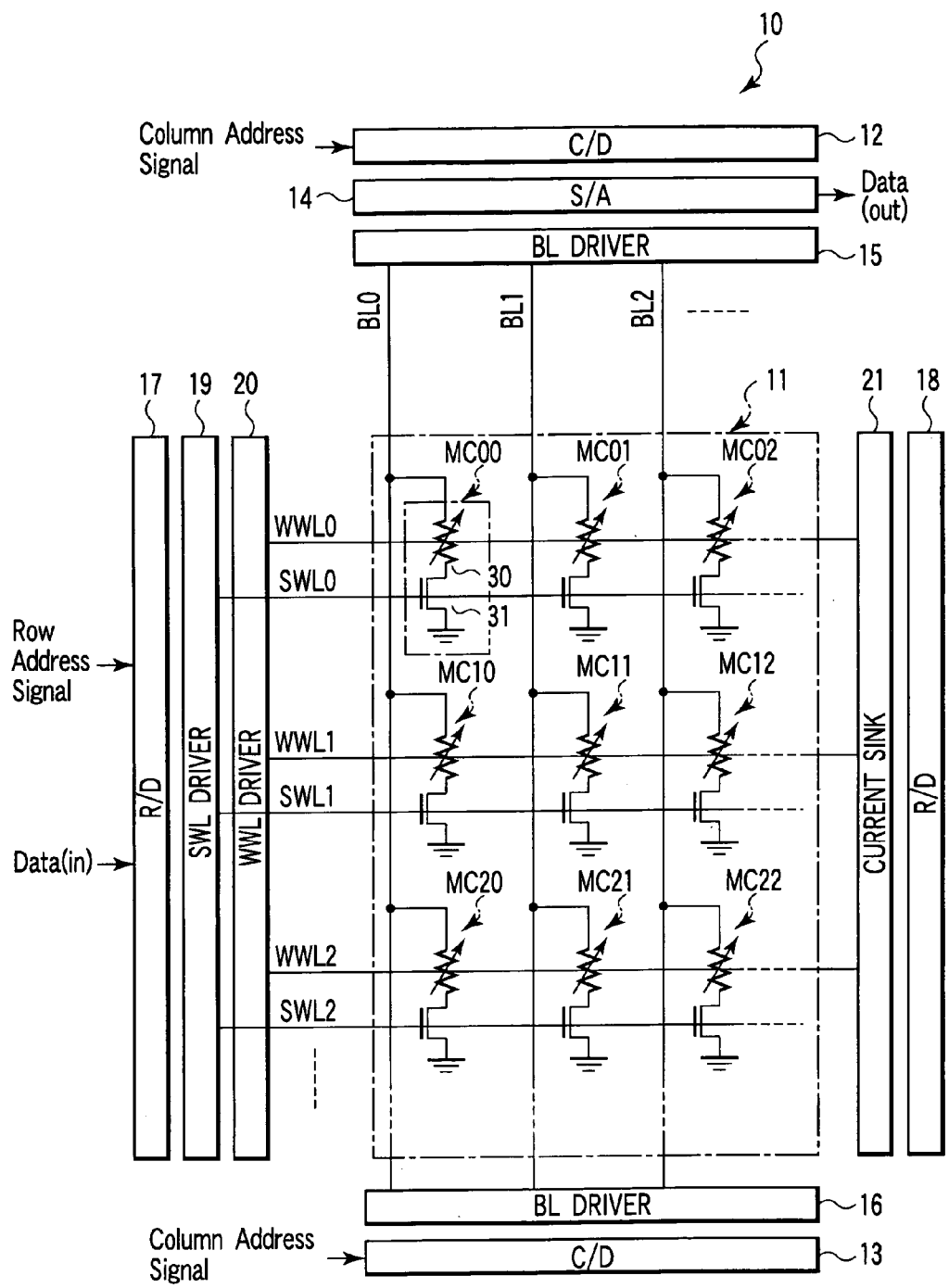
FIG. 1 is a block diagram of an MRAM according to a first embodiment of the present invention.

A semiconductor memory device and a method for fabricating the device according to a first embodiment of the present invention will be described with reference to FIG. 1. FIG. 1 is a block diagram of an MRAM according to the present embodiment.

As shown, an MRAM 10 comprises a memory cell array 11, column decoders 12, 13, a sense amplifier 14, bit line drivers 15, 16, row decoders 17, 18, a selection word line driver 19, a write word line driver 20, and a current sink 21.

The memory cell array 11 includes a plurality of memory cells MC arranged in a matrix form ((m+1)×(n+1) cells, additionally m, n are natural numbers, and FIG. 1 shows only (3×3) cells). Each of memory cells MC includes a magneto-resistive element 30 and a switching transistor 31. The magneto-resistive element 30 is, for example, an MTJ element. One end of the magneto-resistive element 30 is connected to any of bit lines BL0 to BLn, and the other end is connected to one end of a current path of the switching transistor 31. A gate of the switching transistor 31 is connected to any of selection word lines SWL0 to SWLm, and the other end of the current path is connected to a ground potential. Moreover, any of write word lines WWL0 to WWLm is disposed in the vicinity of the magneto-resistive element 30. The gates of the switching transistors 31 of the memory cells arranged in the same row are connected in common to any of the selection word lines SWL0 to SWLm. Any of the write word lines WWL0 to WWLm is wired in the vicinity of the magneto-resistive elements 30 of the memory cells arranged in the same row. Furthermore, one end of the magneto-resistive element 30 of the memory cell disposed in the same column is connected in common to any of the bit lines BL0 to BLn. It is to be noted that the write word lines WWL0 to WWLm are arranged so as to cross the bit lines BL0 to BLn at right angles.

The column decoders 12, 13 decode column address signals to obtain column address decoded signals.

The bit line drivers 15, 16 function as either a current source or a current sink. When one of the bit line drivers 15, 16 functions as the current source at a write time, the other driver functions as the current sink. Moreover, the driver functioning as the current source selects any bit line based on the column address decoded signal to supply a current to the selected bit line BL. Moreover, the current supplied from the current source flows into the current sink. Write data into the memory cell can be controlled depending on either of the bit line drivers 15, 16 that supplies the current.

The row decoders 17, 18 decode row address signals to obtain row address decoded signals.

The selection word line driver 19 selects any of the selection word lines SWL0 to SWLm based on the row address decoded signal at write and read times. Moreover, a voltage is supplied to the selected selection word line.

The write word line driver 20 selects any write word line based on the row address decoded signal. Moreover, a write current is supplied to the selected write word line. The current flows into the current sink 21 through the vicinity of the selected memory cell. It is to be noted that when write data is controlled by the current passed through the write word line, the write word line driver 20 and current sink 21 may be formed to function as either the current source or the current sink.

The sense amplifier 14 amplifies the data read from the memory cell selected by the row decoders 17, 18 and column decoders 12, 13.

Figure 2:
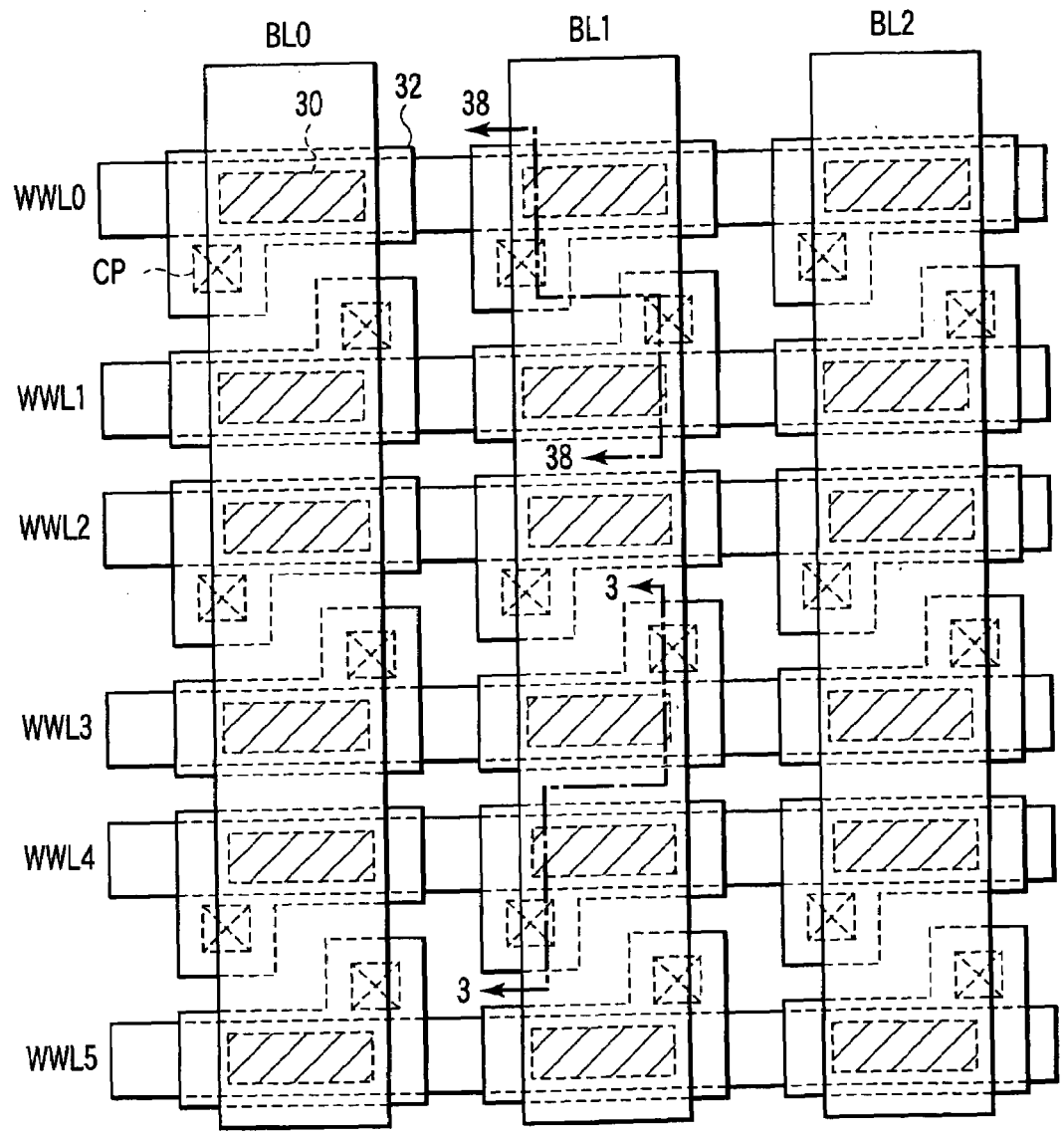
FIG. 2 is a plan view of the MRAM according to the first embodiment of the present invention.

Next, a flat pattern of the memory cell array 11 will be described with reference to FIG. 2. FIG. 2 is a plan view of the memory cell array 11. For simplification, the switching transistor is omitted from the drawing. It is to be noted that directions shown in the drawing are defined as a hard-axis direction and an easy-axis direction.

As shown, (1+n) bit lines BL0 to BLn are arranged along the hard-axis direction (FIG. 2 shows only bit lines BL0 to BL2), and (1+m) write word lines WWL0 to WWLm are disposed along the easy-axis direction crossing the hard-axis direction at right angles (FIG. 2 shows only the write word lines WWL0 to WWLm). Moreover, the magneto-resistive elements 30 are arranged in intersection portions between the bit lines BL0 to BLn and the write word lines WWL0 to WWLm. The bit lines BL0 to BLn are electrically connected to one end of the magneto-resistive element 30. On the other hand, the write word lines WWL0 to WWLm are electrically separated from the magneto-resistive elements 30, and are arranged in the vicinity of the magneto-resistive elements 30.

The magneto-resistive element 30 has a substantially rectangular shape whose longitudinal direction extends along the easy-axis direction and whose short direction extends along the hard-axis direction. The shape of the magneto-resistive element is not limited to a rectangular shape, and may be an elliptic shape whose long axis extends along the easy-axis direction. Moreover, the other end of the magneto-resistive element 30 is connected to the switching transistor 31 (not shown) via a metal wiring layer 32 and contact plug CP.

Figure 3:
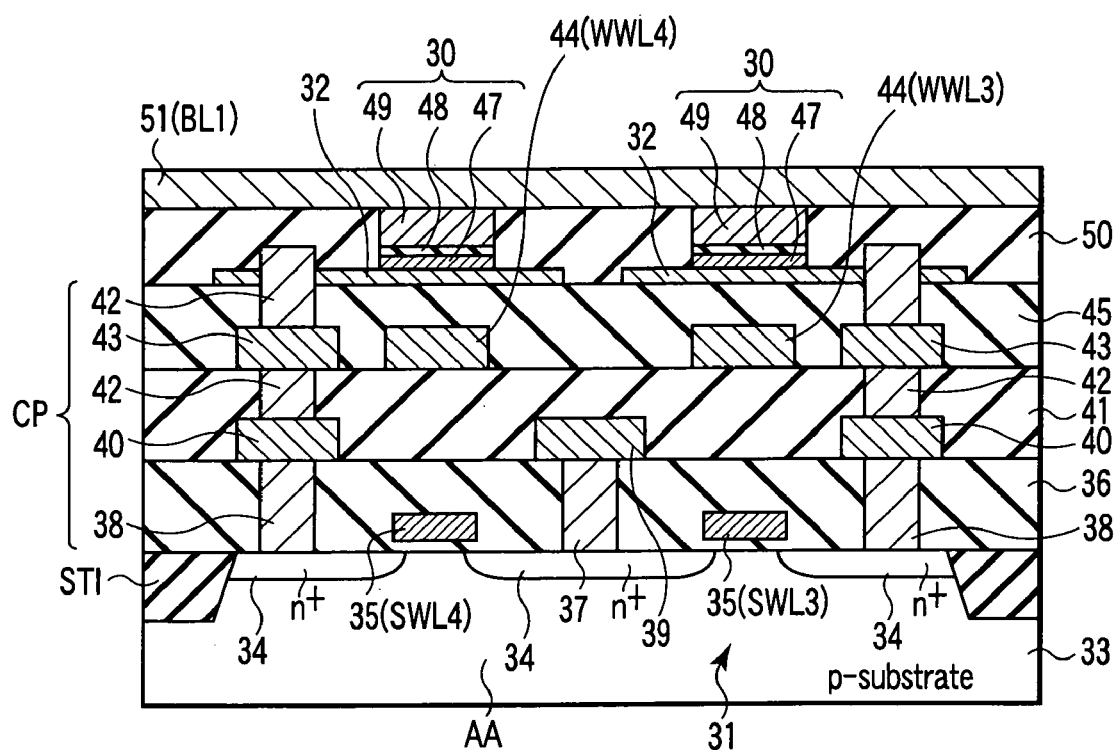
FIG. 3 is a sectional view along a 3—3 line in FIG. 2.

Next, a sectional structure of the memory cell array 11 will be described with reference to FIG. 3. FIG. 3 is a sectional view along a 3—3 line in FIG. 2.

As shown, element isolation regions STI are formed in a p-type semiconductor substrate 33, and the switching transistor 31 is formed in an element region AA whose periphery is surrounded with the element isolation regions. The switching transistor 31 comprises impurity diffusion layers 34 formed in the surface of the semiconductor substrate 33, a gate insulating film (not shown), and gate electrodes 35. The gate electrode 35 functions as any of the selection word lines SWL0 to SWLm, and is formed in a stripe form along the easy-axis direction (vertical direction with respect to a sheet surface).

An interlayer insulating film 36 is formed on the semiconductor substrate 33. The switching transistor 31 is coated with the interlayer insulating film 36, and contact plugs 37, 38 are formed in the interlayer insulating film 36. The contact plugs 37, 38 are connected to one (source region) and the other (drain region) of the impurity diffusion layers 34 of the switching transistor 31, respectively.

Metal wiring layers 39, 40 connected to the contact plugs 37, 38, respectively, are formed on the interlayer insulating film 36. The metal wiring layer 39 is connected to a ground potential, and supplies the ground potential to the source region of the switching transistor 31 via the contact plug 37. Furthermore, an interlayer insulating film 41 is formed on the interlayer insulating film 36. The metal wiring layers 39, 40 are coated with the interlayer insulating film 41, and contact plugs 42 are formed in the interlayer insulating film 41. The contact plugs 42 are connected to the metal wiring layer 40.

On the interlayer insulating film 41, metal wiring layers 43 connected to the contact plugs 42, and metal wiring layers 44 electrically separated from the metal wiring layers 43 are formed. The metal wiring layer 44 functions as any of the write word lines WWL0 to WWLm, and is formed in the striped form along the easy-axis direction. The metal wiring layers 44 are formed so as to substantially overlap with electrically connected gate electrodes 35 of the switching transistor 31. The metal wiring layers 43, 44 are coated with an interlayer insulating film 45, and contact plugs 46 are formed in the interlayer insulating film 45. The contact plugs 46 are connected to the metal wiring layers 43.

On the interlayer insulating film 45, metal wiring layers 32 connected to the contact plugs 46 are formed. The metal wiring layer 32 functions as a withdrawing wiring layer, and is formed of a multilayered film in which, for example, a Ta layer having a film thickness of 3 nm, an Al layer having a film thickness of 30 nm, and a Ta layer having a film thickness of 30 nm are successively formed. The magneto-resistive element 30 is formed on the nonmagnetic conductive layer 32. The magneto-resistive element 30 is formed so as to overlap with the metal wiring layer 44 with the interlayer insulating film 45 and metal wiring layer 32 interposed therebetween. The magneto-resistive element 30 is, for example, an MTJ element having a structure in which the insulating film is held between the magnetic films. That is, a magnetic film 47 is formed on the metal wiring layer 32, an insulating film 48 is formed on the magnetic film 47, and a magnetic film 49 is formed on the insulating film 48. These magnetic films 47, 49 and insulating film 48 form the MTJ element. A direction of magnetization of the magnetic film 49 is set to a predetermined direction beforehand. Additionally, the direction of the magnetization of the magnetic film 47 is set to be parallel or anti-parallel with respect to the magnetic film 49, accordingly two states are produced, and "0" data or "1" data is written. That is, the magnetic film 49 functions as a pinning layer, and is formed of a laminate film in which, for example, a seed layer (or a buffer layer) formed of Permalloy (Py: NiFe alloy) having a film thickness of 3 nm, an antiferromagnetic layer formed of IrMn having a film thickness of 15 nm, and a fixed ferromagnetic layer formed of a CoFe layer having a film thickness of 5 nm are successively formed. The insulating film 48 functions as a tunnel barrier film, and is formed, for example, of an $Al_2O_3$ layer having a film thickness of about 1 to 1.5 nm. The magnetic film 47 functions as a free layer, and is formed by a laminate film in which, for example, a CoFe layer 34 having a film thickness of 4 nm and a Py layer 35 having a film thickness of 20 nm are successively formed.

Furthermore, an interlayer insulating film 50 is formed on the interlayer insulating film 45. The metal wiring layer 32 and magneto-resistive element 30 are coated with the interlayer insulating film 50. Further on the interlayer insulating film 50, a metal wiring layer 51 is formed and connected to the magnetic films 49. The metal wiring layer 51 functions as any of the bit lines BL0 to BLn, and is formed in the striped form along the hard-axis direction (left/right direction in the sheet surface).

The memory cell array 11 of the MRAM is formed as described above. It is to be noted that on the magnetic film 49, a cap layer may also be formed in which, for example, a Ta layer having a film thickness of 20 nm, an Al layer having a film thickness of 50 nm, and a Ta layer having a film thickness of 10 nm are successively formed.

Figure 4:
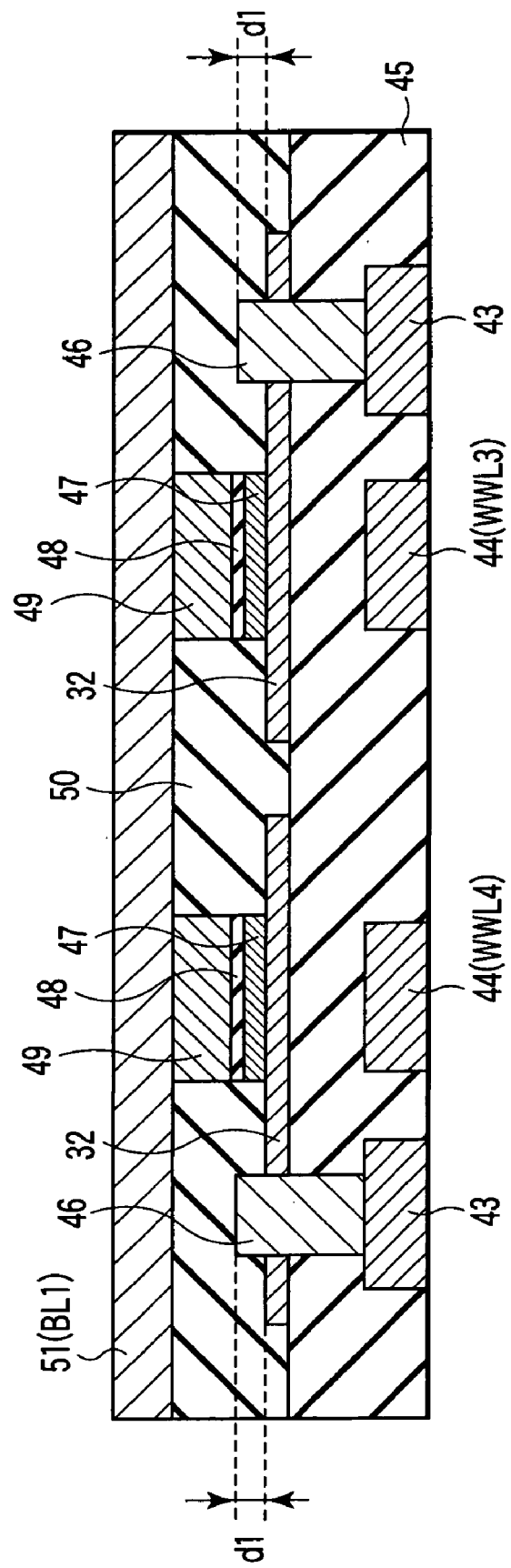
FIG. 4 is an enlarged view of a partial region of FIG. 3.

FIG. 4 is an enlarged view of a partial region in FIG. 3, and is a sectional view showing a region in a level higher than that of the interlayer insulating film 41. As shown, the contact plugs 46 are formed in the interlayer insulating films 45, 50 so as to extend through the metal wiring layer 32. Moreover, the upper surface of the contact plug 46 is positioned to be higher than that of the metal wiring layer 32 by a height d1.

Next, a method for fabricating the MRAM 10 described above will be described with reference to FIGS. 5 to 13. FIGS. 5 to 13 are sectional views successively showing fabricating steps of the MRAM 10 according to the present embodiment.

Figure 5:
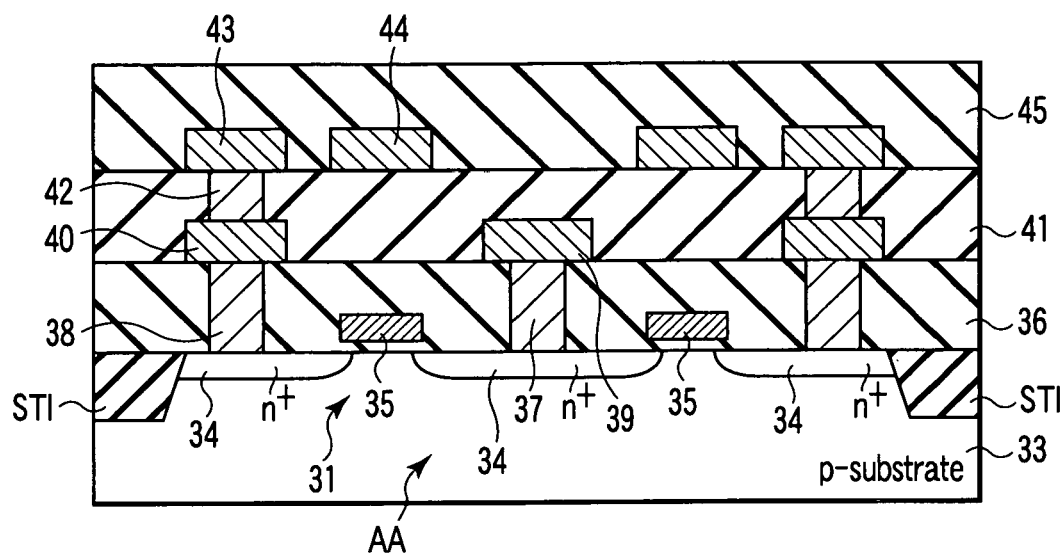
FIGS. 5 to 13 are sectional views successively showing first to ninth fabricating steps of the MRAM according to the first embodiment of the present invention.

First as shown in FIG. 5, the element isolation regions STI are formed in the semiconductor substrate 33. Moreover, the selection transistor 31 is formed on the element region AA surrounded with the element isolation regions STI by a known method. The gate electrodes 35 of the selection transistor 31 are formed in the striped form along the easy-axis direction. Next, the interlayer insulating film 36 is formed on the semiconductor substrate 33. The selection transistor 31 is coated with the interlayer insulating film 36. Thereafter, the contact plugs 37, 38 are formed in the interlayer insulating film 36. The contact plugs 37, 38 are connected to the source region and drain region 34 of the selection transistor.

Next, the metal wiring layers 39, 40 are formed on the interlayer insulating film 36. The metal wiring layers 39, 40 are connected to the contact plugs 37, 38, respectively. Moreover, the interlayer insulating film 41 is formed on the interlayer insulating film 36. Subsequently, the contact plugs 42 are formed in the interlayer insulating film 41. The contact plug 42 is connected to the metal wiring layer 40.

Next, the metal wiring layers 43, 44 are formed on the interlayer insulating film 41. The metal wiring layers 43 are connected to the contact plugs 42. The metal wiring layers 44 are isolated from the metal wiring layers 43, formed in the striped shape along the easy-axis direction, and positioned right above the gate electrodes 35. Thereafter, the interlayer insulating film 45 is formed on the interlayer insulating film 41. The metal wiring layers 43, 44 are coated with the interlayer insulating film 45.

Figure 6:
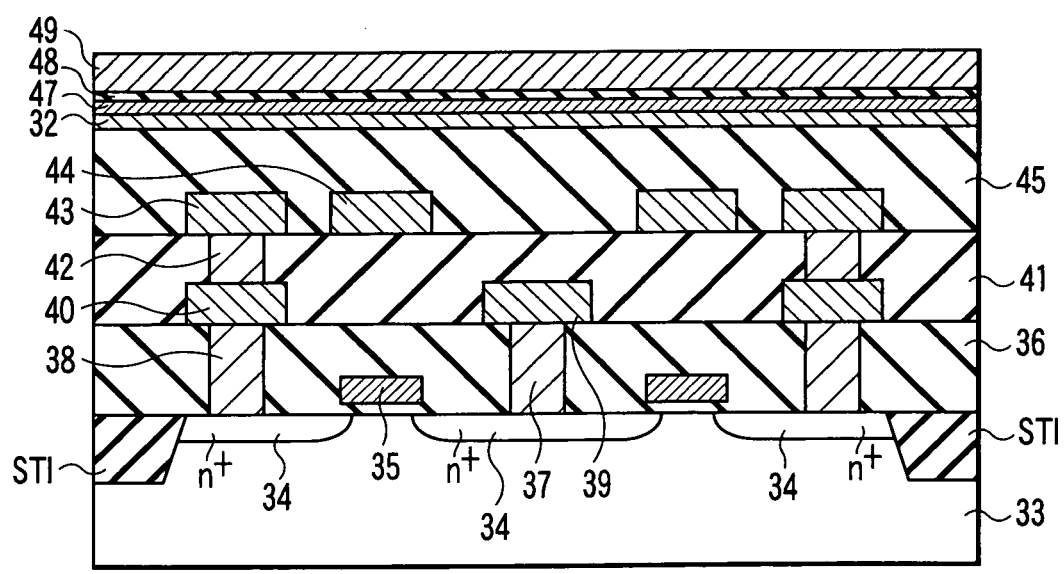

Next, as shown in FIG. 6, the metal wiring layer 32, ferromagnetic layer 47, tunnel barrier film 48, and ferromagnetic layer 49 are successively formed on the interlayer insulating film 45, for example, by a sputtering.

Figure 7:
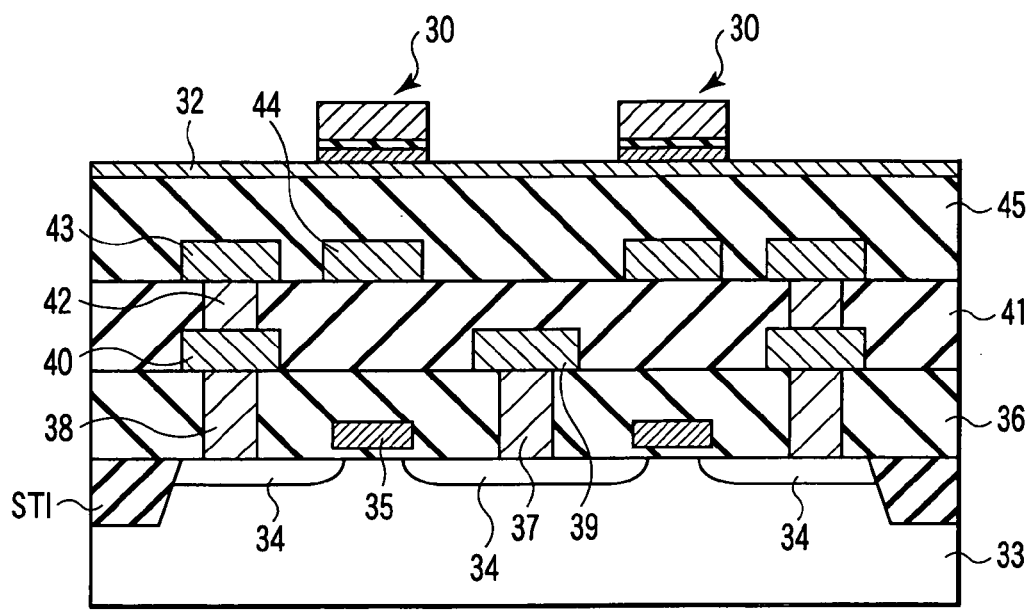

Next, as shown in FIG. 7, the ferromagnetic layers 47, 49 and tunnel barrier film 48 are patterned using a photolithography technique and a reactive ion etching (RIE) process, or Ar ion milling. As a result, the magneto-resistive element 30 separated for each memory cell is formed.

Figure 8:
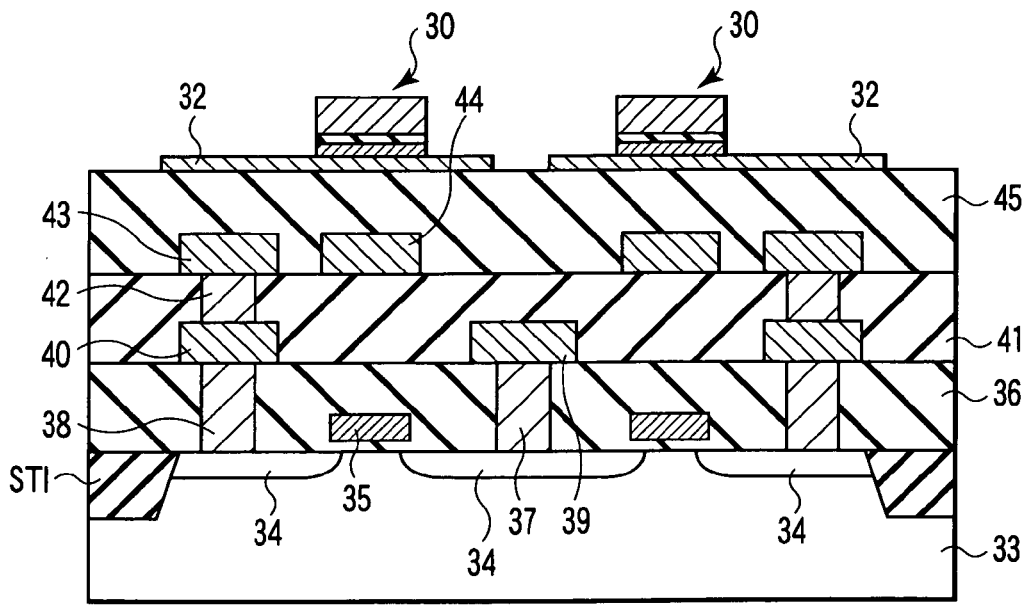

Subsequently, as shown in FIG. 8, the metal wiring layer 32 is etched by the photolithography technique and RIE, or ion milling to form the withdrawing wiring layer 32 as shown.

Figure 9:
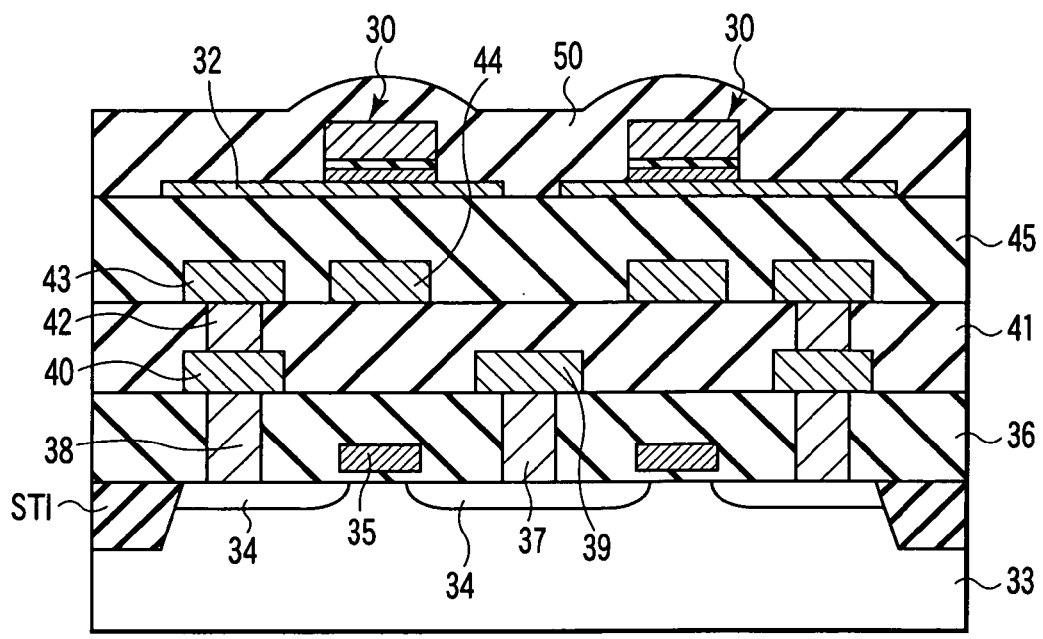

Next, as shown in FIG. 9, the interlayer insulating film 50 is formed on the interlayer insulating film 45. The magneto-resistive elements 30 and withdrawing wiring layers 32 are coated with the interlayer insulating film 50.

Figure 10:
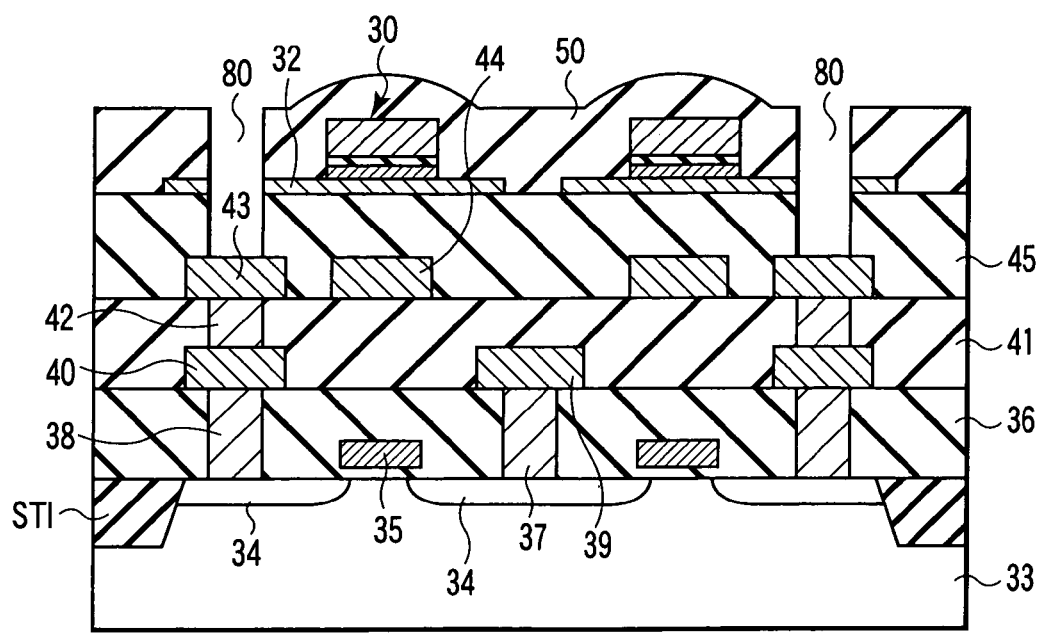

Next, as shown in FIG. 10, contact holes 80 are made by the photolithography technique, and anisotropic etching such as the RIE. The contact holes 80 extend through the interlayer insulating film 50 and withdrawing wiring layers 32 to reach the metal wiring layers 43. That is, the upper surface of the metal wiring layer 43 is exposed in a bottom portion of the contact hole 80, and the side surface of the withdrawing wiring layer 32 is exposed in a part of the side surface.

Figure 11:
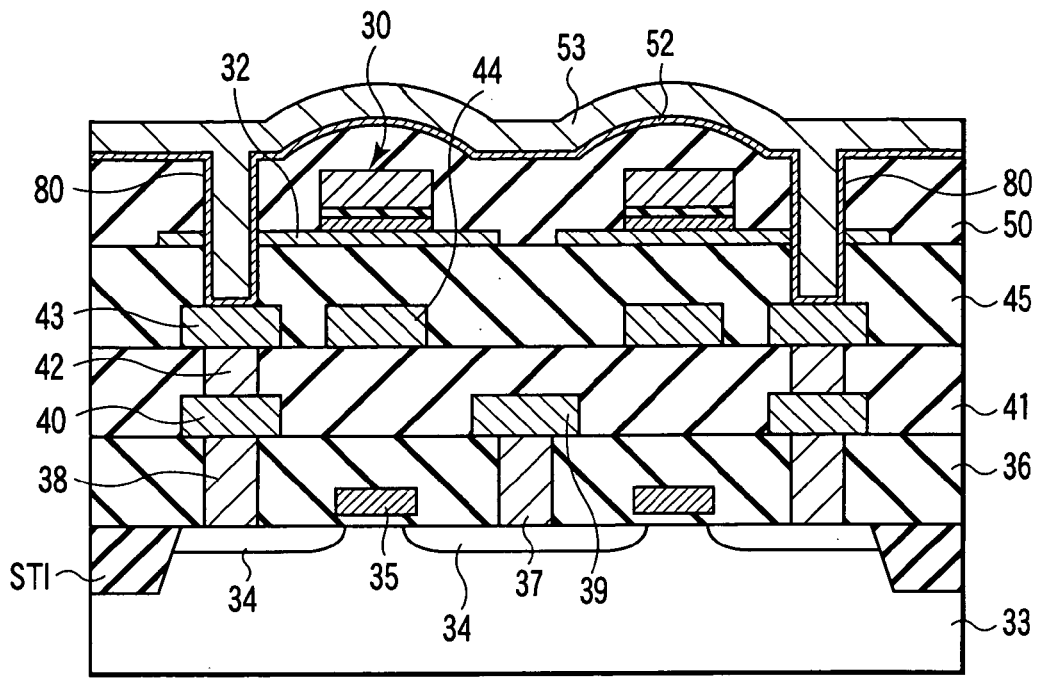

Next, as shown in FIG. 11, a barrier metal layer 52 is formed on the interlayer insulating film 50 and on the side and bottom surfaces of the contact holes 80, for example, by the sputtering. The barrier metal layer 52 is formed, for example, of a TiN layer. Subsequently, a conductive layer 53 is formed on the barrier metal layer 52, for example, by the sputtering. The conductive layer 53 fills the contact plug 51, and is formed, for example, of an Al layer.

Figure 12:
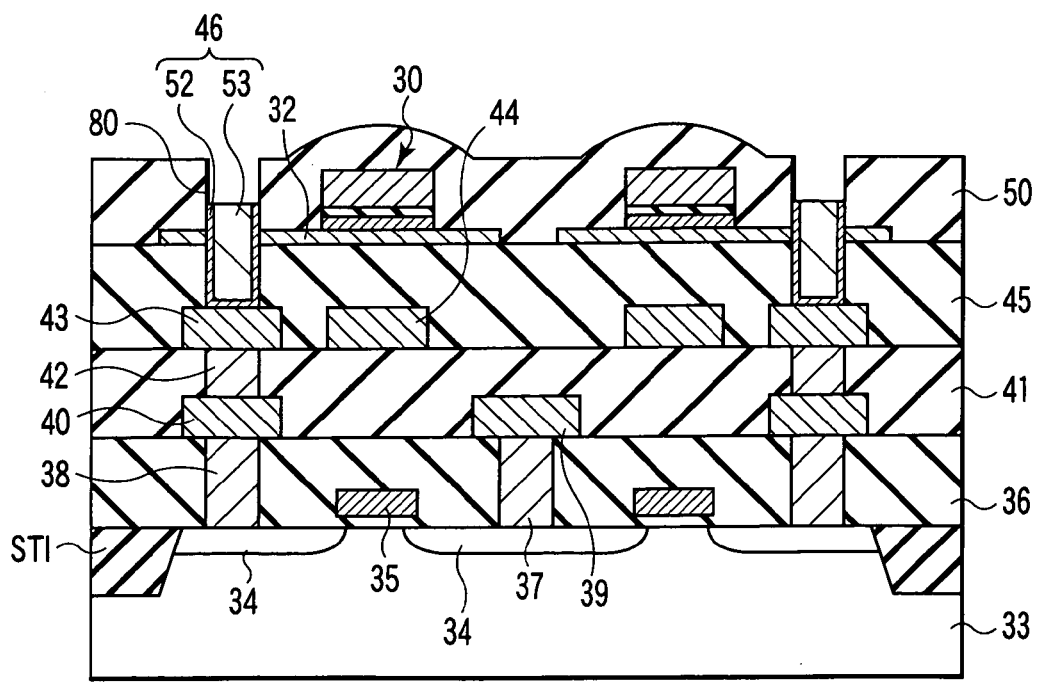

Next, as shown in FIG. 12, the barrier metal layer 52 and conductive layer 53 are etched back, for example, by the RIE or the like, and are left only in the contact holes 80. As a result, as shown, the contact plugs 46 which extend through the withdrawing wiring layers 32 and whose upper surfaces are positioned higher above those of the withdrawing wiring layers 32 are completed.

Next, an interlayer insulating film 54 is formed on the interlayer insulating film 50 to fill regions above the contact plugs 46 in the contact holes 80. Moreover, the interlayer insulating films 54, 50 are polished by chemical mechanical polishing (CMP) using the magneto-resistive element 30 as a stopper to obtain a structure shown in FIG. 13.

Thereafter, the metal wiring layer functioning as the bit line and the like are formed to complete the structure shown in FIG. 3.

According to the MRAM and the fabricating method of the present embodiment, the following effect (1) is obtained.

(1) The magneto-resistive element can be protected from charge damage.

This respect will be described hereinafter in detail. A high-power RIE is used in the manufacturing process of the magneto-resistive element. Then, since a semiconductor wafer is exposed to plasma, the surface of the wafer is charged. By this charging, a large current flows in the magneto-resistive element and, as a result, the magneto-resistive element sometimes collapses.

However, in the structure of the present embodiment, the contact plugs 46 which electrically connect the magneto-resistive elements 30 to the semiconductor substrate 33 are formed after forming the magneto-resistive elements 30. Therefore, at a time when the magneto-resistive elements 30 are formed, current paths reaching the semiconductor substrate 33 from the magneto-resistive elements 30 do not exist. Therefore, the charges accumulated by the high-power RIE for use in forming the magneto-resistive elements 30 can be prevented from flowing in the magneto-resistive elements 30 through the tunnel barrier film 48. As a result, the magneto-resistive element can be inhibited from being destroyed by a plasma damage at a fabricating time, and fabricating yield of the MRAM can be enhanced.

Figure 14:
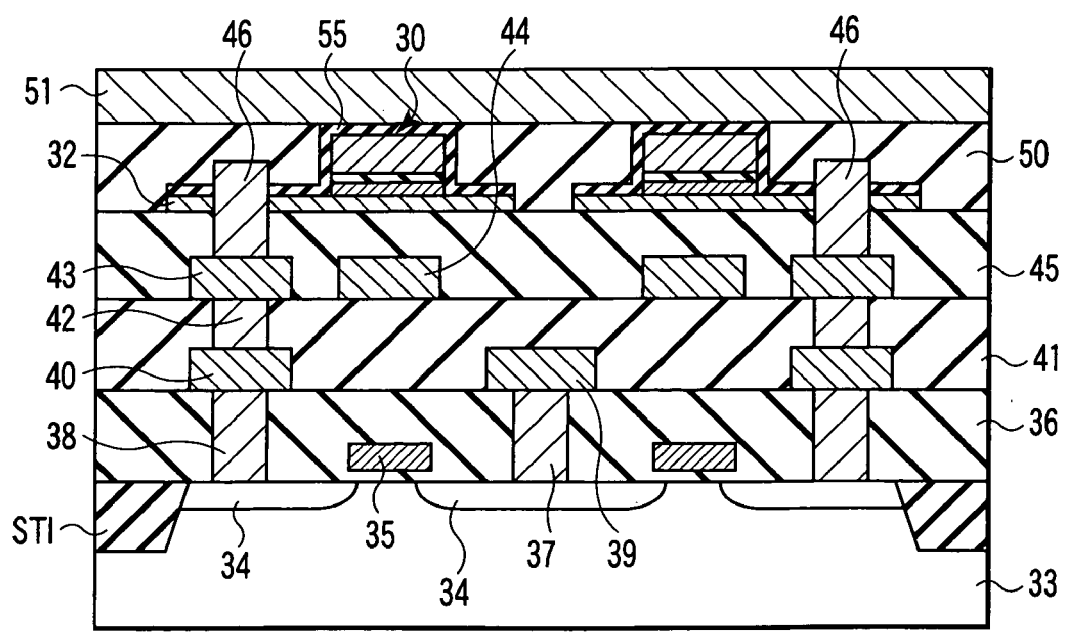
FIG. 14 is a sectional view of the MRAM according to a first modification of the first embodiment of the present invention.

FIG. 14 is a sectional view of the MRAM according to a first modification of the present embodiment. As shown, the MRAM 10 according to the present modification further comprises insulating films 55 formed on side walls of the magneto-resistive elements 30. In FIG. 14, the insulating films 55 are formed on the side and upper surfaces of the magneto-resistive elements 30 and on the withdrawing wiring layers 32. However, the insulating films may also be formed on at least the side surfaces of the magneto-resistive elements 30. Further in FIG. 14, the insulating films 55 exist between the metal wiring layer 51 forming the bit line and the magneto-resistive elements 30, and the metal wiring layer 51 is electrically connected to the magneto-resistive elements 30. Therefore, the insulating films 55 do not have to be formed on the upper surfaces of the magneto-resistive elements 30, or a partial region may be removed to connect the magneto-resistive elements 30 to the metal wiring layer 51 via the region.

Figure 15:
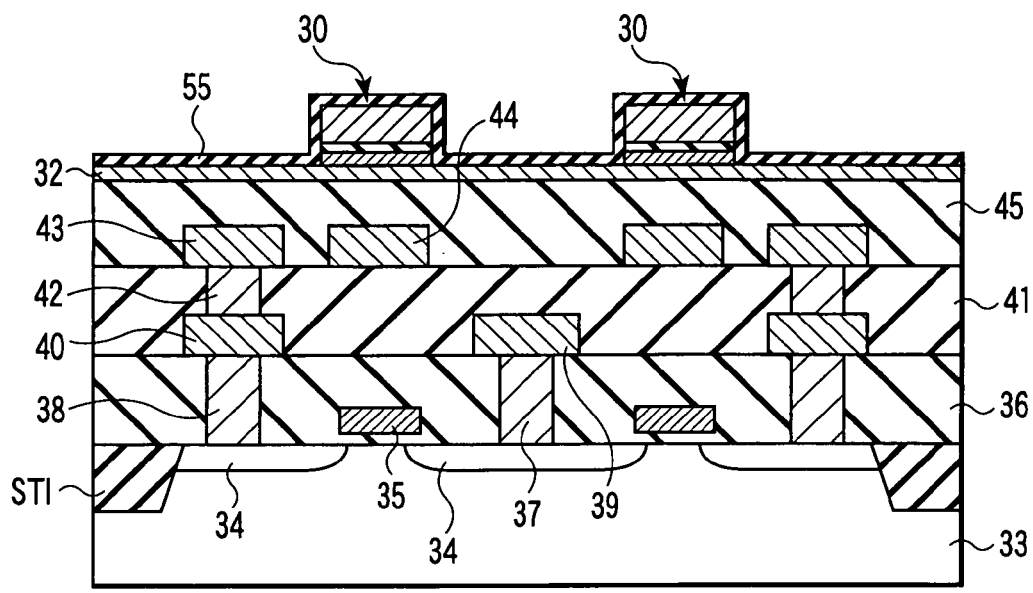
FIG. 15 is a sectional view of a part of a fabricating process of the MRAM according to the first modification of the first embodiment of the present invention.

Next, a method of fabricating the MRAM according to the present modification will be described with reference to FIG. 15. FIG. 15 is a sectional view of a part of the fabricating process of the MRAM according to the present modification.

First by the steps described in the first embodiment, the structure shown in FIG. 7 is obtained. Next, as shown in FIG. 15, the insulating film 55 is formed on the metal wiring layer 32 so as to coat the magneto-resistive elements 30. The insulating film 55 is formed, for example, of an $Al_2O_3$ film. The $Al_2O_3$ film is formed, for example, by a chemical vapor deposition (CVD) process. Alternatively, the Al layer is formed by the sputtering or the like, and oxidized to form the film.

Thereafter, the insulating film 55 and metal wiring layer 32 are etched by the patterning step described with reference to FIG. 8. Thereafter, the steps are performed as shown in FIG. 12, and the insulating film 55 on the upper surfaces of the magneto-resistive elements 30 is entirely or partially removed.

According to the structure of the present modification, in addition to the above-described effect (1), the following effects (2), (3) can also be obtained.

(2) The fabricating yield of the MRAM can be enhanced. This respect will be described hereinafter.

First, the insulating film 55 is formed on the side surfaces of the magneto-resistive elements 30, that is, the side surfaces of the ferromagnetic layers 47, 49 and tunnel barrier film 48. When the Al layers formed on the side walls of the magneto-resistive elements 30 are oxidized to form the insulating film 55, short-circuit between the ferromagnetic layers 47 and 49 can be prevented even in a case where residues remain in the periphery of the magneto-resistive element 30, for example, in the Ar ion milling process (or the RIE process) described with reference to FIG. 7. As a result, the fabricating yield of the MRAM is enhanced, and can be effectively enhanced especially in a large-scaled MRAM.

Moreover, since the insulating film 55 is formed to suppress the occurrence of the short-circuit, it is not necessary to perform the Ar ion milling or RIE from an oblique direction in FIG. 7. That is, the Ar ion milling or RIE can be performed at a substantially vertical incidence angle with respect to a semiconductor substrate surface. Therefore, the side surfaces of the magneto-resistive element 30 are substantially vertical to the semiconductor substrate surface. As a result, the short-circuit can be inhibited from being generated between the adjacent magneto-resistive elements 30, and this contributes to enhancement of the fabricating yield of the MRAM.

Furthermore, if the Al layers formed on the side walls of the magneto-resistive elements 30 are oxidized to form the insulating film 55, oxidation gradually proceeds from the outer side surface of the Al layer. Moreover, all the Al layers are finally oxidized to form an $Al_2O_3$ layer 55. In this case, oxygen is also introduced into the edge portion of the $Al_2O_3$ layer which is the tunnel barrier film 48. At a manufacturing process, the tunnel barrier film 48 is damaged by the Ar ion milling or RIE. As a result, oxygen sometimes lacks in the edge portion of the tunnel barrier film 48. Then, insulation of the $Al_2O_3$ layer 48 is remarkably lost, and there sometimes occurs the short-circuit between the ferromagnetic layers 47 and 49. However, in the fabricating method according to the present modification, when the Al layer is oxidized, oxygen is also introduced into the edge portion of the tunnel barrier film 48. Therefore, the $Al_2O_3$ layer 48 sufficiently holds the insulation. As a result, the ferromagnetic layer 47 can be electrically sufficiently isolated from the ferromagnetic layer 49. That is, the short-circuit in the magneto-resistive element 30 can be prevented from occurring, and the fabricating yield of the MRAM can be enhanced.

(3) Operation reliability of the MRAM can be enhanced. This respect will be described hereinafter.

In the fabricating method according to the present modification, the Ar ion milling or RIE described with reference to FIG. 7 can be performed at the substantially vertical incidence angle with respect to the semiconductor substrate surface. Therefore, it is easy to control the shape of the magneto-resistive element 30. Therefore, a current value required for the write can be inhibited from fluctuating for each magneto-resistive element. As a result, a write operation margin of the MRAM can be enlarged, and the operation reliability of the MRAM can be enhanced.

Furthermore, a spread width of the free layer 47 in a transverse direction with respect to the pinning layer 49 is easily controlled. Therefore, a fluctuation of an influence by a leak magnetic field or the like from the free layer 47 for each magneto-resistive element can be reduced. As a result, the write operation margin of the MRAM can be enlarged, and the operation reliability of the MRAM can be enhanced.

FIGS. 16 to 19 are sectional views successively showing the fabricating method of the MRAM according to a second modification of the first embodiment. In the present modification, a method of forming the contact plugs 46, different from that of the first embodiment, will be described.

Figure 16:
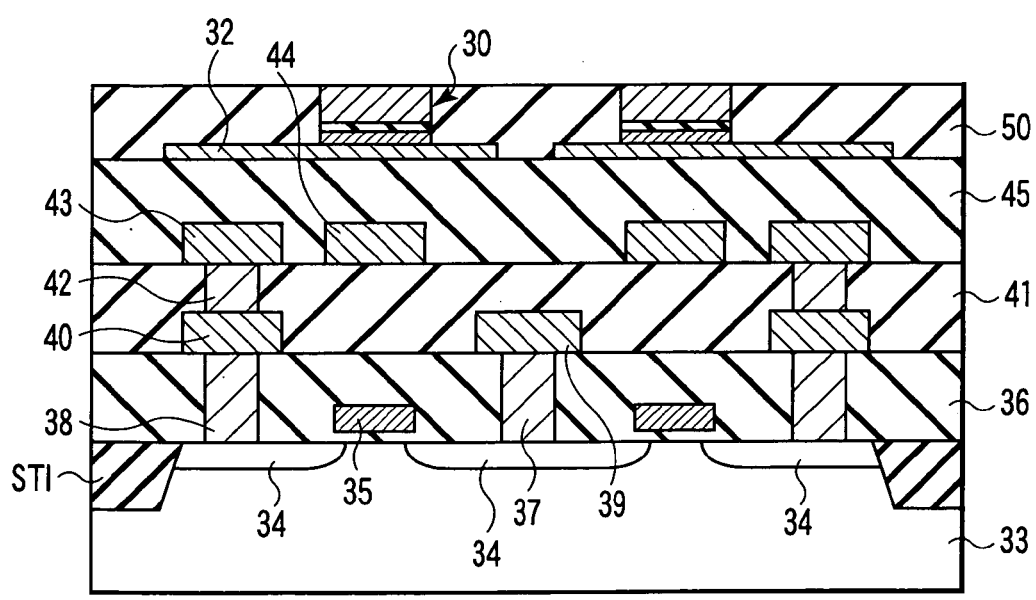
FIGS. 16 to 19 are sectional views successively showing first to fourth fabricating steps of the MRAM according to a second modification of the first embodiment of the present invention.
Figure 17:
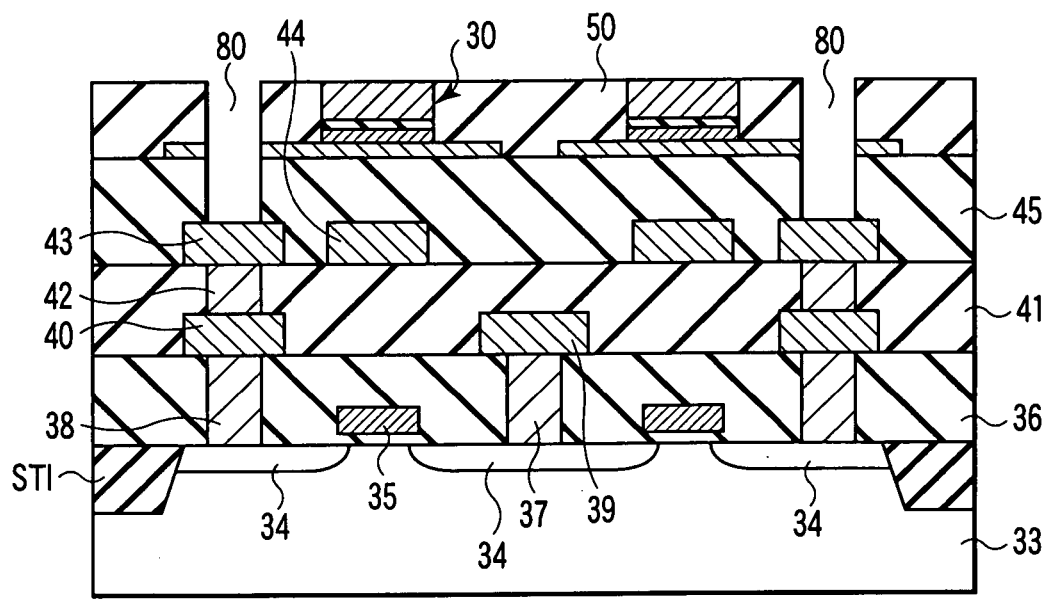
Figure 18:
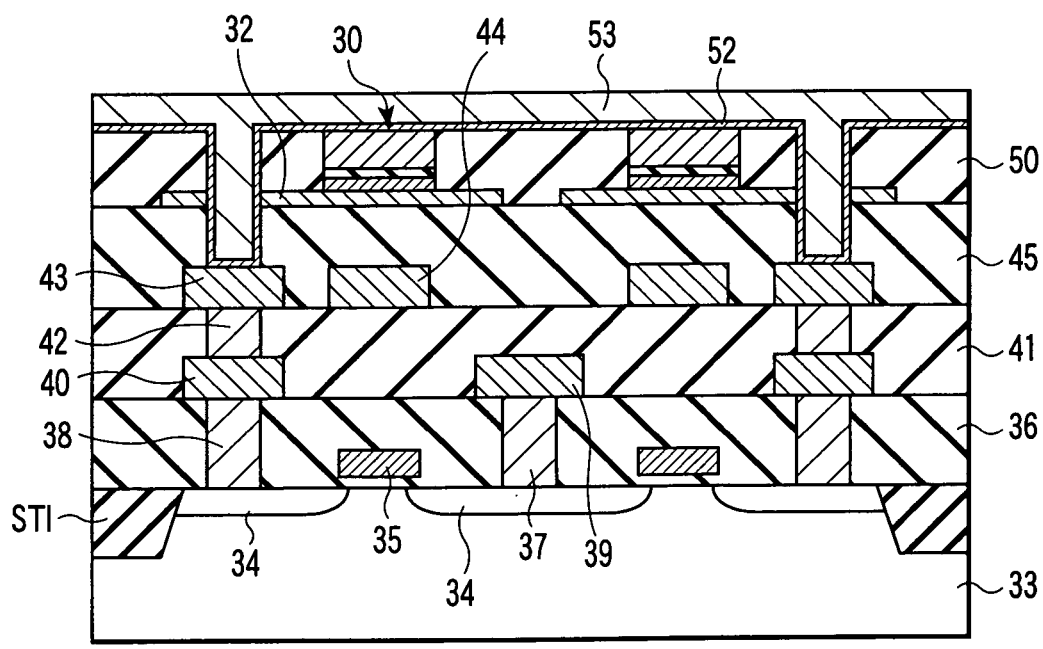
Figure 19:
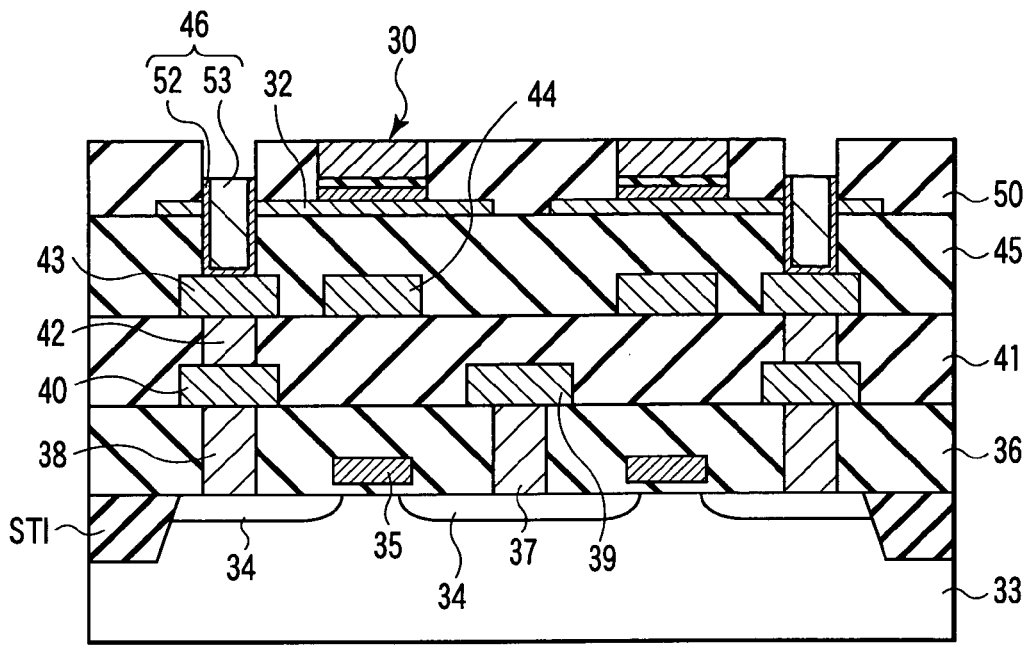

First, the structure shown in FIG. 9 is obtained by the steps described in the first embodiment. Next, as shown in FIG. 16, the interlayer insulating film 50 is polished and flatted by the CMP using the ferromagnetic layer 49 in the stopper. Next, as shown in FIG. 17, the contact holes 80 are made by the photolithography technique and RIE and the like. The method of making the contact holes 80 has been described with reference to FIG. 10. Next, as shown in FIG. 18, the barrier metal film 52 and conductive layer 53 are formed on the interlayer insulating film 50 to bury the contact holes 80. This step has been described with reference to FIG. 11. Next, as shown in FIG. 19, the barrier metal films 52 and conductive layers 53 are left only in the contact holes 80 by the step described with reference to FIG. 12. Thereafter, the contact holes 80 are filled to form the interlayer insulating film with which the upper surface of the ferromagnetic layer 49 is coated.

The contact plugs 46 may also be formed by the above-described method.

Figure 20:
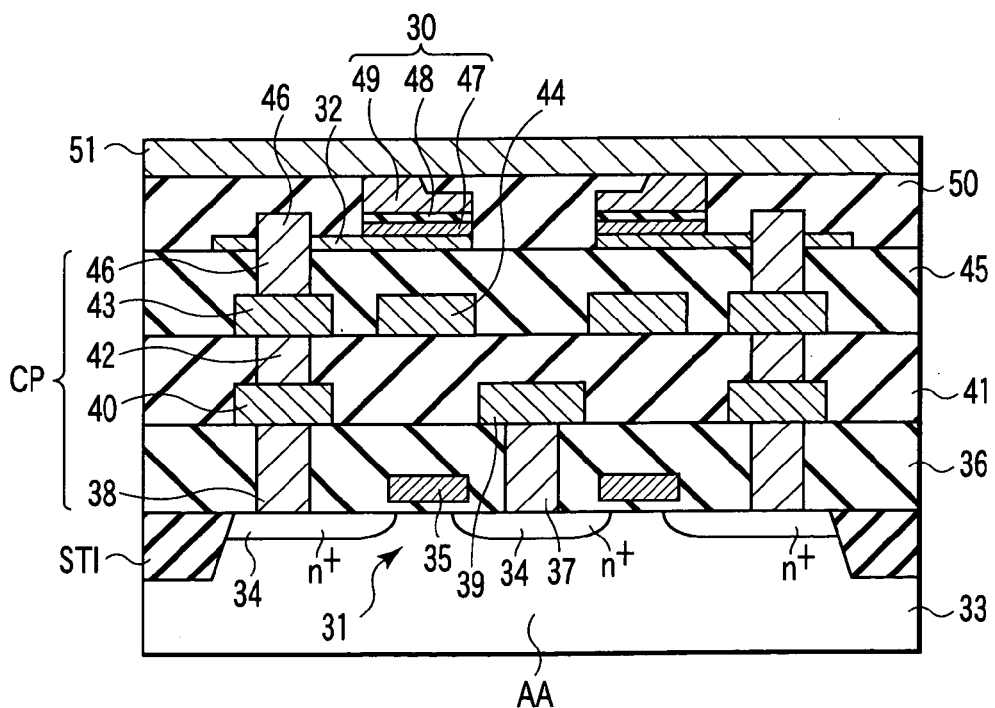
FIG. 20 is a sectional view of the MRAM according to a second embodiment of the present invention.
Figure 21:
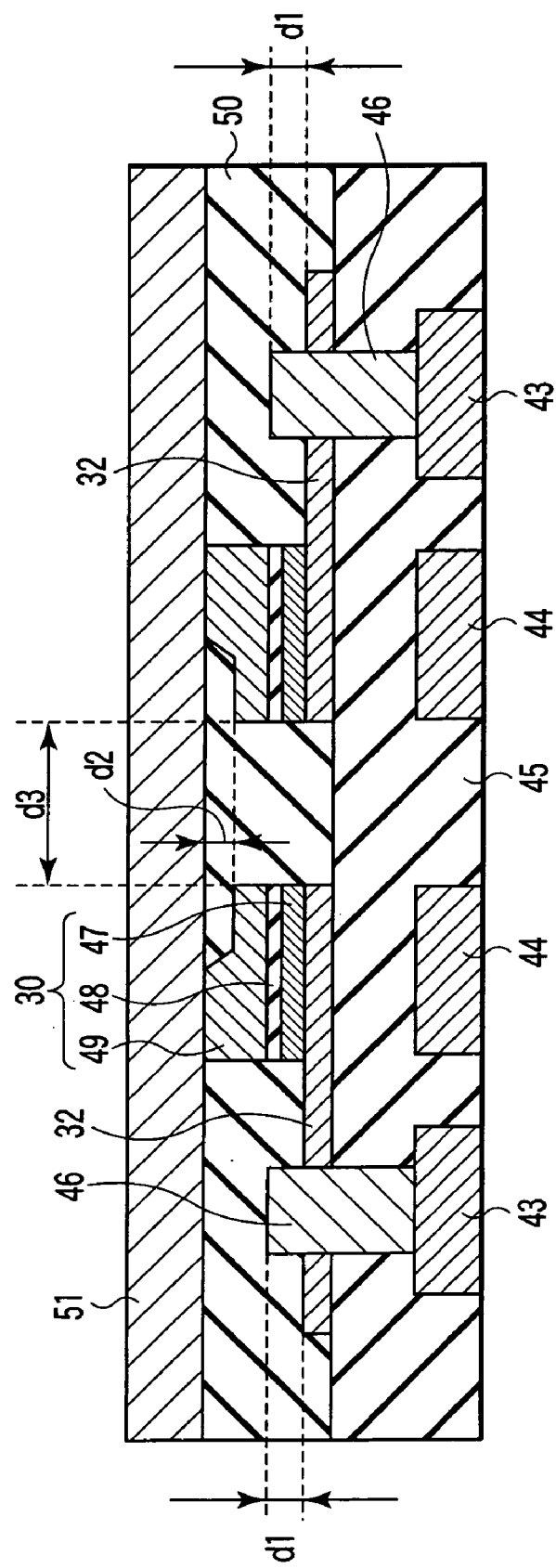
FIG. 21 is an enlarged view of a partial region.

Next, the semiconductor memory device and the method for fabricating the device according to a second embodiment of the present invention will be described with reference to FIGS. 20, 21. FIG. 20 is a sectional view of the MRAM according to the present embodiment, and shows the structure along the 3—3 line direction in FIG. 2. FIG. 21 is an enlarged view of a partial region in FIG. 20, and is a sectional view showing a region in a level above that of the interlayer insulating film 41 in FIG. 20. In the present embodiment, a bump is formed on the upper surface of the ferromagnetic layer 49 in the first embodiment.

As shown, the bump is disposed on the upper surface of the magneto-resistive element 30 disposed in the MRAM 10 according to the present embodiment in the structure described in the first embodiment. That is, a part of the ferromagnetic layer 49 of the magneto-resistive element 30 is removed, and the layer is positioned lower than another region. The bump has a height of d2. The adjacent magneto-resistive elements 30 are disposed so that the side surfaces of the elements facing the contact plug 46 face each other or the side surfaces of the elements on the opposite side of the surfaces facing the contact plug 46 face each other. Furthermore, the bump is formed on the side surface of the ferromagnetic layer 49 on the opposite side of the surface facing the contact plug 46. Furthermore, the side surface of the magneto-resistive element 30 on the opposite side of the surface of the element facing the contact plug 46 matches the side surface of the withdrawing wiring layer 32, and is disposed on the same plane as that of the layer 32.

Figure 22:
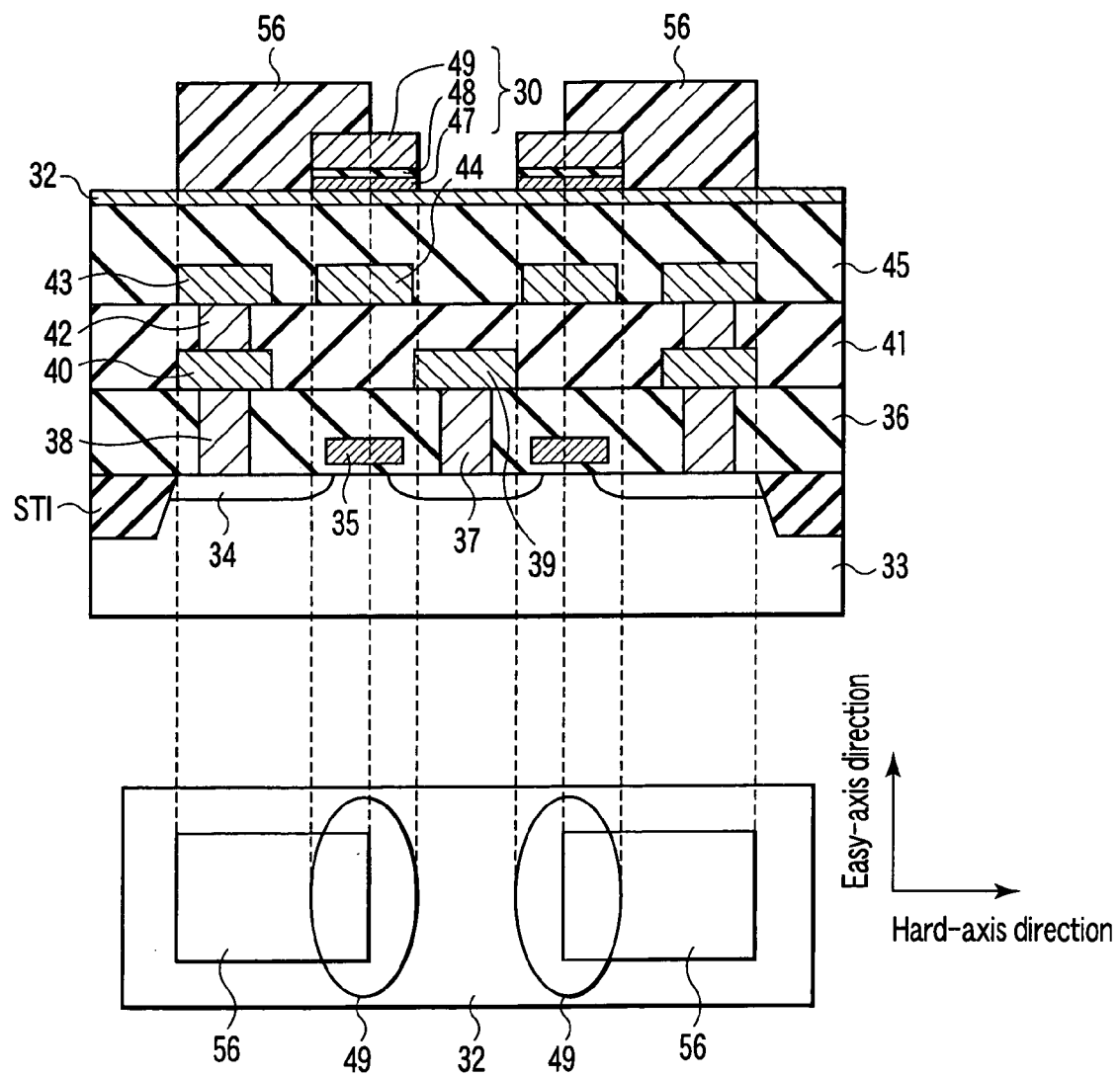
FIG. 22 shows a sectional view and plan view of a first fabricating step of the MRAM according to the second embodiment of the present invention.
Figure 23:
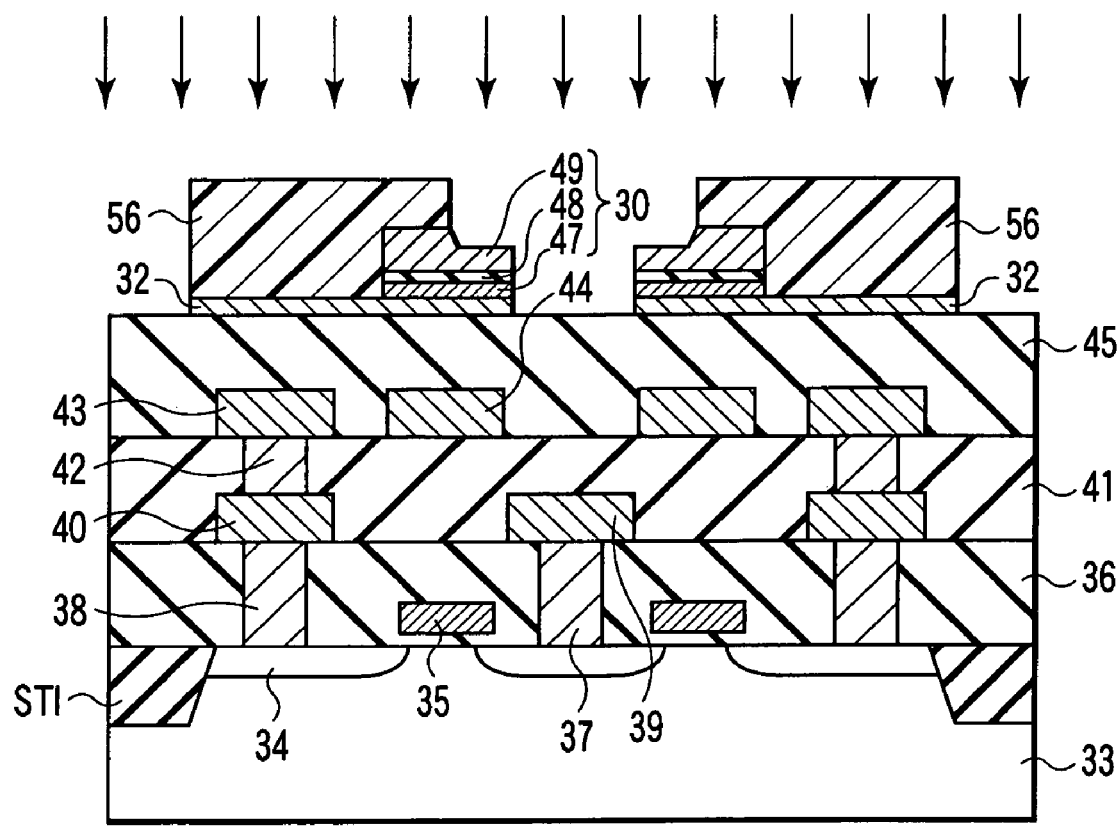
FIG. 23 is a sectional view of a second fabricating step of the MRAM according to the second embodiment of the present invention.
Figure 24:
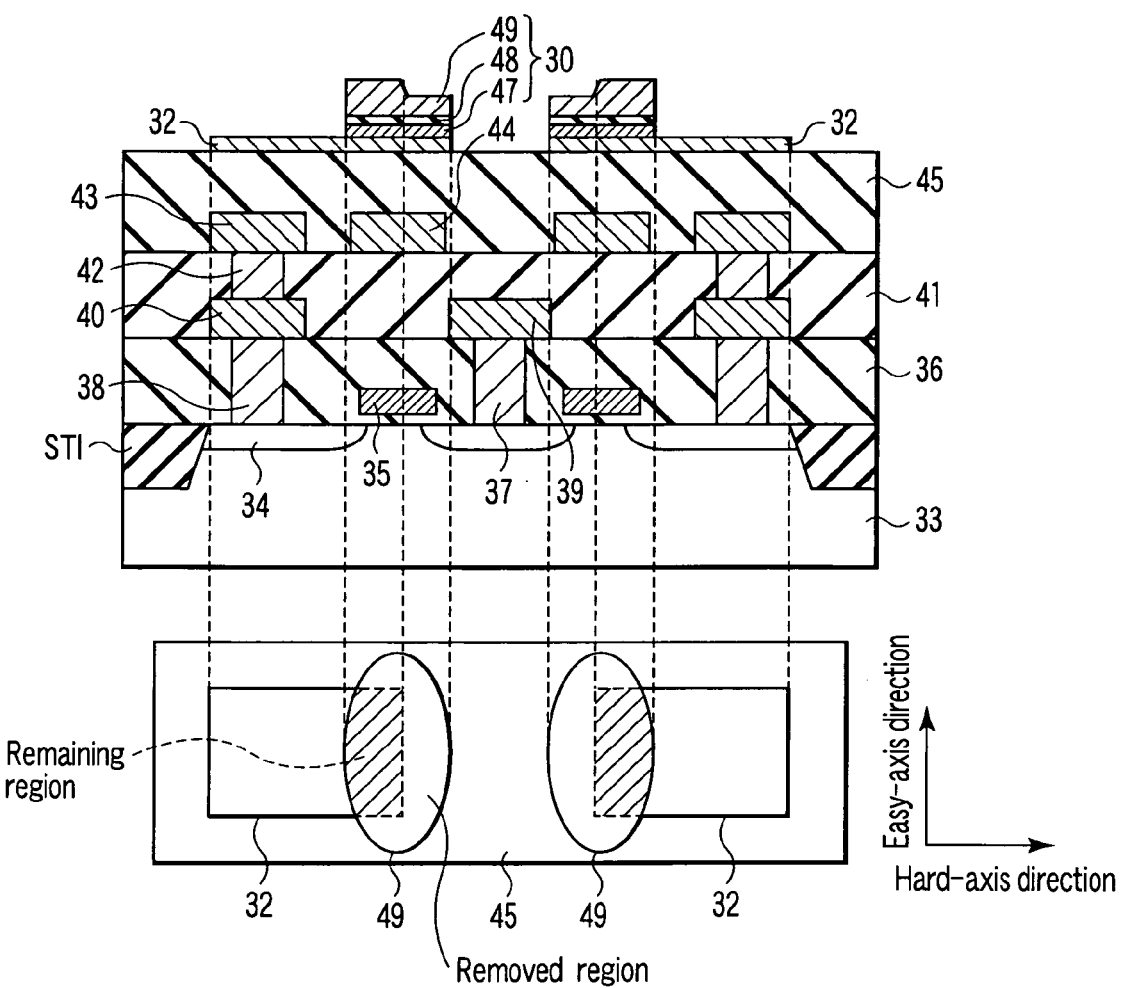
FIG. 24 shows a sectional view and plan view of a third fabricating step of the MRAM according to the second embodiment of the present invention.

Next, the method for fabricating the MRAM 10 according to the present embodiment will be described with reference to FIGS. 22 to 24. FIGS. 22 to 24 are sectional views showing the fabricating steps of the MRAM according to the present embodiment, and FIGS. 22 and 24 also show the corresponding plan views.

First, the structure shown in FIG. 7 is obtained by the steps described above in the first embodiment. Next, the metal wiring layer 32 is coated with a photo resist 56. Moreover, the photo resist 56 is patterned by the photolithography technique as shown in FIG. 22. As shown, one end of the pattern of the photo resist 56 in the hard-axis direction is positioned in one end of the withdrawing wiring layer 32 to be formed, and the other end of the pattern is positioned on the magneto-resistive element 30. That is, the magneto-resistive element 30 is completely covered with the photo resist at least in the hard-axis direction in a withdrawing wiring layer as in the first embodiment shown in FIG. 8. On the other hand, in the present embodiment, as shown in FIG. 22, the magneto-resistive element 30 is not completely covered with the photo resist 56 in the hard-axis direction, and the ferromagnetic layer 49 protrudes from the photo resist 56 when viewed from the upper surface.

Next, as shown in FIG. 23, the metal wiring layer 32 is etched by the RIE or the ion milling to form the withdrawing wiring layer 32. In this case, the photo resist 56 and magneto-resistive element 30 function as an etching mask of the metal wiring layer 32. Therefore, the side surface of the magneto-resistive element 30 on the opposite side of the surface of the element facing the contact plug 46 is formed so as to be positioned on the same plane as that of the side surface of the withdrawing wiring layer 32.

Next, the photo resist 56 is removed by ashing or the like to obtain the structure of FIG. 24. The region in the ferromagnetic layer 49 which is not coated with the photo resist 56 is exposed by the RIE or the ion milling, and therefore a part of the region is etched. Therefore, a bump having a height d2 is formed on the upper surface of the ferromagnetic layer 49.

Thereafter, the steps of and after FIG. 9 described in the first embodiment are performed to complete the MRAM shown in FIGS. 20 and 21.

According to the MRAM and the fabricating method of the present embodiment, in addition to the effect (1) described in the first embodiment, the following effects (4), (5) are obtained.

(4) The magneto-resistive element can be protected from the charge damage. This respect will be described hereinafter.

The interlayer insulating film 50 is usually formed, for example, by the plasma CVD process or the like. However, when an distance between the adjacent magneto-resistive elements 30 is reduced, and an aspect ratio of a region between the adjacent magneto-resistive elements 30 rises, it is difficult to form the interlayer insulating film 50 by the plasma CVD process or the like. More concretely, it is difficult to fill the region between the adjacent magneto-resistive elements 30 by the interlayer insulating film 50. Therefore, a higher-power high density plasma (HDP) process needs to be used in order to completely fill the region between the adjacent magneto-resistive elements 30. However, in this method, the charges are more easily accumulated in the semiconductor wafer. Therefore, the magneto-resistive element is easily damaged by the charge.

However, in the present embodiment, as shown in FIG. 21, the ferromagnetic layers 49 of the adjacent magneto-resistive elements 30 are partially etched. In more detail, the regions of the ferromagnetic layers 49 facing each other are etched. As a result, the aspect ratio of the region between the adjacent magneto-resistive elements 30 can be reduced. As a result, the region can be easily filled with the interlayer insulating film 50, and a film forming method using a more powerful plasma, such as the HDP process, does not have to be used. Therefore, the magneto-resistive element 30 can be protected from the charge damage.

(5) The size of the memory cell of the MRAM can be miniaturized. This respect will be described hereinafter.

In the present embodiment, a part of the magneto-resistive element 30 functions as a mask for forming the withdrawing wiring layer 32. Therefore, one end of the withdrawing wiring layer 32 in the hard-axis direction matches the side surface of the magneto-resistive element 30. Therefore, unlike the first embodiment, a surplus withdrawing wiring layer 32 does not exist between the adjacent magneto-resistive elements 30. Therefore, as shown in FIG. 21, a distance d3 between the adjacent magneto-resistive elements 30 can be reduced as compared with the first embodiment. Therefore, an occupying area of each memory cell can be reduced, and the MRAM can be miniaturized. It is to be noted that even when the distance between the magneto-resistive elements 30 is reduced, it is easy to fill the interlayer insulating film 50 as described above in the effect (4).

Figure 25:
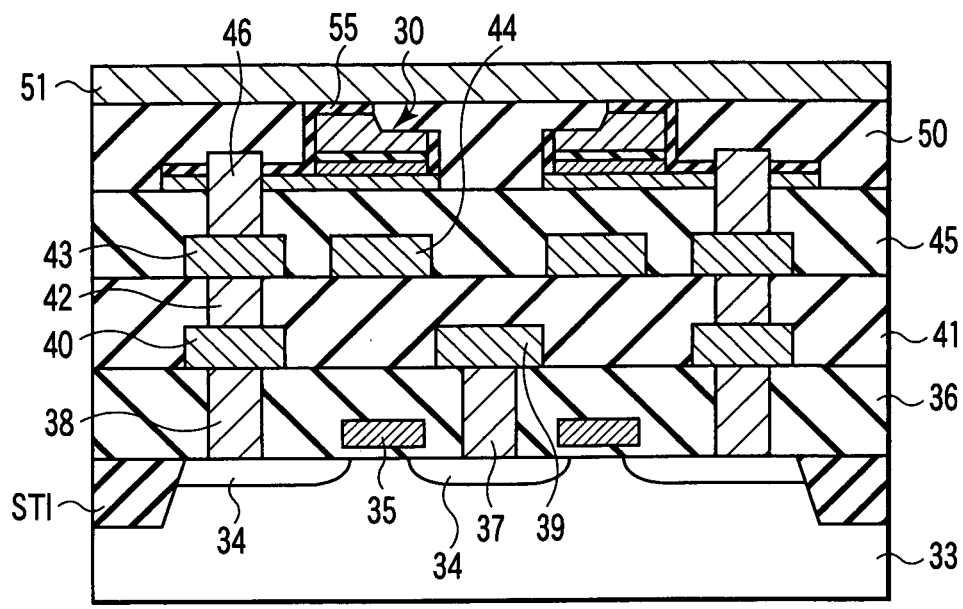
FIG. 25 is a sectional view of the MRAM according to a first modification of the second embodiment of the present invention.

FIG. 25 is a sectional view of the MRAM according to a first modification of the second embodiment. As shown, in the MRAM 10 according to the present modification, the insulating film 55 is formed on the side surfaces of the magneto-resistive elements 30 as described in the first modification of the first embodiment in the structure of the second embodiment.

Figure 26:
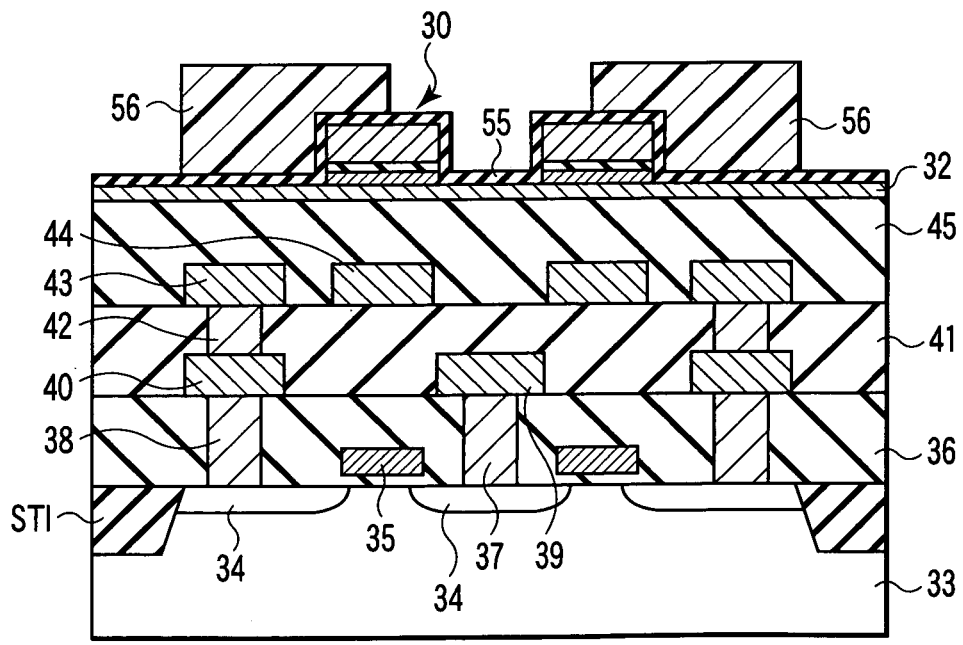
FIGS. 26 and 27 are sectional views successively showing first and second fabricating steps according to the first modification of the second embodiment of the present invention.
Figure 27:
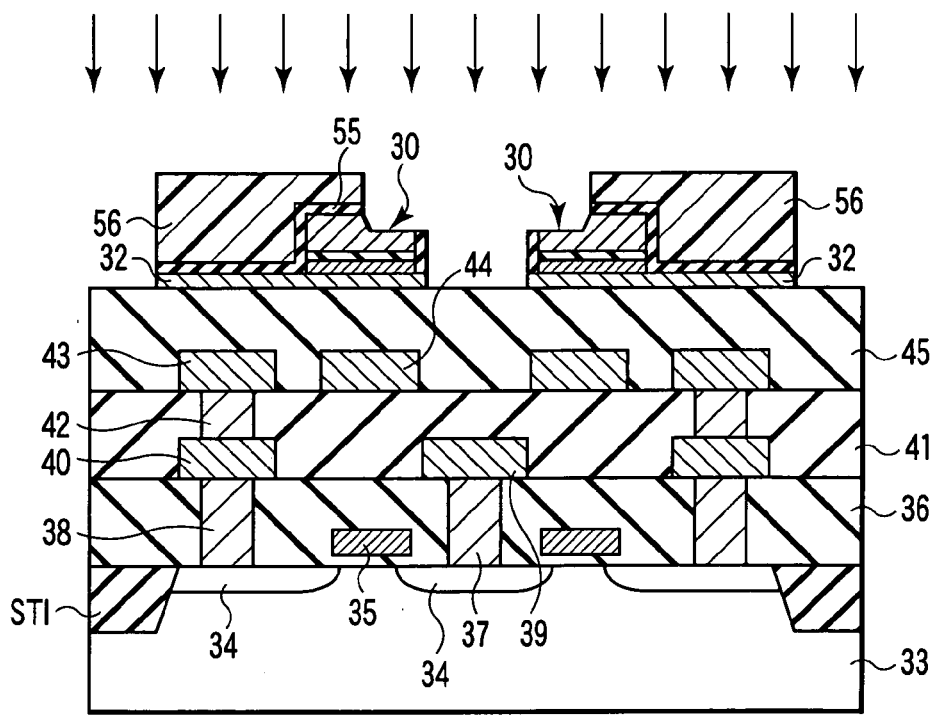

Next, the method for fabricating the MRAM according to the present modification will be described with reference to FIGS. 26, 27. FIGS. 26 and 27 are sectional views of a part of the fabricating process of the MRAM according to the present modification.

First, the structure shown in FIG. 15 is obtained by the steps described in the first modification of the first embodiment. Next, as shown in FIG. 26, the photo resist 56 is applied by the step described using FIG. 22. Moreover, as shown in FIG. 27, the metal wiring layer 32 is patterned by the step described with reference to FIG. 23. In this step, the insulating film 55 and ferromagnetic layer 49 of the region which is not covered with the photo resist 56 are also partially etched. Thereafter, the photo resist 56 is removed by the ashing, and the steps of and after FIG. 9 described in the first embodiment are performed.

According to the present modification, in addition to the effects (4), (5) described in the second embodiment, the effects (1) to (3) described in the first embodiment can also be obtained. It is to be noted that it is possible to apply the fabricating method described in the second modification of the first embodiment even in the present embodiment.

Figure 28:
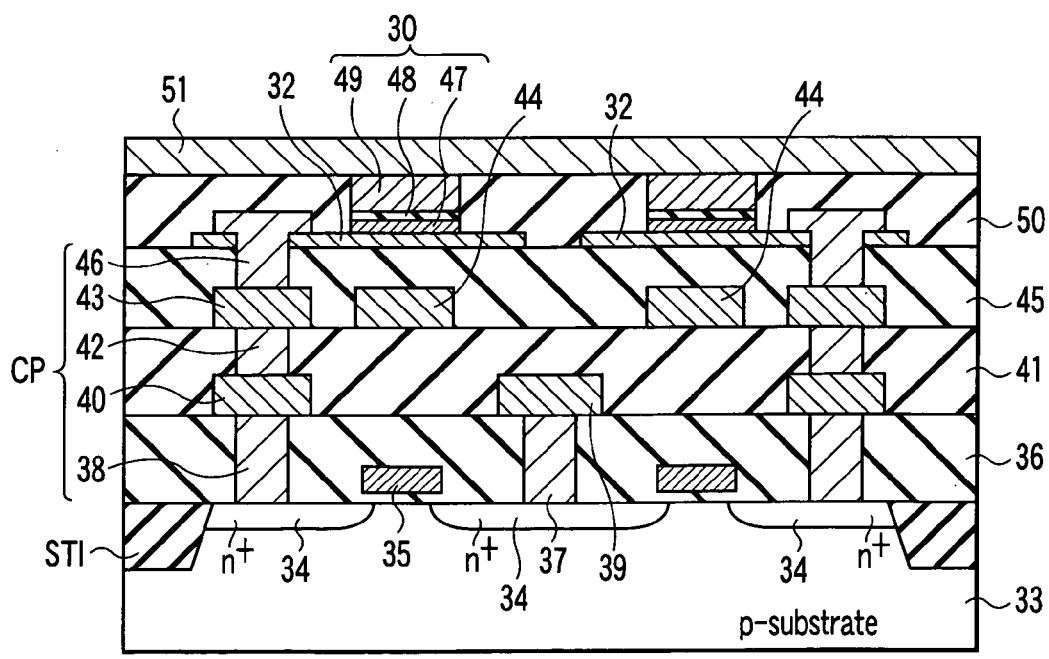
FIG. 28 is a sectional view of the MRAM according to a third embodiment of the present invention.
Figure 29:
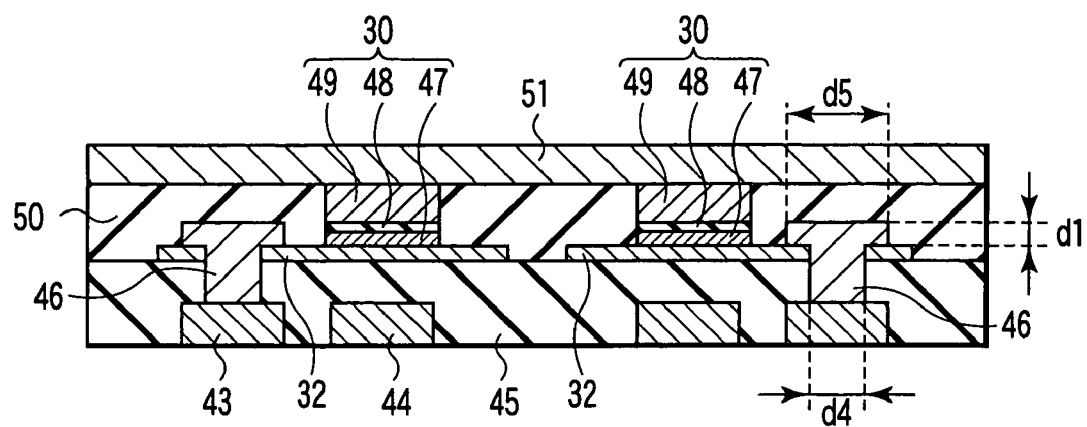
FIG. 29 is an enlarged view of a partial region of FIG. 28.

Next, the semiconductor memory device and the method for fabricating the device according to a third embodiment of the present invention will be described with reference to FIGS. 28, 29. FIG. 28 is a sectional view of the MRAM according to the present embodiment, and shows the structure along the 3—3 line direction in FIG. 2. FIG. 29 is an enlarged view of a partial region in FIG. 28, and is a sectional view showing a region in a level above that of the interlayer insulating film 41 in FIG. 28. In the present embodiment, contact between the contact plug 46 and the withdrawing wiring layer 32 in the first embodiment is also achieved even on the upper surface of the withdrawing wiring layer 32.

As shown, in the structure described in the first embodiment, the contact plug 46 contacts not only the side surfaces but also the upper surface of the withdrawing wiring layer 32. More concretely, a diameter of the contact plug 46 is d4 in a position below the withdrawing wiring layer 32, and is d5 larger than d4 in a position above the withdrawing wiring layer. Moreover, the contact plug 46 contacts the upper surface of the withdrawing wiring layer 32 in the region where the plug has a diameter d5.

Next, the method for fabricating the MRAM 10 according to the present embodiment will be described with reference to FIGS. 30 to 33. FIGS. 30 to 33 are sectional views successively showing the fabricating steps of the MRAM according to the present embodiment.

Figure 30:
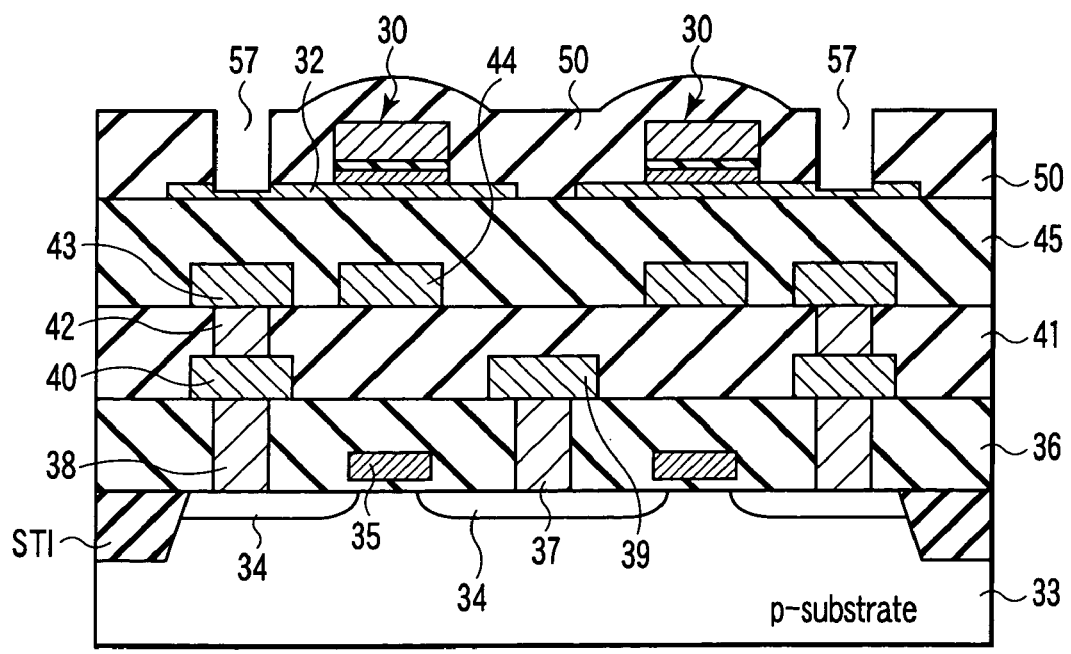
FIGS. 30 to 33 are sectional views successively showing first to fourth fabricating steps of the MRAM according to the third embodiment of the present invention.

First, the structure shown in FIG. 9 is obtained by the steps described in the first embodiment. Next, contact holes 57 are made in the interlayer insulating film 50 by the photolithography technique and RIE. The contact hole 57 has a diameter d4, and is positioned right above the metal wiring layer 43, and the bottom portion of the hole is positioned in the withdrawing wiring layer 32. That is, the contact hole 57 extends through the interlayer insulating film 50, and a part of the withdrawing wiring layer 32 is also etched, as shown in FIG. 30.

Therefore, the upper surface of the withdrawing wiring layer 32 is exposed in the bottom portion of the contact hole 57. It is to be noted that the contact hole 57 may also be formed so as to extend through not only the interlayer insulating film 50 but also the withdrawing wiring layer 32. In this case, the interlayer insulating film 45 is exposed in the bottom surface of the contact hole 57.

Figure 31:
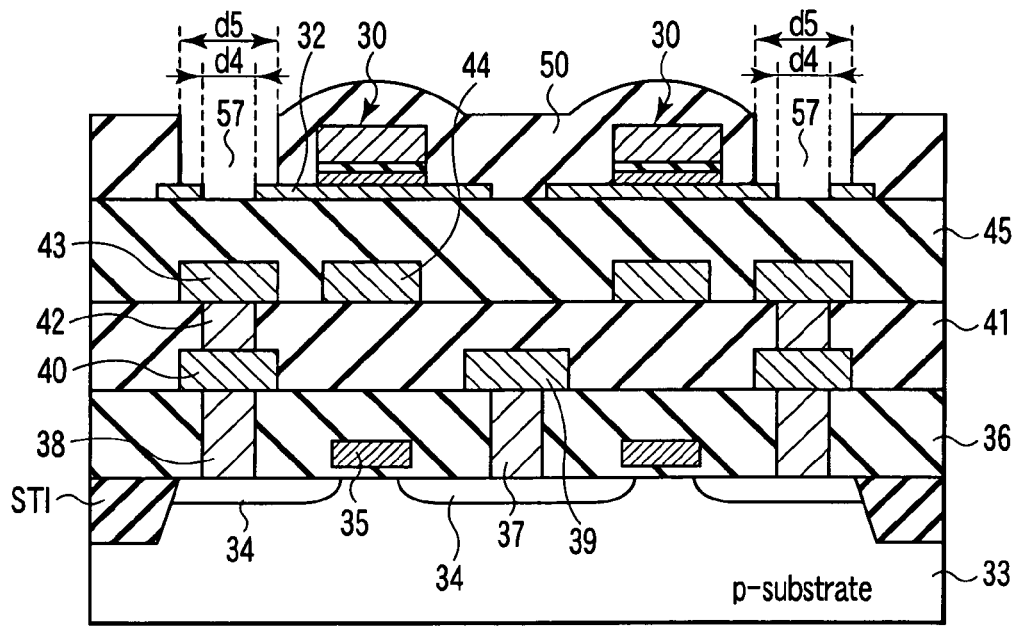

Next, as shown in FIG. 31, the side surfaces of the contact holes 57 are etched by isotropic etching such as a chemical dry etching (CDE) process. As a result, the diameter of the contact hole is enlarged to d5. Moreover, the withdrawing wiring layer 32 exposed in the bottom surface of the contact hole 57 is also etched, and the interlayer insulating film 45 is exposed in the bottom surface of the contact hole.

Figure 32:
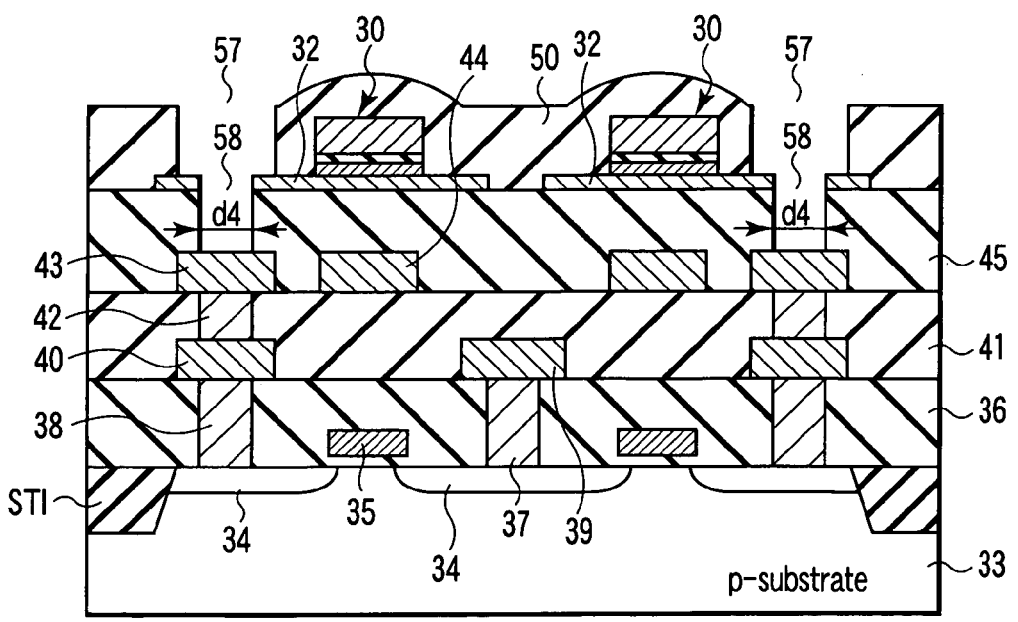

Next, as shown in FIG. 32, contact holes 58 extending to the metal wiring layer 43 from the bottom surfaces of the contact holes 57 through the interlayer insulating film 45 are made by the photolithography technique and RIE process. In this step, the withdrawing wiring layers 32 function as masks. As a result, each contact hole 58 has a diameter d4.

Figure 33:
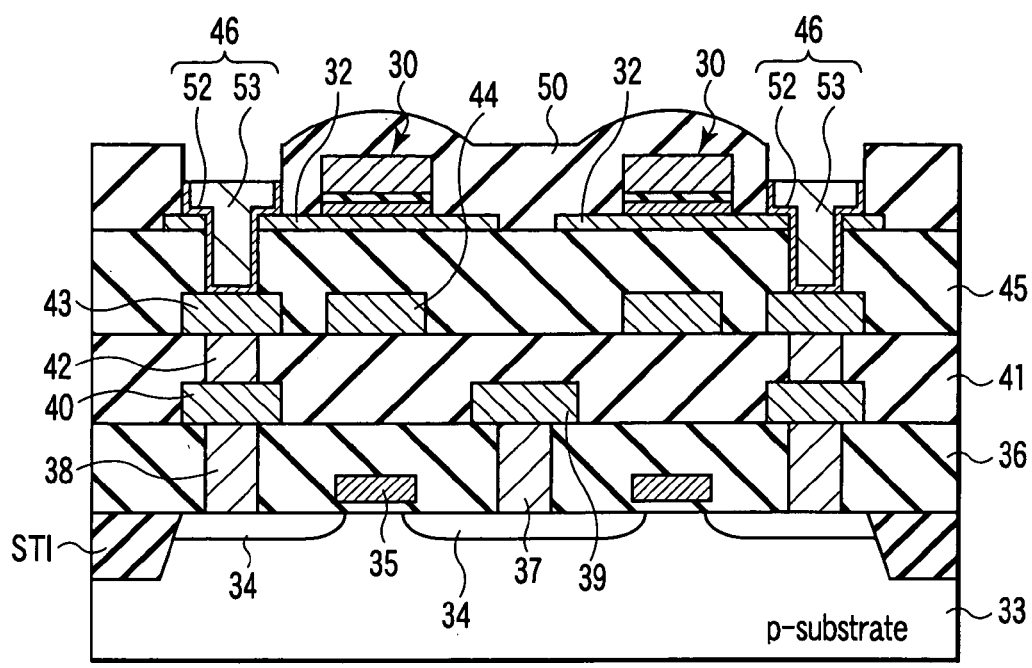

Next, as shown in FIG. 33, the contact plugs 46 are formed so as to completely fill the contact holes 58, and to fill a part of each contact hole 57.

Figure 13:
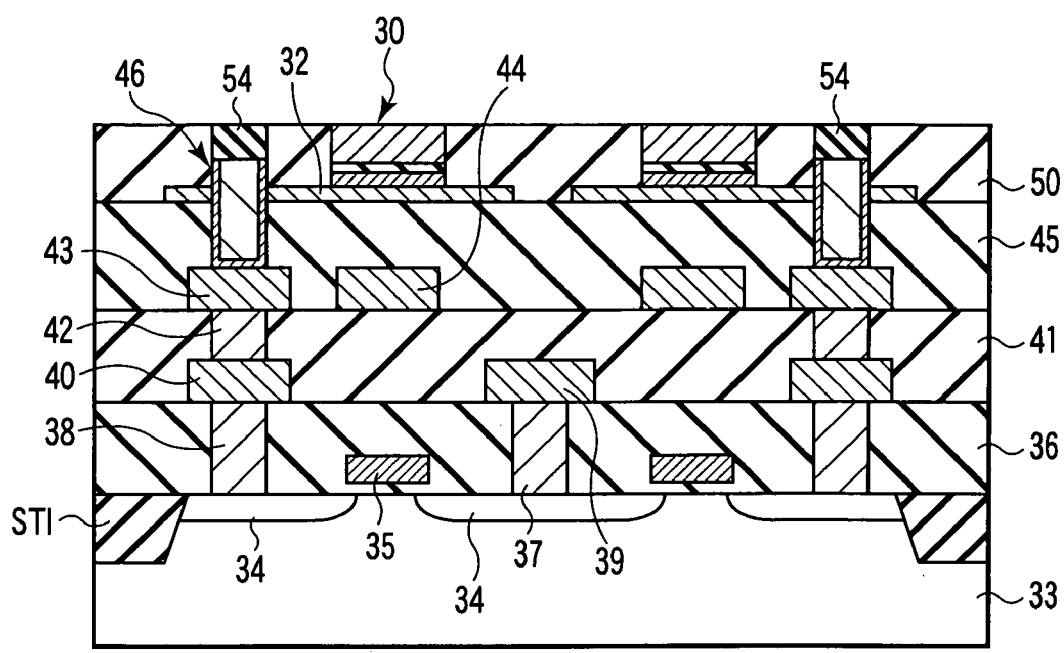

Thereafter, the step of FIG. 13 described in the first embodiment is performed to complete the MRAM shown in FIGS. 28 and 29.

According to the MRAM and fabricating method of the present embodiment, in addition to the effect (1) described in the first embodiment, the following effect (6) is obtained.

(6) A contact resistance of the MRAM can be reduced. That is, according to the present embodiment, the contact plugs 46 contact the side surfaces and upper surfaces of the withdrawing wiring layers 32. Therefore, a contact area between the contact plug 46 and the withdrawing wiring layer 32 is large as compared with the first embodiment, and both contact resistances are reduced. As a result, the operation reliability of the MRAM can be enhanced.

Figure 34:
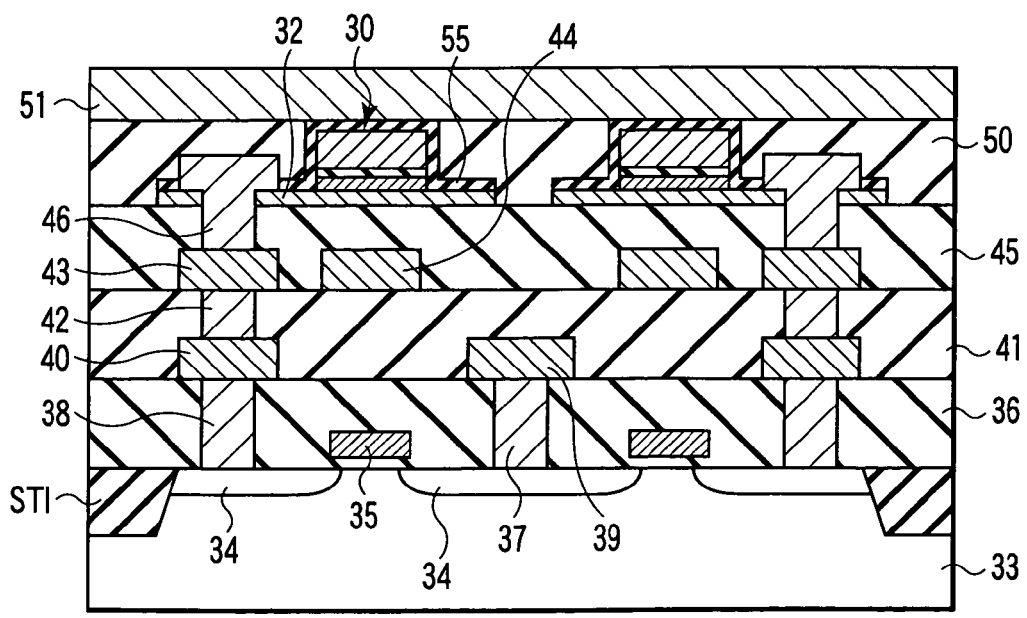

FIG. 34 is a sectional view of the MRAM according to a first modification of the third embodiment. As shown, in the MRAM 10 according to the present modification, in the structure described in the third embodiment, the insulating film 55 is formed on the side surface of the magneto-resistive element 30 as described in the first modification of the first embodiment.

After forming the insulating film 55 by the method described in the modification of the first embodiment, the contact plugs 46 are formed in the method described in the third embodiment to obtain the MRAM according to the present modification.

According to the present modification, in addition to the effect (6) described in the third embodiment, the effects (1) to (3) described in the first embodiment can also be obtained.

FIG. 35 is a sectional view of the MRAM according to a second modification of the third embodiment. As shown, in the MRAM 10 according to the present modification, in the structure described in the third embodiment, the bumps are formed on the upper surfaces of the ferromagnetic layers 49 as described in the second embodiment.

After forming the bumps by the method described in the second embodiment, the contact plugs 46 are formed in the method described in the third embodiment to obtain the MRAM according to the present modification.

According to the present modification, in addition to the effect (1) described in the first embodiment and the effect (6) described in the third embodiment, the effects (4), (5) described in the second embodiment can also be obtained.

FIG. 36 is a sectional view of the MRAM according to a third modification of the third embodiment. As shown, in the MRAM 10 according to the present modification, in the structure described in the third embodiment, the insulating film 55 is formed on the side surface of the magneto-resistive element 30 as described in the first modification of the first embodiment, and further the bump is formed on the upper surface of the ferromagnetic layer 49 as described in the second embodiment.

After forming the bump in the method described in the second embodiment, and forming the insulating film 55 by the method described in the modification of the first embodiment, the contact plugs 46 are formed in the method described in the third embodiment to obtain the MRAM according to the present modification.

According to the present modification, the effects (1) to (6) can be obtained.

It is to be noted that the fabricating method described in the second modification of the first embodiment may also be applied to the present embodiment.

Figure 37:
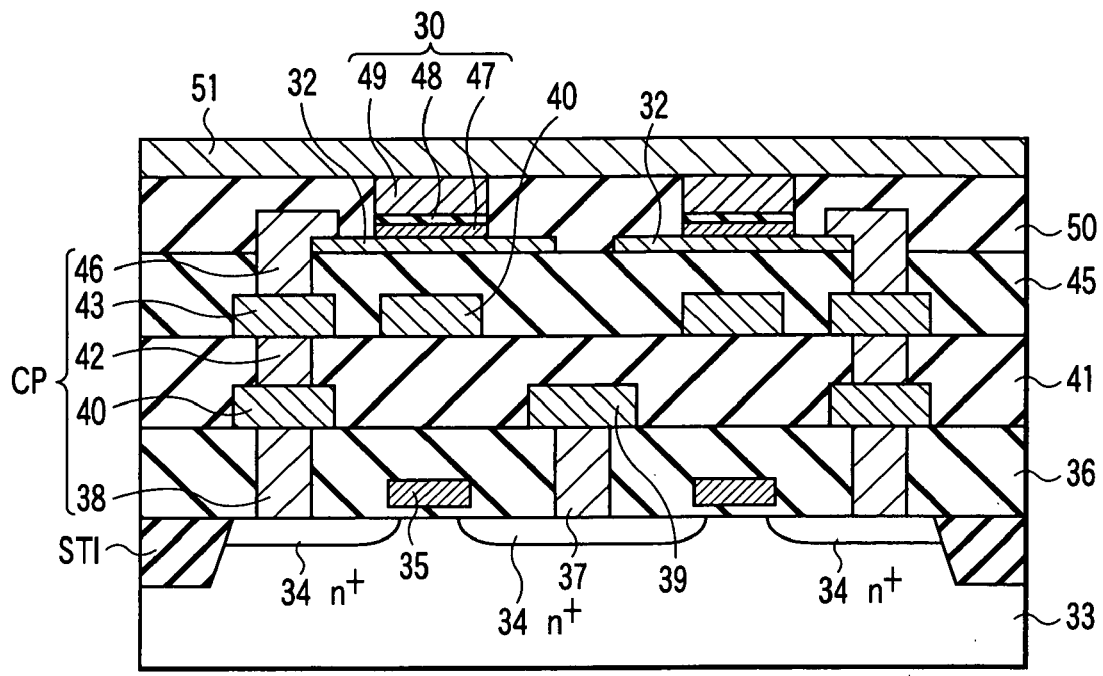
FIG. 37 is a sectional view of the MRAM according to a fourth embodiment of the present invention.
Figure 38:
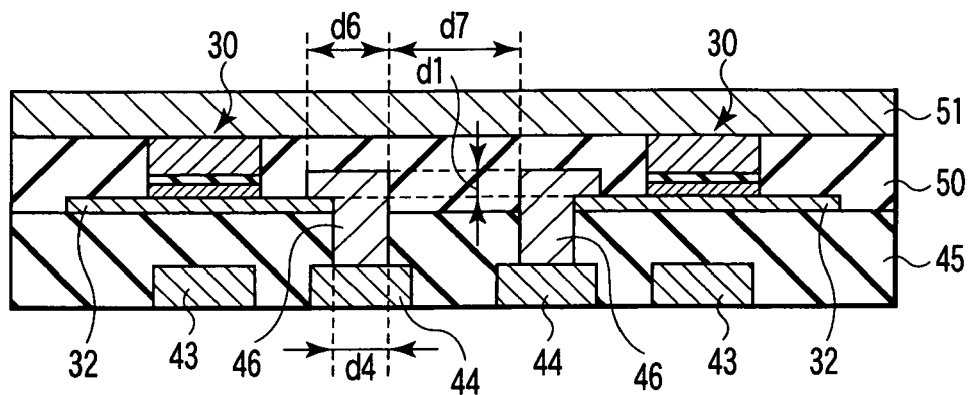
FIG. 38 is an enlarged view of a partial region of FIG. 37.
Figure 39:
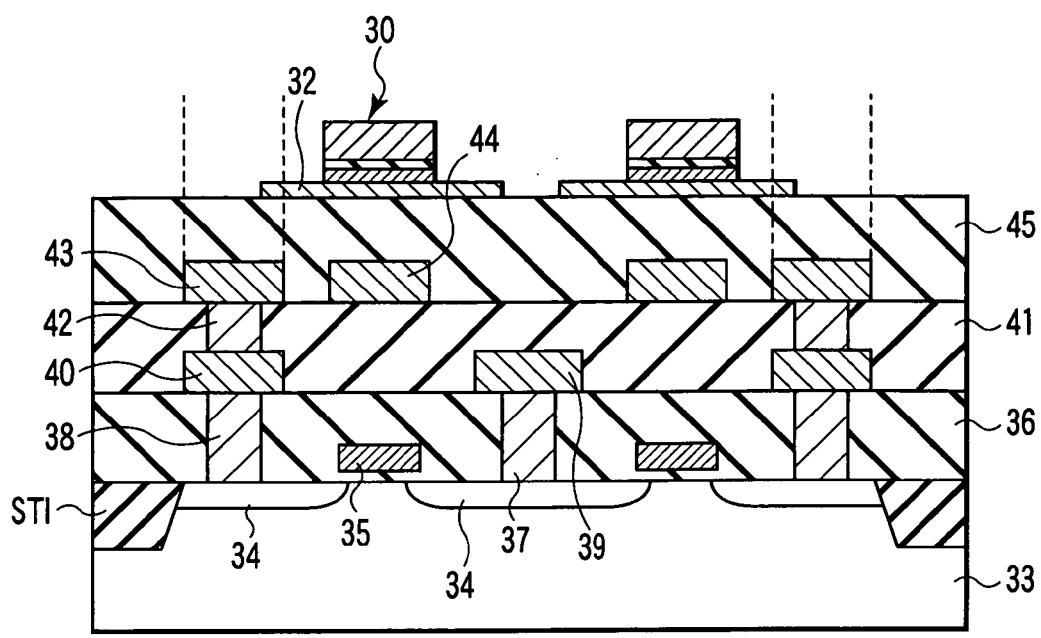
FIGS. 39 to 42 are sectional views successively showing first to fourth fabricating steps of the MRAM according to a fourth embodiment of the present invention.

Next, the semiconductor memory device and the method for fabricating the device according to a fourth embodiment of the present invention will be described with reference to FIGS. 37 and 38. FIG. 37 is a sectional view of the MRAM according to the present embodiment, and shows the structure along the 3—3 line direction in FIG. 2. FIG. 38 is an enlarged view of the MRAM and is a sectional view showing the region in the level above that of the interlayer insulating film 41 in FIG. 28 and shows the structure along line 38—38 in FIG. 2. In the present embodiment, the contact between the contact plug 46 and the withdrawing wiring layer 32 is also achieved even in the upper surface and end portion of the withdrawing wiring layer 32 in the structure according to the first embodiment.

As shown, the contact plug 46 contacts the end portion and upper surface of the withdrawing wiring layer 32 in the structure described in the first embodiment. More concretely, the diameter of the contact plug 46 is d4 in a position lower than the withdrawing wiring layer 32, and d6 which is larger than d4 in a position higher than the withdrawing wiring layer. Moreover, the contact plug 46 contacts the upper surface of the withdrawing wiring layer 32 in a region where the diameter of the plug is d6. The contact plug 46 contacts the end surface (side surface) of the withdrawing wiring layer 32 in a region where the diameter of the plug is d4.

Next, the method for fabricating the MRAM 10 according to the present embodiment will be described with reference to FIGS. 39 to 42. FIGS. 39 to 42 are sectional views successively showing the fabricating steps of the MRAM according to the present embodiment.

First, the structure shown in FIG. 7 is obtained by the steps described above in the first embodiment. Next, the metal wiring layer 32 is patterned by the photolithography technique and RIE to form the withdrawing wiring layer. In this step, the withdrawing wiring layer 32 is formed so that the end portion of the wiring is positioned on the metal wiring layer 43.

Figure 40:
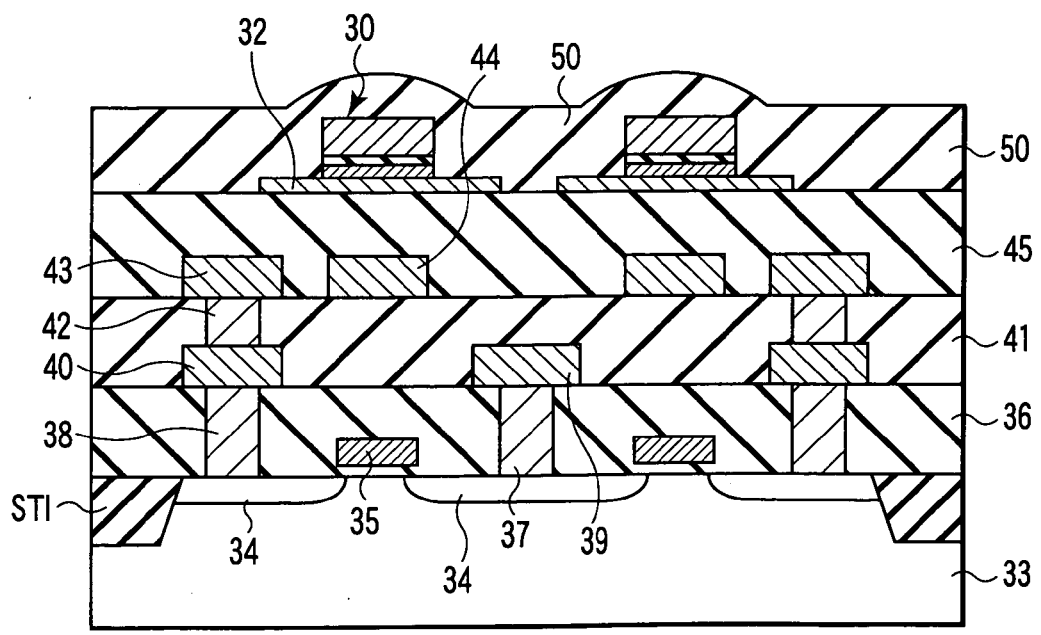

Next, as shown in FIG. 40, the interlayer insulating film 50 is formed on the interlayer insulating film 45.

Figure 41:
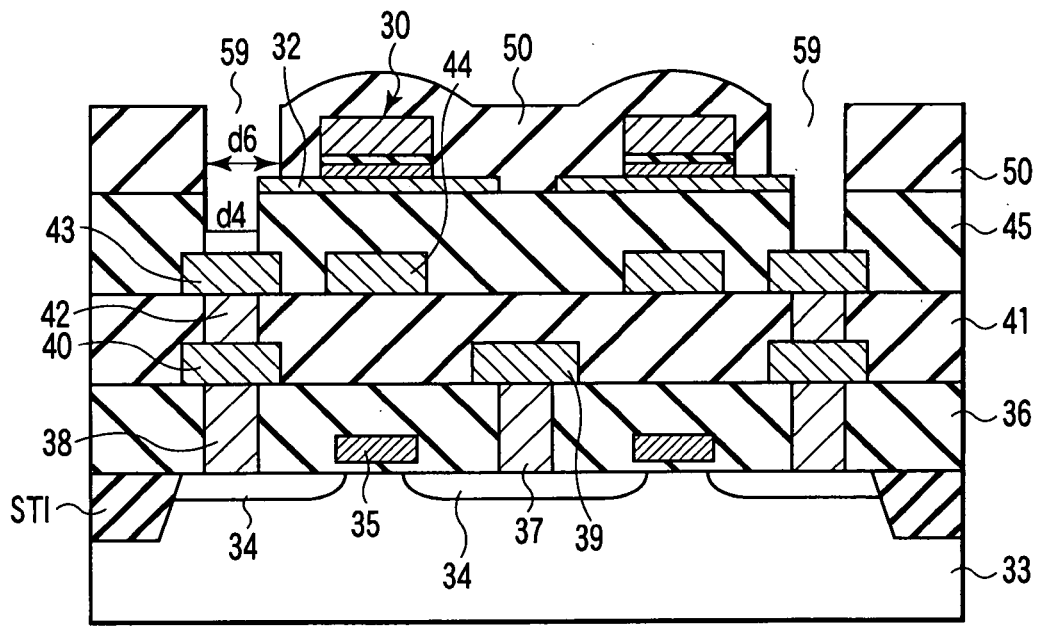

Next, as shown in FIG. 41, contact holes 59 extending through the interlayer insulating films 50, 45 are made by the lithography technique and RIE. In this step, the RIE is performed so as to have a etching selectivity against the withdrawing wiring layer 32, and the contact holes 59 are made so that openings of the holes overlap with the end portions of the withdrawing wiring layers 32. Then, the RIE process proceeds as follows. That is, first contact holes each having the diameter d6 are made in the interlayer insulating film 50. When the bottom surface of each contact hole reaches the position of the withdrawing wiring layer 32, the end portion of the withdrawing wiring layer 32 is exposed in a partial region of the opening. Therefore, the etching does not proceed any more in the region right under the withdrawing wiring layer 32 exposed in the contact hole bottom portion, and the etching of the interlayer insulating film 45 proceeds in another region. That is, the contact hole having the diameter d4, whose area is smaller than the opening having the diameter d6 by the exposed area of the withdrawing wiring layer 32, is formed in the interlayer insulating film 45 so as to reach the metal wiring layer 43.

Figure 42:
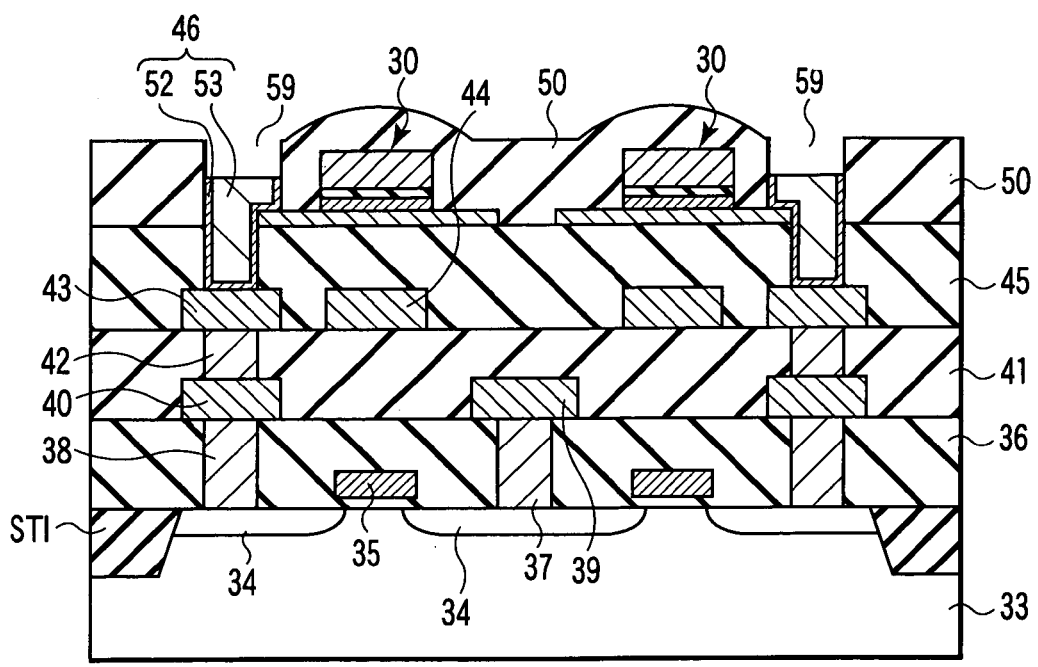

Next, as shown in FIG. 42, the contact plugs 46 which fill the contact holes 59 are formed.

Thereafter, the step of FIG. 13 described in the first embodiment is performed to complete the MRAM shown in FIGS. 28 and 29.

According to the MRAM and the fabricating method of the present embodiment, in addition to the effect (1) described in the first embodiment, the following effects (7), (8) are obtained.

(7) The contact resistance of the MRAM can be reduced. That is, according to the present embodiment, the contact plugs 46 contact the end and upper surfaces of the withdrawing wiring layers 32. Therefore, the contact area between the contact plug 46 and the withdrawing wiring layer 32 is large as compared with the first embodiment, and the contact resistances between the contact plug 46 and the withdrawing wiring layer 32 is reduced. As a result, the operation reliability of the MRAM can be enhanced.

(8) The size of the memory cell of the MRAM can be reduced. This respect will be described hereinafter.

According to the present embodiment, the contact plug 46 is formed so as to contact the end surface of the withdrawing wiring layer 32. Therefore, unlike the first embodiment, any surplus withdrawing wiring layer 32 does not exist between the adjacent contact plugs 46. Therefore, as shown in FIG. 38, a distance d7 between the adjacent contact plugs 46 can be reduced as compared with the first embodiment. Therefore, the occupying area of each memory cell can be reduced, and the MRAM can be miniaturized.

Figure 43:
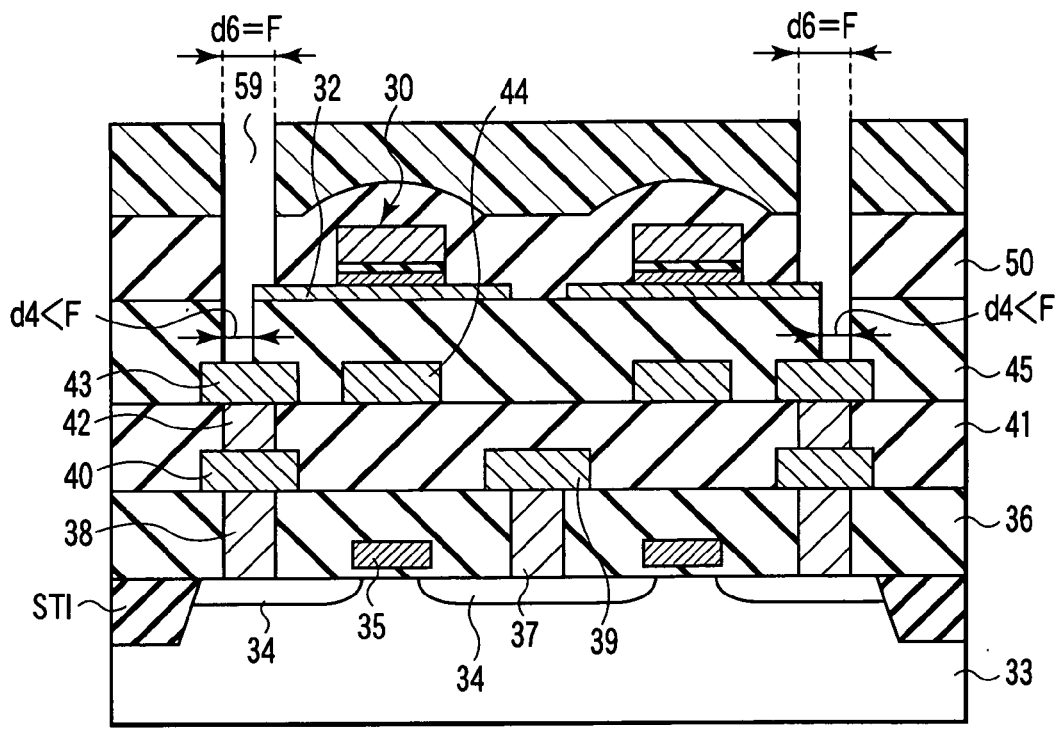
FIG. 43 is a sectional view of a partial fabricating process of the MRAM according to the fourth embodiment of the present invention.

It is to be noted that to form the contact holes 59 as shown in FIG. 43, when the diameter d6 of the opening in the region above the withdrawing wiring layer 32 is made in a minimum fabrication size F, the diameter d4 of the opening in the region below the withdrawing wiring layer 32 is smaller than the minimum fabrication size. Therefore, the memory cell size of the MRAM can further be reduced.

Figure 44:
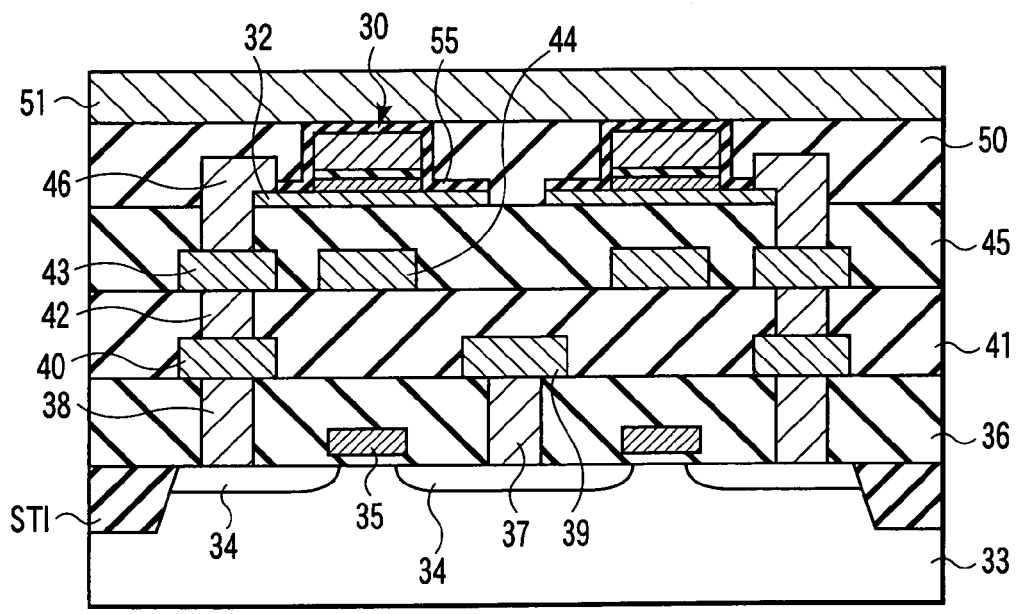
FIGS. 44 to 46 are sectional views of the MRAM according to first to third modifications of the fourth embodiment of the present invention.

FIG. 44 is a sectional view of the MRAM according to a first modification of the fourth embodiment. As shown, in the MRAM 10 according to the present modification, in the structure described in the fourth embodiment, the insulating films 55 are formed on the side surfaces of the magnetoresistive element 30 as described in the first modification of the first embodiment.

After forming the insulating film 55 by the method described in the modification of the first embodiment, the contact plugs 46 are formed in the method described in the fourth embodiment to obtain the MRAM according to the present modification.

According to the present modification, in addition to the effects (7), (8) described in the fourth embodiment, the effects (1) to (3) described in the first embodiment can also be obtained.

Figure 45:
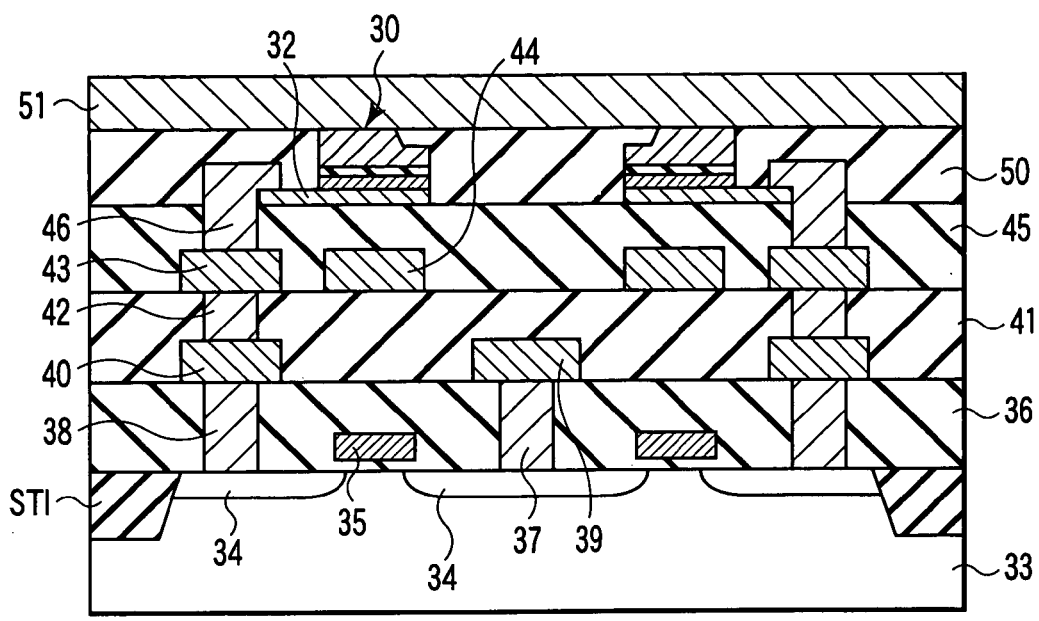

FIG. 45 is a sectional view of the MRAM according to a second modification of the fourth embodiment. As shown, in the MRAM 10 according to the present modification, in the structure described in the fourth embodiment, the bumps are formed on the upper surfaces of the ferromagnetic layers 49 as described in the second embodiment.

After forming the bumps in the method described in the second embodiment, the contact plugs 46 are formed in the method described in the fourth embodiment to obtain the MRAM according to the present modification.

According to the present modification, in addition to the effect (1) described in the first embodiment and the effects (7), (8) described in the fourth embodiment, the effects (4), (5) described in the second embodiment can also be obtained.

Figure 46:
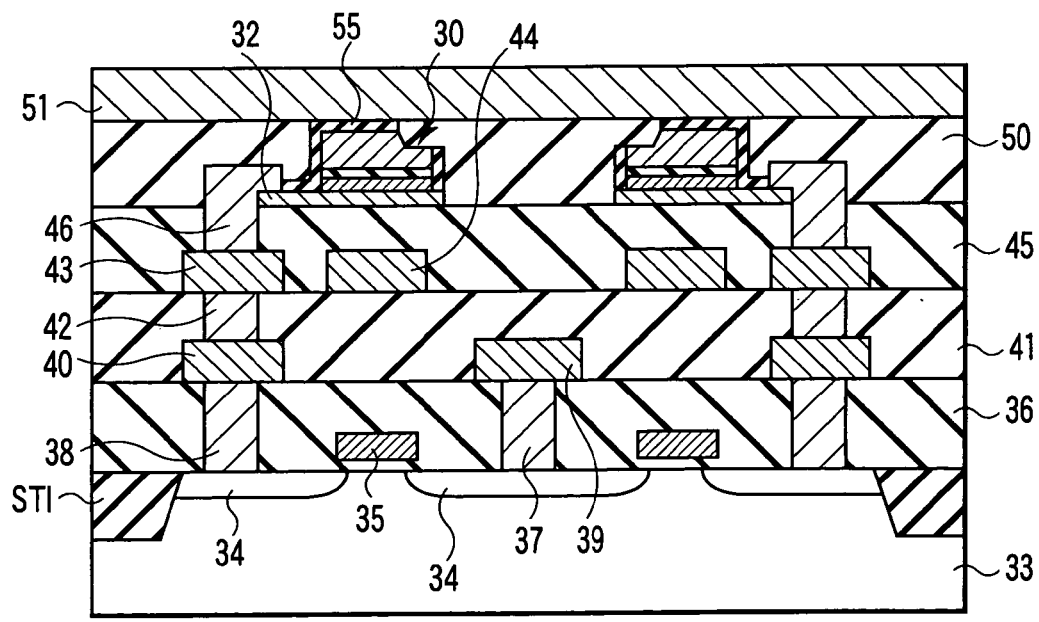

FIG. 46 is a sectional view of the MRAM according to a third modification of the fourth embodiment. As shown, in the MRAM 10 according to the present modification, in the structure described in the fourth embodiment, the insulating films 55 are formed on the side surfaces of the magneto-resistive elements 30 as described in the first modification of the first embodiment, and further the bumps are formed on the upper surfaces of the ferromagnetic layers 49 as described in the second embodiment.

After forming the bumps in the method described in the second embodiment and forming the insulating film 55 by the method described in the modification of the first embodiment, the contact plugs 46 are formed in the method described in the fourth embodiment to obtain the MRAM according to the present modification.

According to the present modification, the effects (1) to (5), (7), and (8) can be obtained.

It is to be noted that it is possible to apply the fabricating method described in the second modification of the first embodiment even to the present embodiment.

Figure 47:
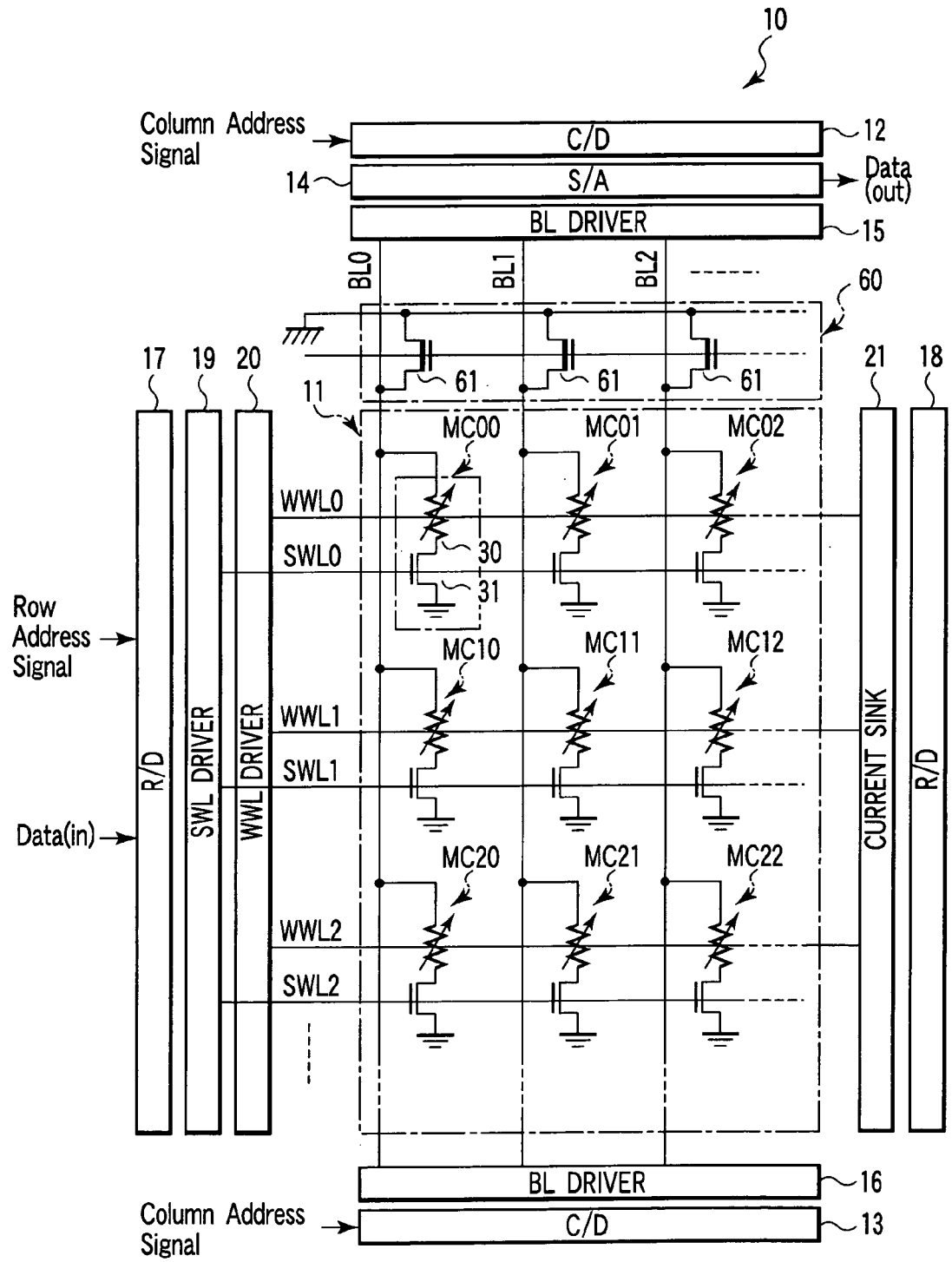
FIG. 47 is a block diagram of the MRAM according to a fifth embodiment of the present invention.

Next, the semiconductor memory device according to a fifth embodiment of the present invention will be described with reference to FIG. 47. FIG. 47 is a block diagram of the MRAM according to the present embodiment. In the present embodiment, the bit line is connected to the ground potential at the time of the fabricating of the MRAM.

As shown, the MRAM 10 according to the present embodiment further comprises a switch group 60 in the structure of FIG. 1 described in the first embodiment. The switch group 60 comprises a plurality of switches 61. Each switch 61 is formed, for example, of a depletion type MOS transistor. The depletion type MOS transistor 61 is disposed for each of the bit lines BL0 to BLn. Moreover, drains are connected to the bit lines BL0 to BLn, and sources are connected to the ground potential. It is to be noted that a potential is applied to each gate such that the depletion type MOS transistor is in an off-state at the time of a usual operation of the MRAM. Moreover, since a gate voltage is not especially fixed at the fabricating time, a channel is formed and the transistor is in the off-state.

Figure 48:
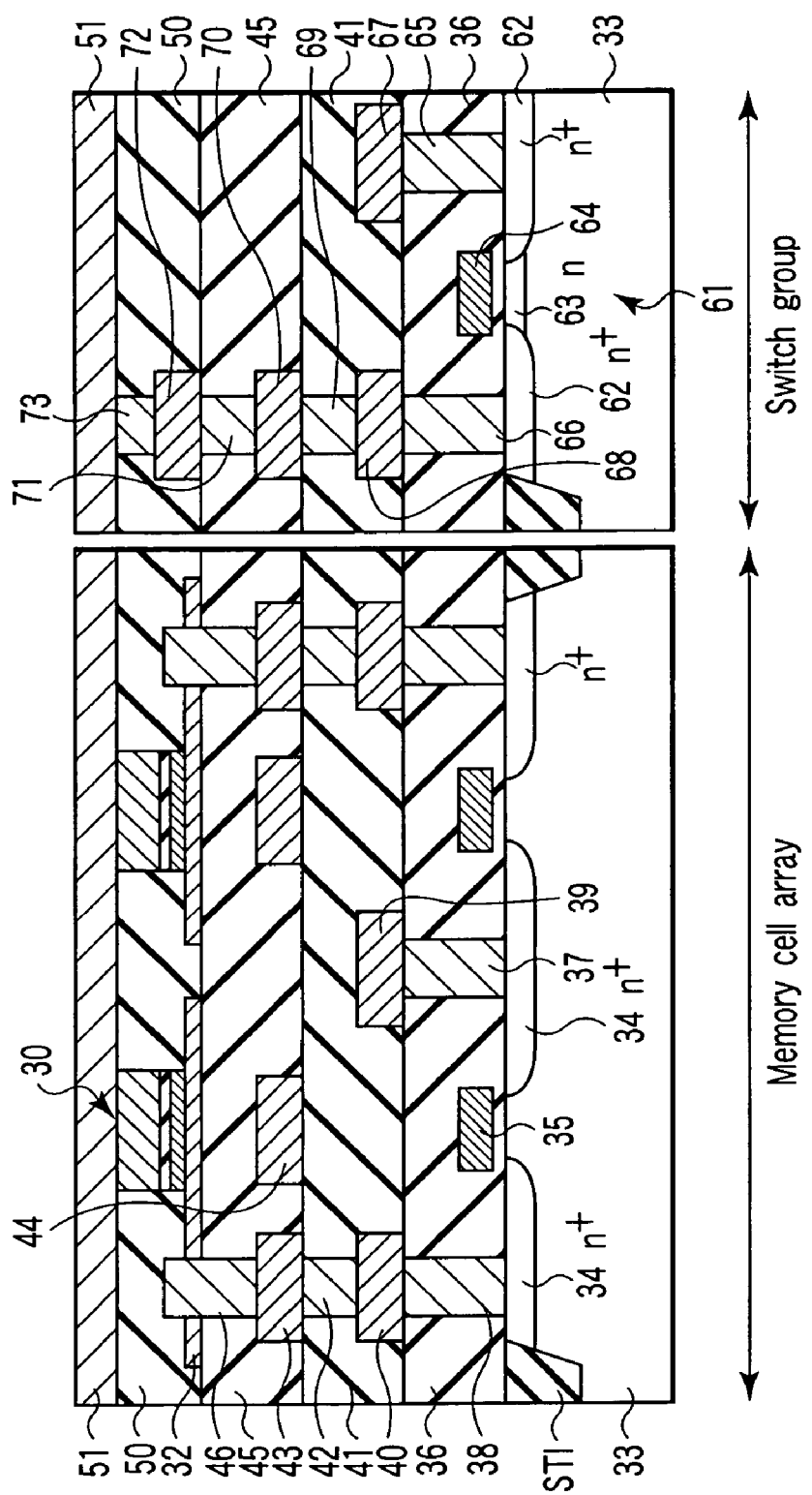
FIG. 48 is a sectional view of the MRAM according to the fifth embodiment of the present invention.

FIG. 48 is a sectional view of the memory cell array 11 and switch group 60 of the MRAM 10 according to the present embodiment. Since the structure of the memory cell array 11 is described in the first embodiment, the description is omitted. Therefore, only the structure in the switch group 60 will be described herein. It is to be noted that the structure of the memory cell array in the present embodiment will be described in accordance with an example similar to the first embodiment, but the structure may also conform to the modification of the first embodiment, the second to fourth embodiments, and the modifications of the embodiments.

As shown, the depletion type MOS transistor 61 is formed on the p-type semiconductor substrate 33. The MOS transistor 61 includes an impurity diffusion layer 62 formed in a surface region of the semiconductor substrate 33 to function as a source/drain region, and gate electrodes 64 formed between sources and drains on the semiconductor substrate 33 with a gate insulating film interposed therebetween. Each source region of the MOS transistor 61 is connected to the ground potential via a contact plug 65 and metal wiring layer 67. Each drain region of the MOS transistor 61 is connected to the bit line 51 via the contact plugs 66, 69, 71, 73 and metal wiring layers 68, 70, 72.

According to the MRAM of the present embodiment, the following effect (9) is obtained in addition to the effects (1) to (8) described in the first to fourth embodiments.

(9) The magneto-resistive element can be protected from the charge damage. This respect will be described below.

Figure 49:
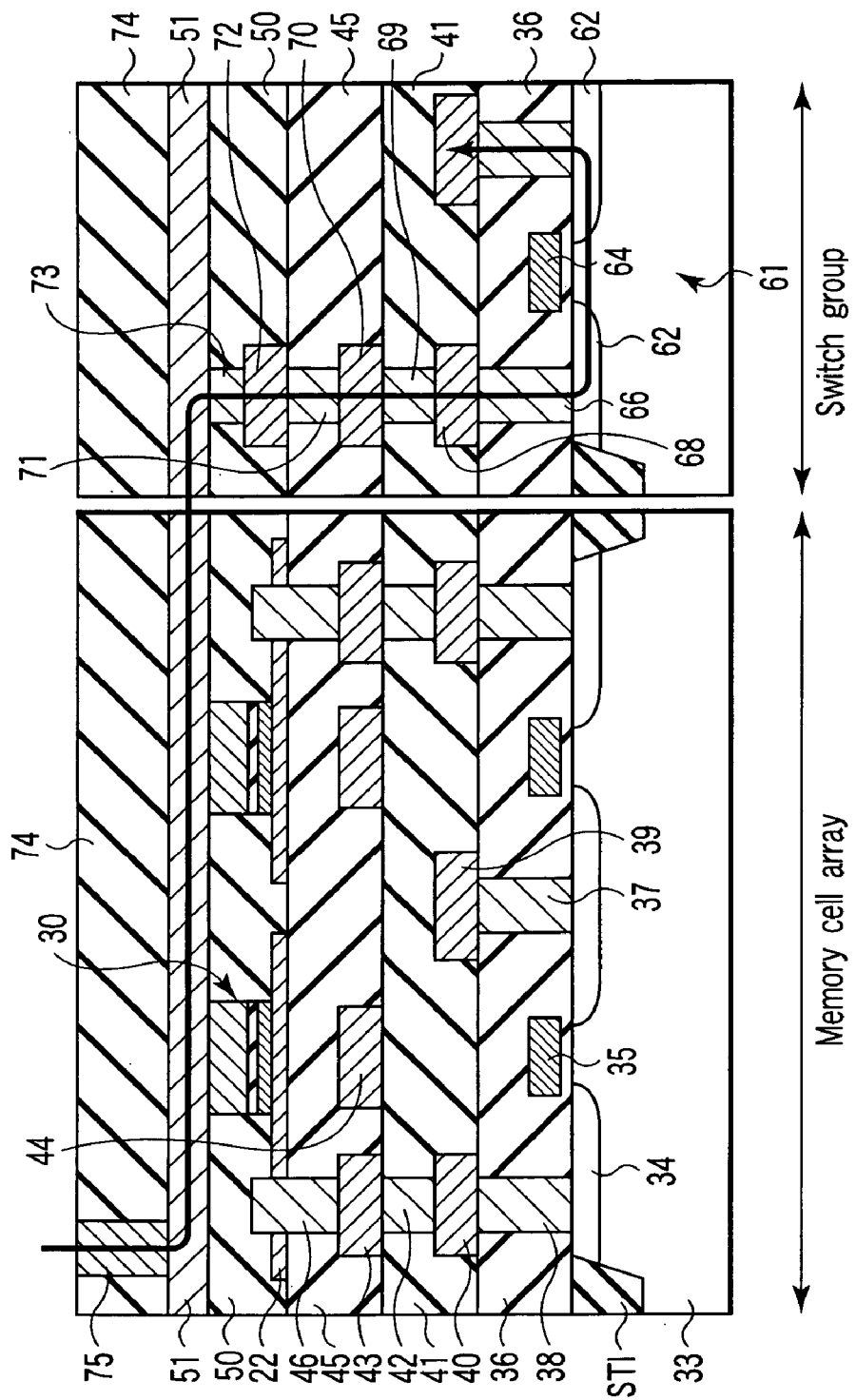
FIG. 49 is a sectional view of a partial fabricating process of the MRAM according to the fifth embodiment of the present invention.

The MRAM 10 of the present embodiment, needless to say, includes the interlayer insulating film or metal wiring layer even in the level above the bit line. Moreover, the depletion type MOS transistor 61 is disposed in which the current path is connected between the bit line and the ground potential. The depletion type MOS transistor 61 is in a normally-on time, that is, in an on-state at a usual time (gate voltage=0 V). Therefore, when the level above the bit line is processed using plasma, the charges accumulated on the semiconductor wafer can be released to the ground potential in a path via the bit line and the depletion type MOS transistor 61 as shown in FIG. 49. Therefore, the current can be prevented from flowing into the tunnel barrier film of the magneto-resistive element by the charge, and the magneto-resistive element can be protected from the charge damage.

Figure 50:
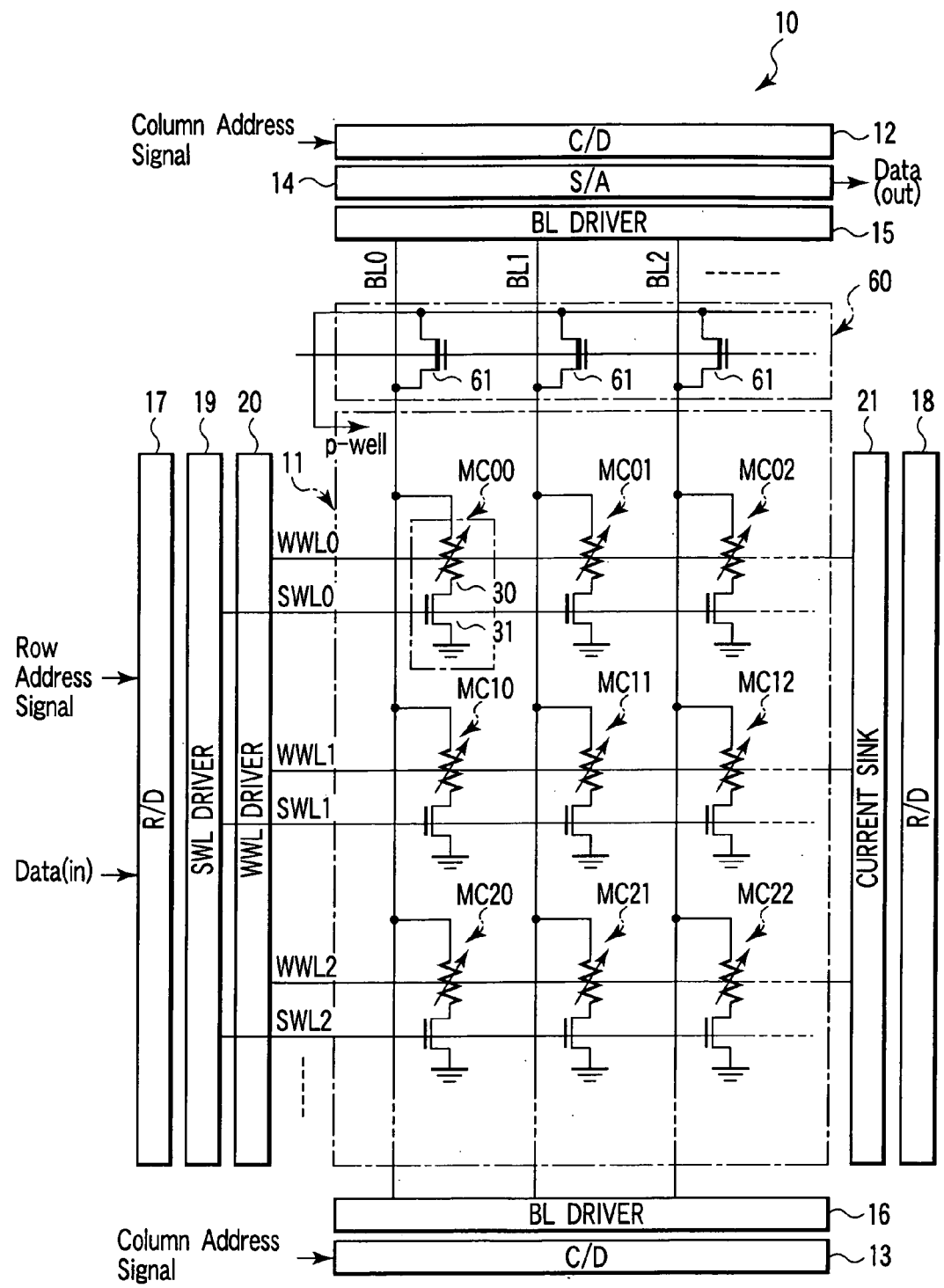
FIGS. 50 and 51 are block diagrams of the MRAM according to first and second modifications of the fifth embodiment of the present invention.
Figure 51:
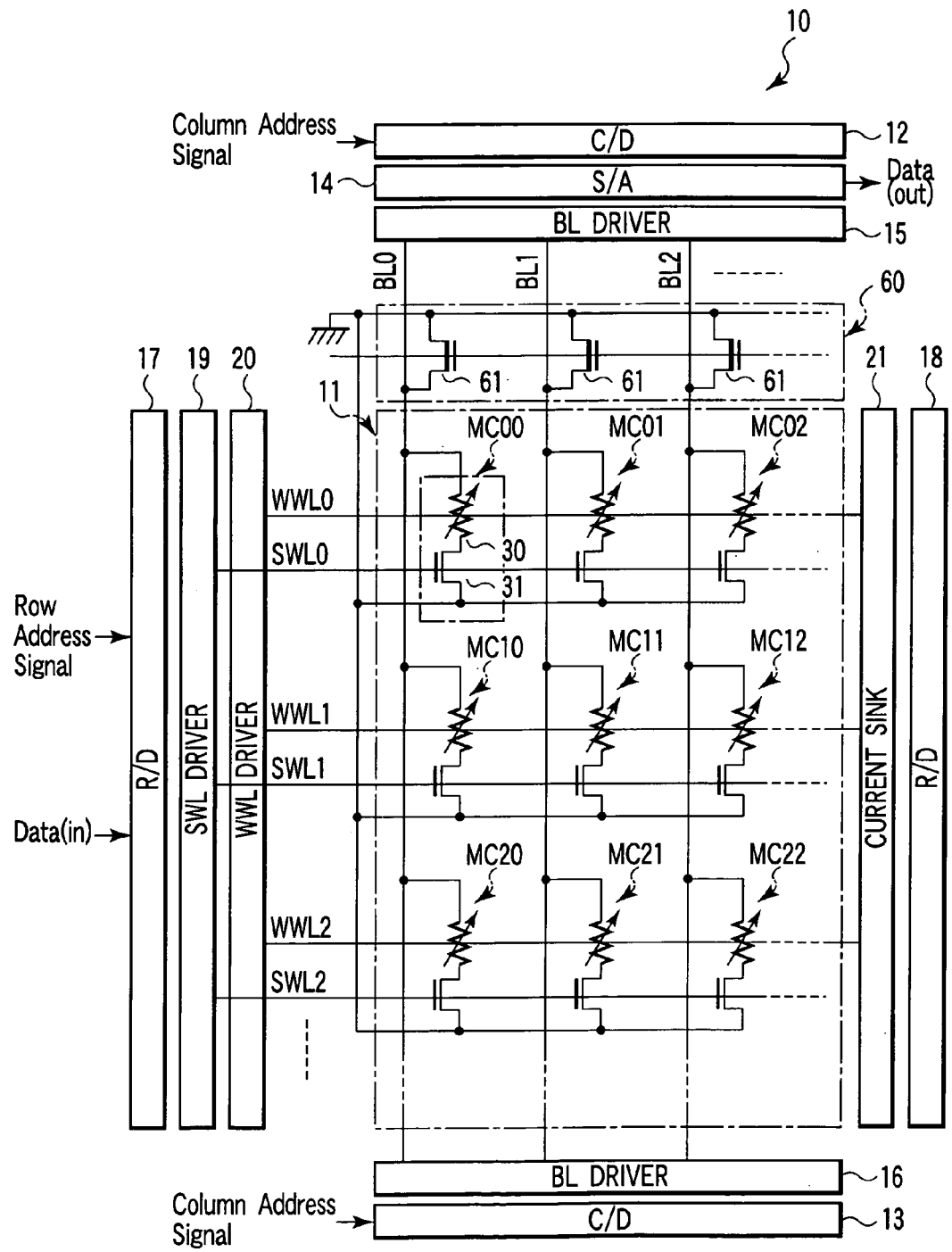

FIGS. 50 and 51 are block diagrams of the MRAM according to first and second modifications of the fifth embodiment. As shown, each source region of the depletion type MOS transistor 61 may be electrically connected to a well region in which the memory cell is formed, or may also be electrically connected to the source region of the switching transistor 31.

It is to be noted that in the present embodiment, the depletion type MOS transistor has been described as an example of a switching element, and, needless to say, the present embodiment is not limited to the depletion type MOS transistor, but the switching element in a normally-on state is preferably used.

Figure 52:
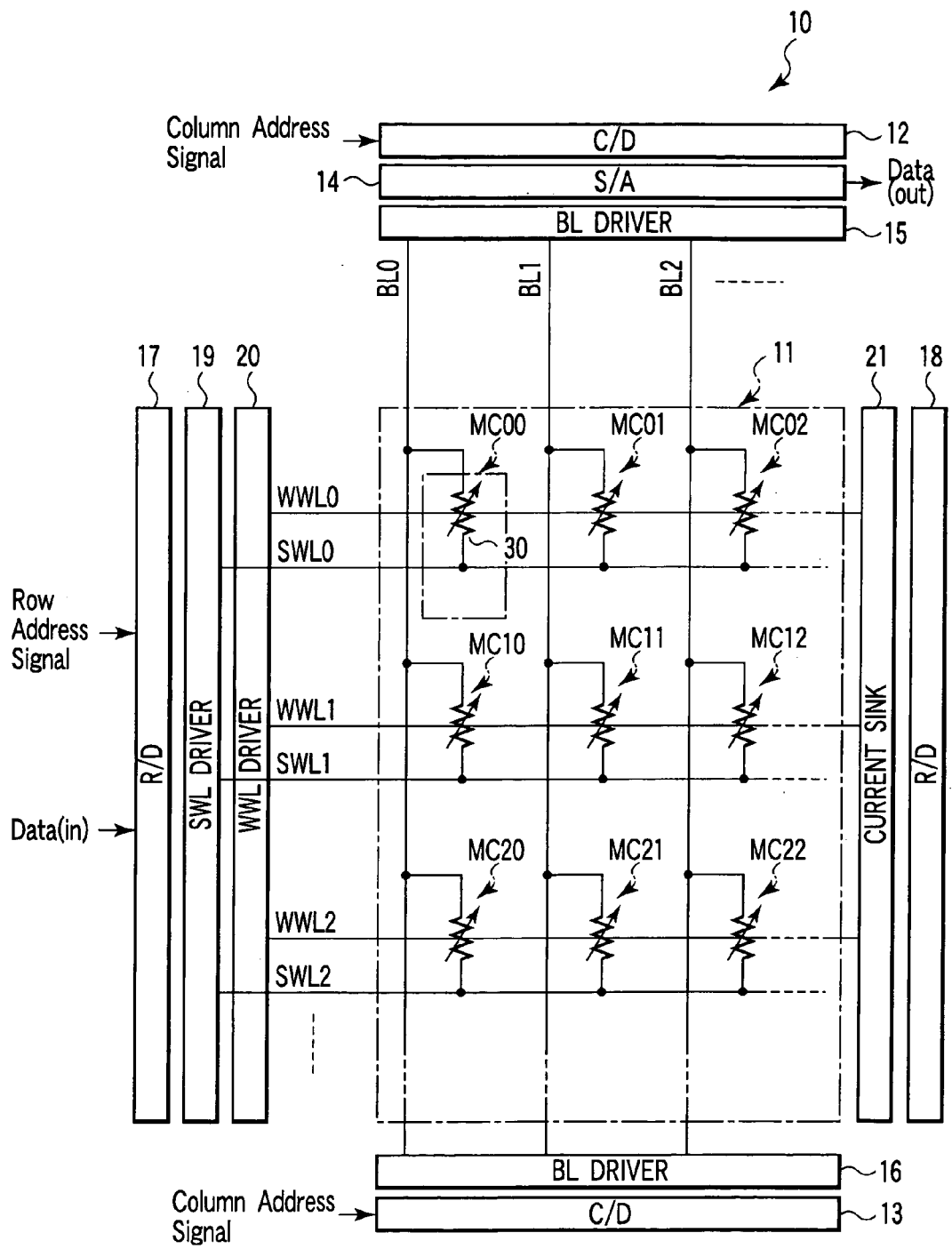
FIG. 52 is a block diagram of the MRAM according to a sixth embodiment of the present invention.

Next, the semiconductor memory device according to a sixth embodiment of the present invention will be described with reference to FIG. 52. FIG. 52 is a block diagram of the MRAM according to the present embodiment. In the present embodiment, the structures of the first to fourth embodiments are applied to a cross point type MRAM.

As shown, in the memory cell of the MRAM 10 according to the present embodiment, the switching transistor 31 is omitted from the structure described with reference to FIG. 1. Moreover, the other end of the magneto-resistive element 30 in the same row is connected in common to any of selection word lines SWL0 to SWLm.

Figure 53:
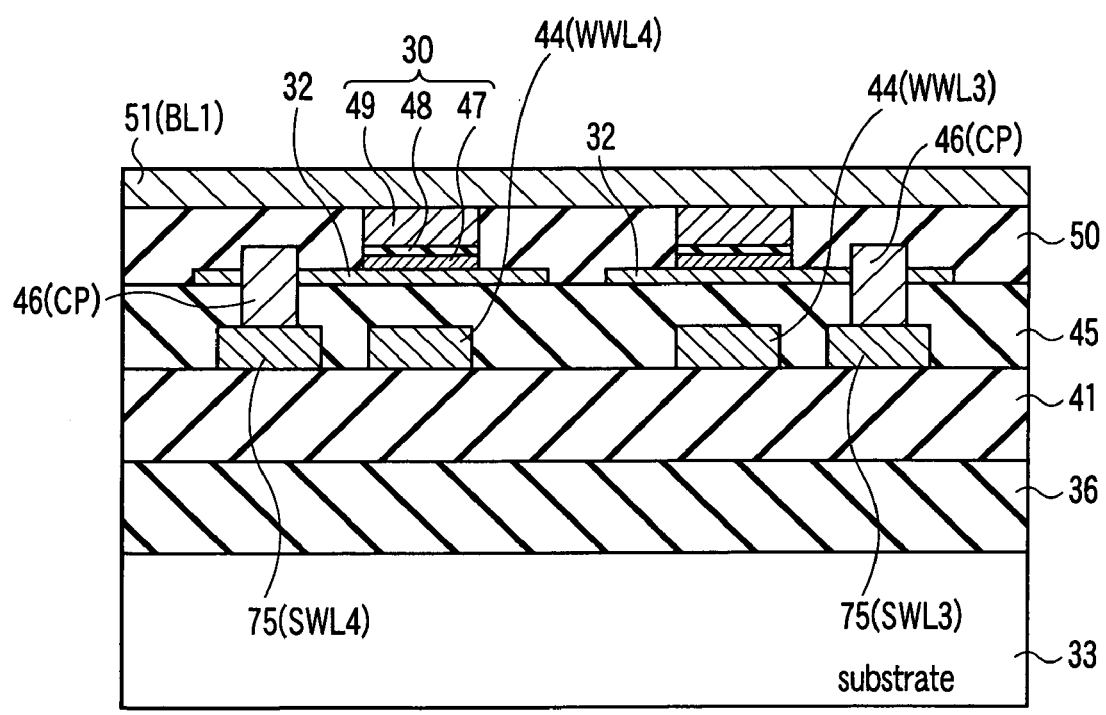
FIG. 53 is a sectional view of the MRAM according to the sixth embodiment of the present invention.

Since the plane pattern of the memory cell array 11 is similar to that of FIG. 2, the description is omitted. FIG. 53 is a sectional view of the memory cell array of the MRAM 10 according to the present embodiment in a direction along a 3—3 line in FIG. 2.

As shown, the interlayer insulating films 36, 41 are formed on the semiconductor substrate 33, and a metal wiring layer 75, and the metal wiring layer 44 electrically separated from the metal wiring layer 75 are formed on the interlayer insulating film 41. The metal wiring layer 75 functions as any of the selection word lines SWL0 to SWLm, the metal wiring layer 44 functions as any of write word lines WWL0 to WWLm, and both the layers are formed in the striped shape along the easy-axis direction.

Furthermore, the interlayer insulating film 45 is formed on the interlayer insulating film 41. The metal wiring layers 75, 44 are covered with the interlayer insulating film 45, and the contact plugs 46 are formed in the interlayer insulating film 45. The contact plugs 46 are connected to the metal wiring layer 75.

The structure in the level above the interlayer insulating film 45 is similar to that of the first embodiment. That is, the withdrawing wiring layers 32 are formed on the interlayer insulating film 45, and the magneto-resistive elements 30 are formed on the withdrawing wiring layers 32. Moreover, the metal wiring layer 51 functioning as the bit line is formed so as to contact the ferromagnetic layer 49 of the magneto-resistive element 30. It is to be noted that the structure of the memory cell array in the present embodiment similar to that in the first embodiment is described, but, needless to say, the structure may also conform to the modification of the first embodiment, the second to fourth embodiments, or the modifications of the embodiments.

As described above, the first to fourth embodiments may also be applied to the MRAM including the cross point type memory cell, and the effects (1) to (8) are obtained.

Figure 54:
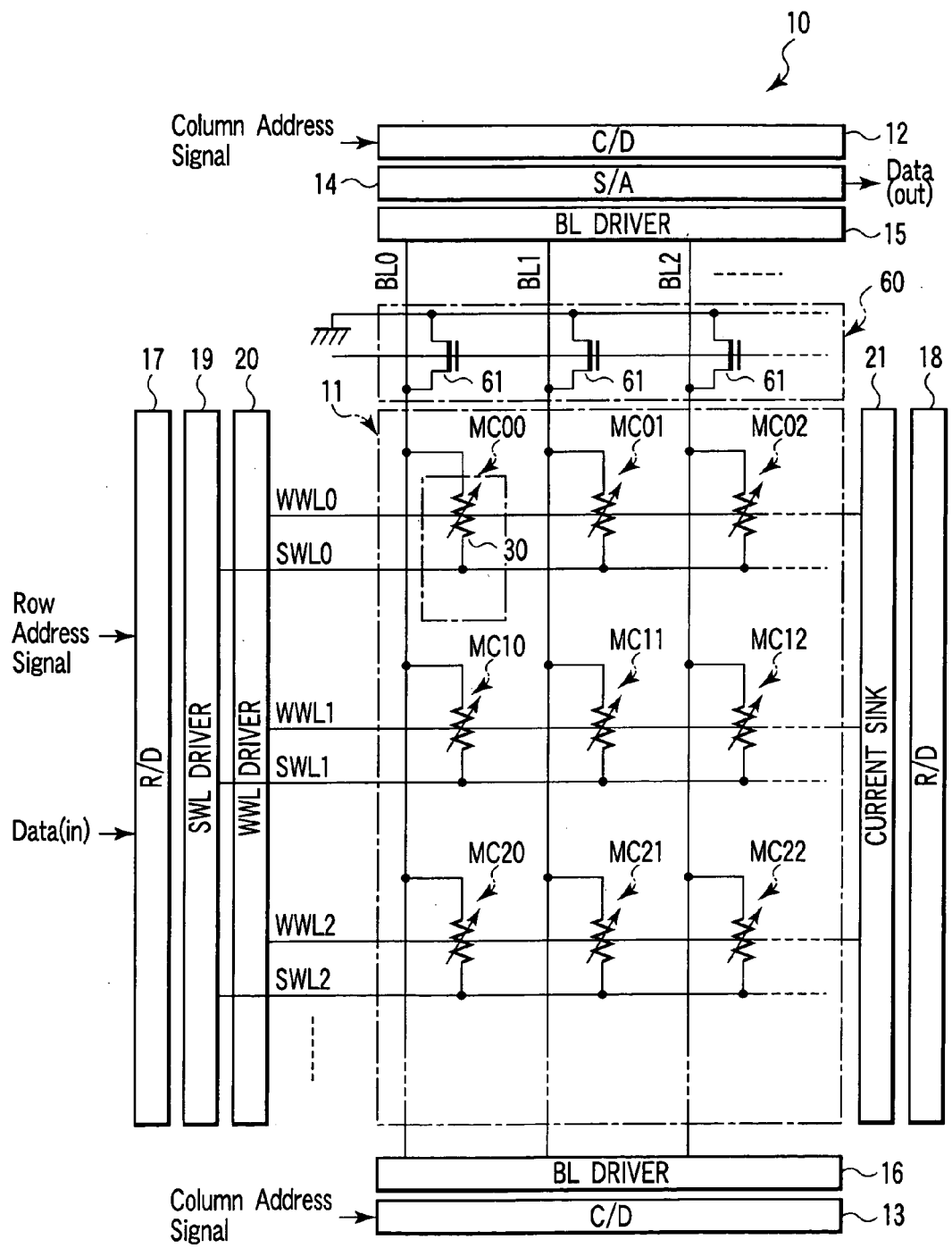
FIGS. 54 and 55 are block diagrams of the MRAM according to first and second modifications of the sixth embodiment of the present invention.
Figure 55:
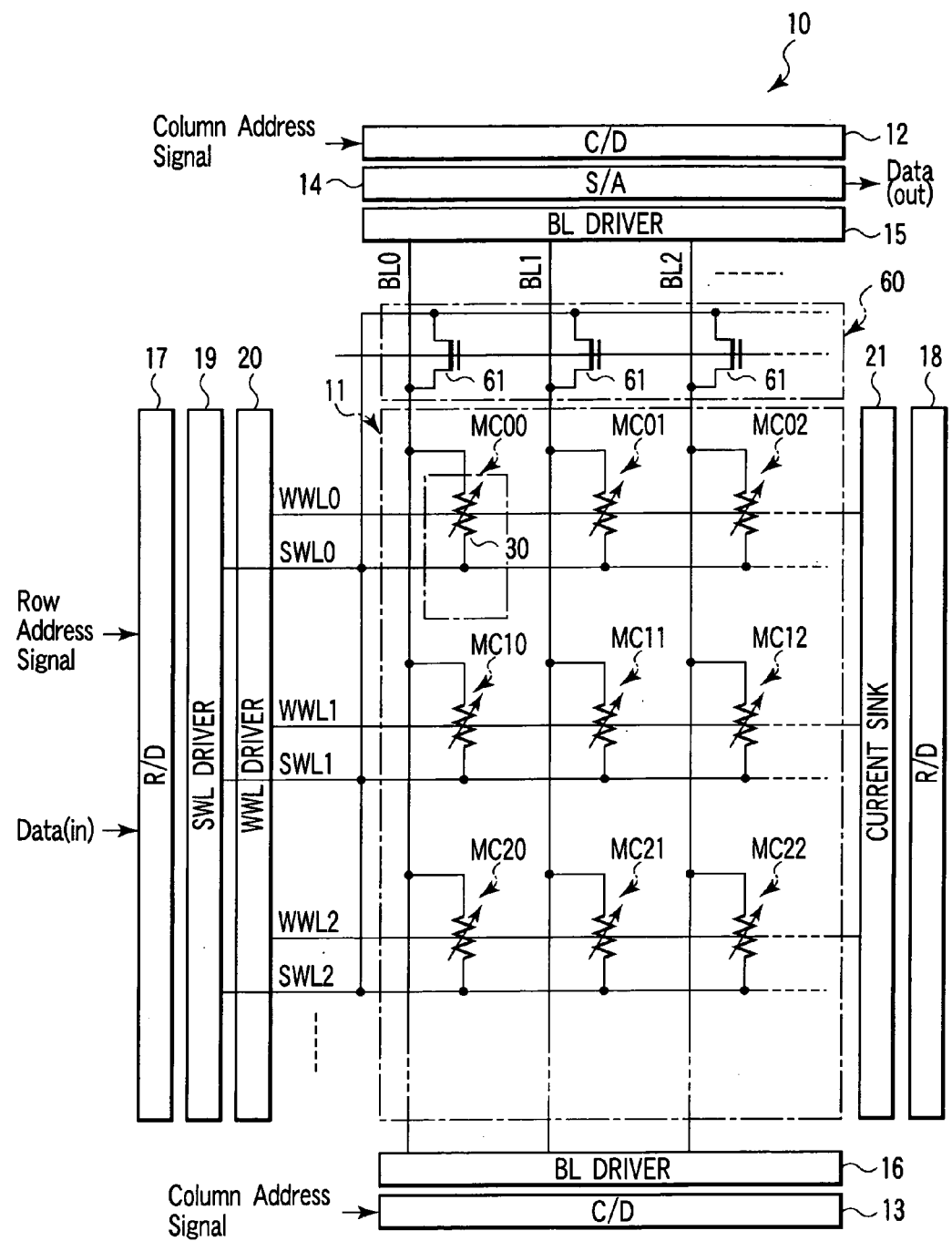

FIGS. 54 and 55 are block diagrams of the MRAM according to first and second modifications of the sixth embodiment, and the fifth embodiment is applied to the sixth embodiment.

As shown in FIG. 54, the switch group 60 is disposed, the bit lines are connected to the ground potentials via the current paths of the switching elements (depletion type MOS transistors) 61, and accordingly the effect (9) described in the fifth embodiment is obtained.

Moreover, as shown in FIG. 55, the similar effect is obtained in the cross point type memory cell, even when the source of the depletion type MOS transistor 61 is connected to one end of the magneto-resistive element (ferromagnetic film 47).

As described above, according to the first to sixth embodiments of the present invention, after patterning the magneto-resistive element, the contact plug electrically connecting the semiconductor substrate to the magneto-resistive element is formed. Therefore, even when the charge is accumulated in the semiconductor wafer surface in the step using the plasma, the charge can be inhibited from tunneling/flowing through the tunnel barrier film of the magneto-resistive element. Therefore, the magneto-resistive element can be protected from the charge damage.

It is to be noted that, for example, nitriding or fluoridizing may also be used in the method of forming the insulating film 55. Additionally, the insulating film 55 and the tunnel barrier film 48 may be preferably oxide, nitride, or fluoride containing the same metal element from viewpoints of fabricating yield and cost. For example, $Al_2O_3$, AlN, MgO, $HfO_2$, GaO, $LaAlO_3$, $MgF_2$, $CaF_2$ and the like are usable. It is to be noted that a slight loss of oxygen (nitrogen, fluorine) may also be generated in these compounds. The above-described fabricating steps are not limited to the above-described order, and the order may be changed as much as possible.

Moreover, in the first to sixth embodiments and the modifications, the memory cell using the MTJ element as the magneto-resistive element has been described in accordance with the example, but, for example, a GMR element or a colossal magneto-resistive (CMR) element may also be used.

Figure 56:
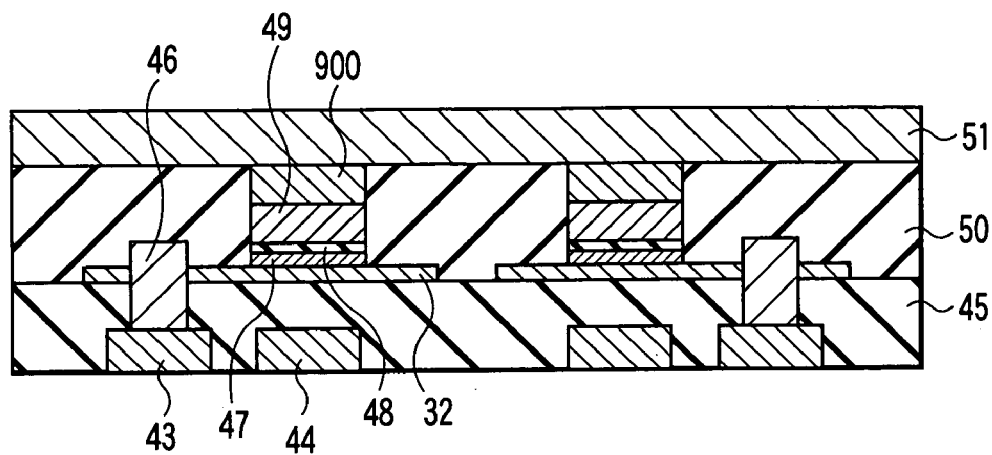
FIG. 56 is a sectional view of a magneto-resistive element disposed in the MRAM according to the first modification of the first to sixth embodiments of the present invention.
Figure 57:
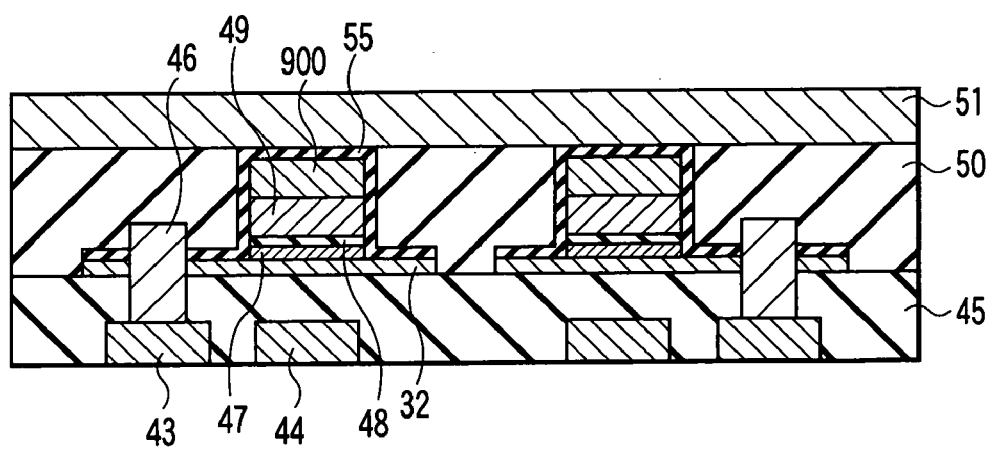
FIG. 57 is a sectional view of a magneto-resistive element disposed in the MRAM according to a second modification of the first to sixth embodiments of the present invention.
Figure 58:
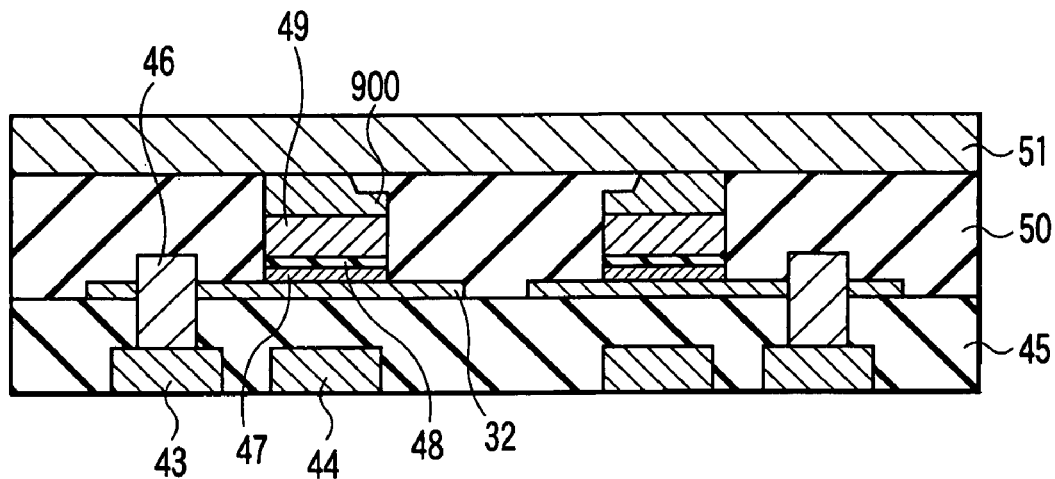
FIG. 58 is a sectional view of a magneto-resistive element disposed in the MRAM according to a third modification of the first to sixth embodiments of the present invention.
Figure 59:
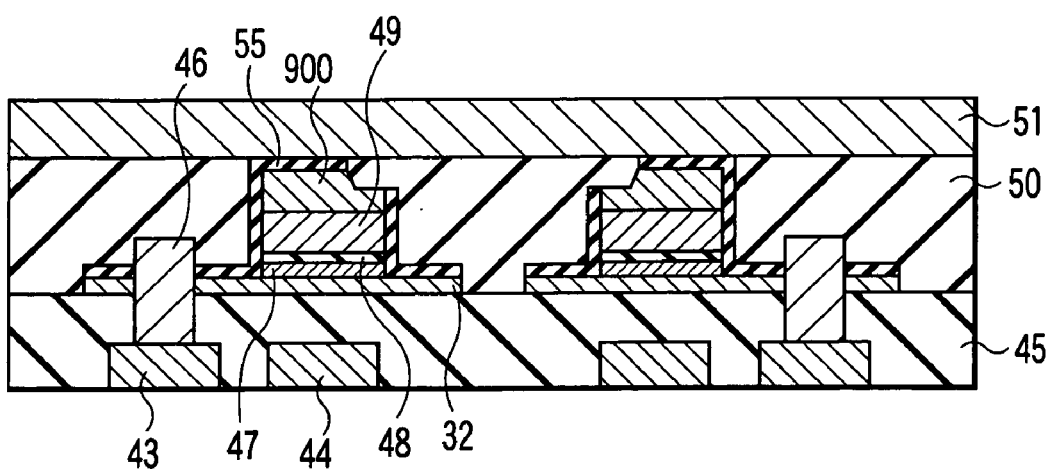
FIG. 59 is a sectional view of a magneto-resistive element disposed in the MRAM according to a fourth modification of the first to sixth embodiments of the present invention.

It is to be noted that, as described above, the magneto-resistive element disposed in the MRAM according to the first to sixth embodiments may also include a cap layer. FIG. 56 shows that the cap layer is formed on the ferromagnetic layer 49 in the first embodiment. As shown in FIG. 57, the insulating film 55 may also be formed around a cap layer 900 in the structure shown in FIG. 56. Furthermore, as shown in FIG. 58, the bump described in the second embodiment may also be formed on the upper surface of the cap layer 900, not on the ferromagnetic layer 49. Furthermore, as shown in FIG. 59, the insulating film 55 may also be formed in the step shown in FIG. 58.

The cap layer 900 may be formed on the ferromagnetic layer 49, for example, by the CVD process or the sputtering process in the step of FIG. 6 described in the first embodiment. It is to be noted that as an example, a method for fabricating the structure shown in FIG. 58 will be described with reference to FIGS. 60 and 61.

First, in the step of FIG. 6, after forming the cap layer 900 on the ferromagnetic layer 49, the cap layer 900 is patterned simultaneously with the patterning of the ferromagnetic layers 47, 49 and the tunnel barrier film 48.

Figure 60:
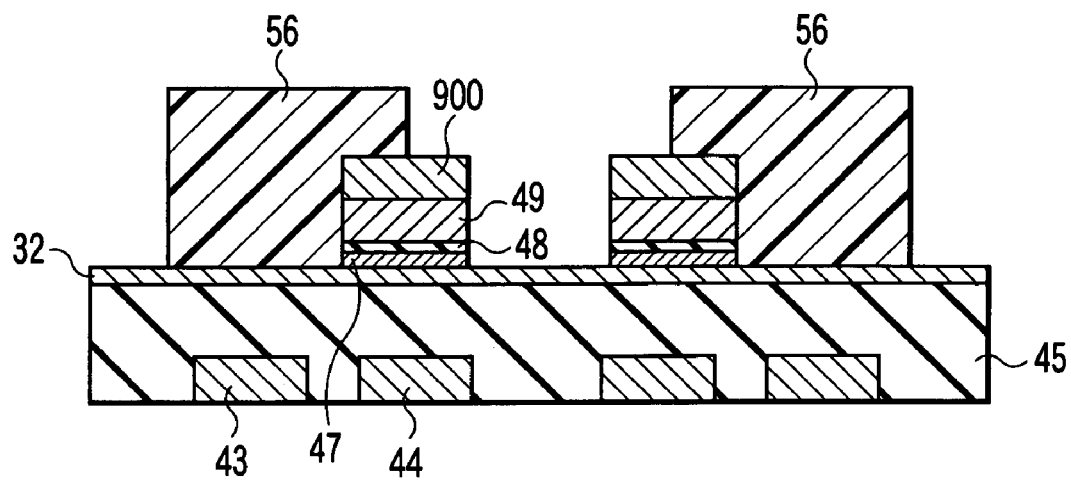
FIGS. 60 and 61 are sectional views of a partial fabricating process of the magneto-resistive element disposed in the MRAM according to the first modification of the first to sixth embodiments of the present invention.

Next, as shown in FIG. 60, the photo resist 56 is applied and patterned in a pattern forming the withdrawing wiring layer.

Figure 61:
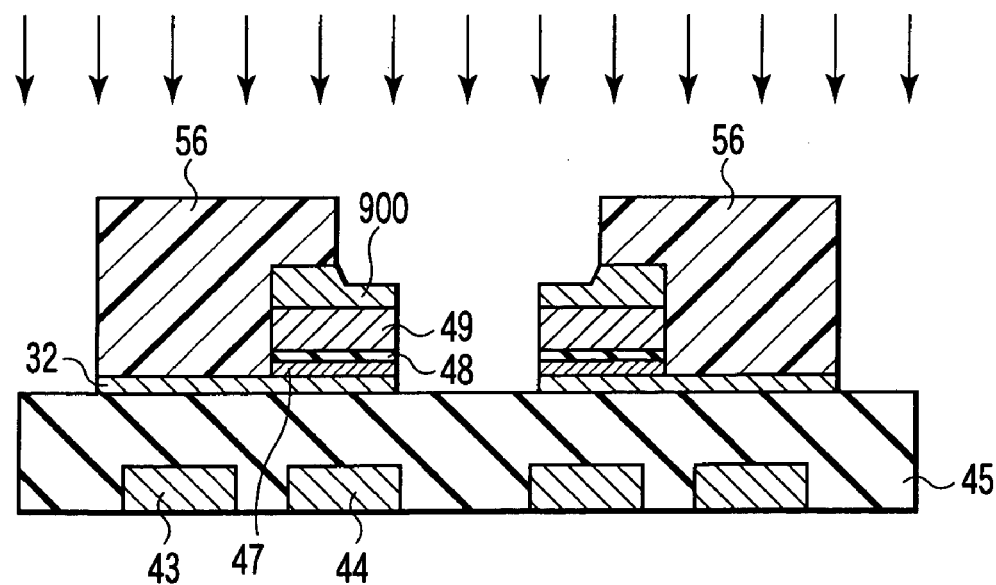

Moreover, as shown in FIG. 61, the metal wiring layer 32 is patterned using the photo resist 56 as the mask. In this case, a part of the upper surface of the cap layer 900 exposed from the photo resist 56 is also etched to form the bump as shown.

Various application examples are possible in a magnetic random access memory (semiconductor memory device) according to the first to sixth embodiments of the present invention. Some of these application examples are shown in FIGS. 62 to 68.

APPLICATION EXAMPLE 1

Figure 62:
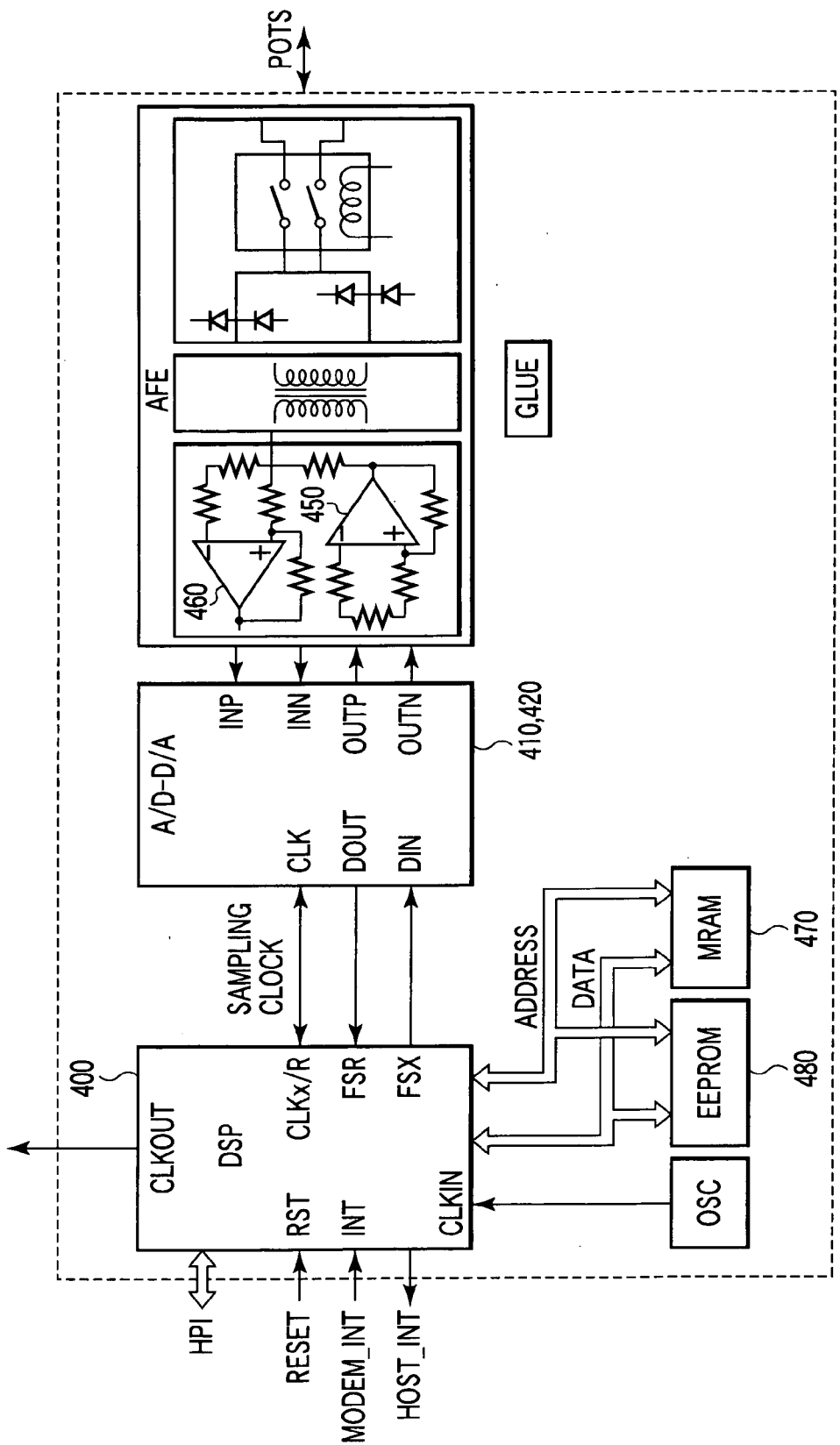
FIG. 62 is a block diagram of a model provided with the MRAM according to the first to sixth embodiments of the present invention.

As an example, FIG. 62 shows a DSL data path portion of a modem for a digital subscriber line (DSL). This modem includes a programmable digital signal processor (DSP) 400, an analog/digital converter 410, a digital/analog converter 420, filters 430, 440, a transmission driver 450, and a receiver amplifier 460. A band pass filter is omitted from FIG. 56. Instead, a magnetic random access memory 470 according to the first to sixth embodiments of the present invention and EEPROM 480 are shown as optional memories of various types capable of holding a line code program.

It is to be noted that in the present application example, two types of memories including the magnetic random access memory and EEPROM are used as the memory for holding the line code program. However, the EEPROM may also be replaced with the magnetic random access memory, or only the magnetic random access memory may also be used instead of using two types of memories.

APPLICATION EXAMPLE 2

Figure 63:
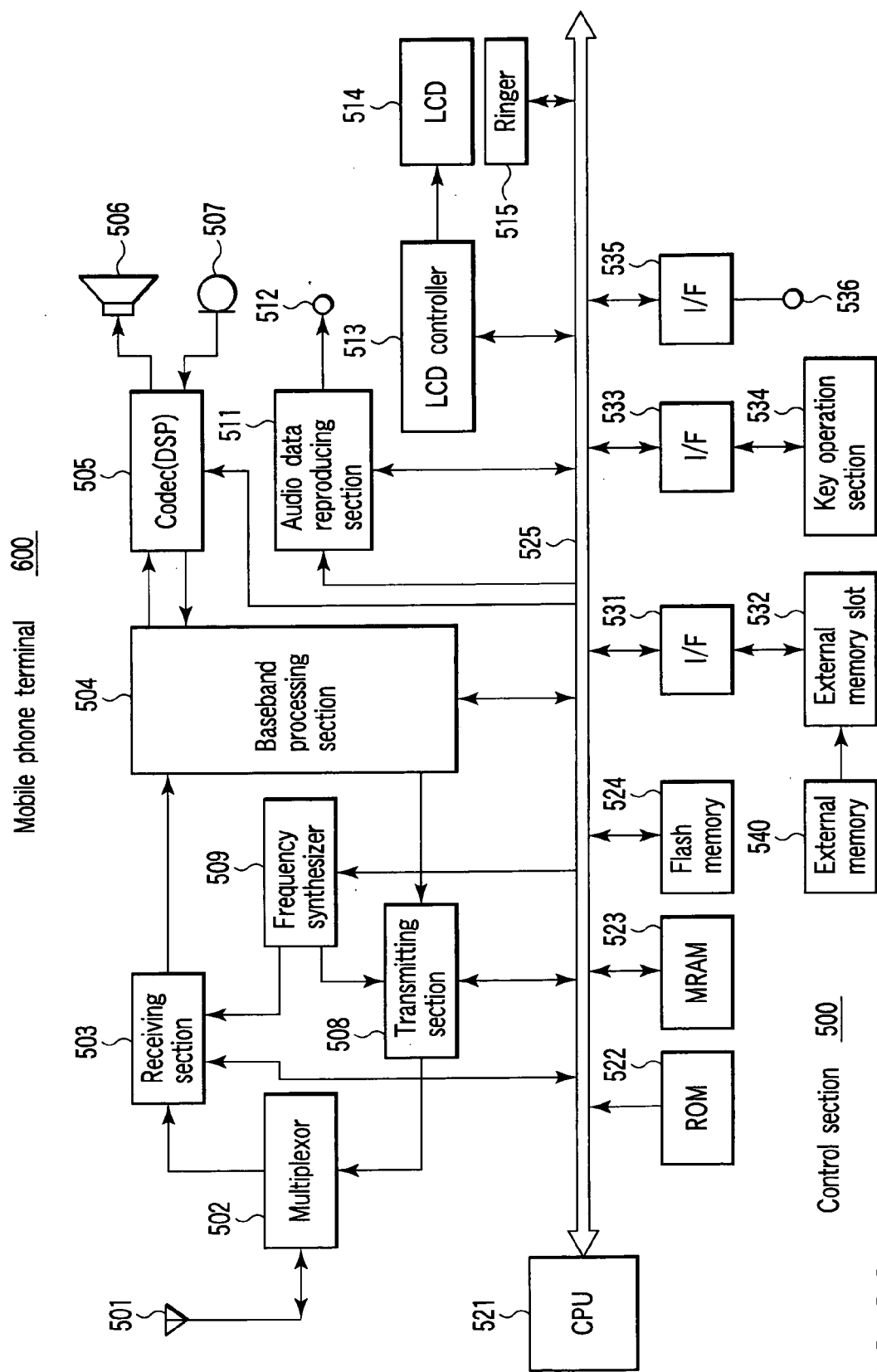
FIG. 63 is a block diagram of a cellular phone terminal provided with the MRAM according to the first to sixth embodiments of the present invention.

As another example, FIG. 63 shows a part which realizes a communication function in a mobile phone terminal. As shown in FIG. 63, the part which realizes the communication function comprises a transmission/reception antenna 501, an antenna sharing unit 502, a receiving section 503, a baseband processing section 504, a digital signal processor (DSP) 505 for use as a sound codec, a speaker (phone receiver) 506, a microphone (phone transmitter) 507, a transmitting section 508, and a frequency synthesizer 509.

Moreover, as shown in FIG. 63, a mobile phone terminal 600 includes a control section 500 which controls each section of the mobile phone terminal. The control section 500 is a microcomputer in which a CPU 521, a ROM 522, a magnetic random access memory (MRAM) 523 according to the first to sixth embodiments of the present invention, and a flash memory 524 are connected/formed via a CPU bus 525.

Here, the ROM 522 stores programs to be executed in the CPU 521 and required data such as fonts for display beforehand. The MRAM 523 is used mainly as an operation region, and is used in a case where data being computed is stored if necessary, or data exchanged between the control section 500 and each section is temporarily stored during program execution by the CPU 521. Moreover, in the flash memory 524, for example, set conditions immediately before turning off a power supply of the mobile phone terminal 600 are stored beforehand, even when the power supply is turned off. Moreover, setting parameters are stored for a use method requiring the same setting at a time when the power supply is turned on next. That is, the flash memory 524 is a nonvolatile memory in which the stored data does not disappear, even when the power supply of the mobile phone terminal is turned off.

It is to be noted that in the present application example, the ROM 522, MRAM 523, and flash memory 524 are used, but the flash memory 524 may also be replaced with the magnetic random access memory according to the first to sixth embodiments of the present invention. Furthermore, the ROM 522 may also be replaced with the magnetic random access memory according to the first to sixth embodiments of the present invention.

APPLICATION EXAMPLE 3

FIGS. 64 to 68 show examples in which the magnetic random access memories according to the first to sixth embodiments of the present invention are applied to a card (MRAM card) for storing contents of media such as smart media.

Figure 64:
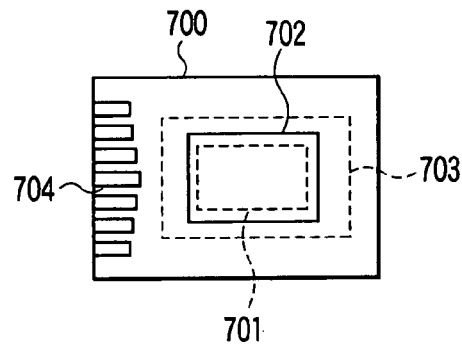
FIG. 64 is a block diagram of a card provided with the MRAM according to the first to sixth embodiments of the present invention.

In FIG. 64, an MRAM card 700 includes an MRAM chip 701, an opening 702, a shutter 703, and external terminals 704. The MRAM chip 701 is stored in the card main body 700, and is exposed to the outside via the opening 702. When the MRAM card is carried, the MRAM chip 701 is covered with the shutter 703. The shutter 703 is formed of a material having an effect of shielding an external magnetic field, such as ceramic. When the data is transferred, the shutter 703 is opened to expose the MRAM chip 701. The external terminals 704 are disposed to extract the content data stored in the MRAM card to the outside.

Figure 65:
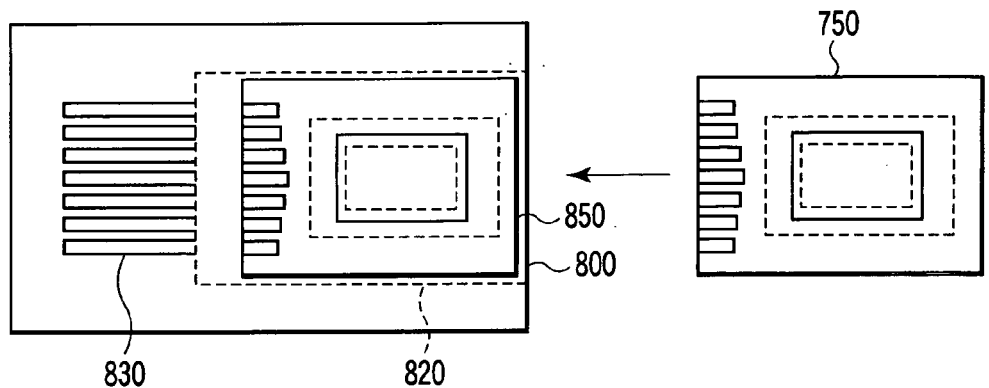
FIG. 65 is a top plan view of a transfer device which transfers data of the card provided with the MRAM according to the first to sixth embodiments of the present invention.
Figure 66:
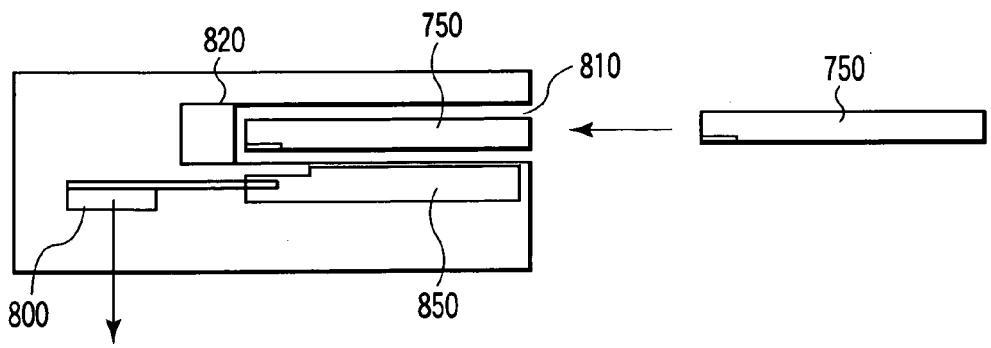
FIG. 66 is a sectional view of the transfer device which transfers the data of the card provided with the MRAM according to the first to sixth embodiments of the present invention.

FIGS. 65, 66 show a transfer device for transferring data to the MRAM card, and are a top plan view and a sectional view of the transfer device of a card insertion type. A second MRAM card 750 for use by an end user is inserted into a transfer device 800 via an insertion portion 810, and pushed in until the card is stopped by a stopper 820. The stopper 820 is also used as a member for positioning a first MRAM 850 and the second MRAM card. At the same time the second MRAM card 750 is disposed in a predetermined position, the data stored in the first MRAM is transferred to the second MRAM card.

Figure 67:
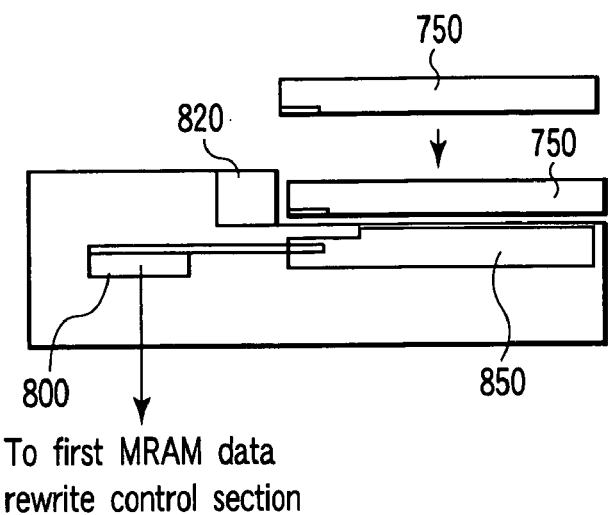
FIG. 67 is a sectional view of the transfer device which transfers the data of the card provided with the MRAM according to the first to sixth embodiments of the present invention.

FIG. 67 shows a transfer device of a fit-in type. As shown by an arrow in the drawing, the second MRAM card is fitted onto the first MRAM using the stopper 820 as a mark. Since a transfer method is the same as that of the card insertion type, the description is omitted.

Figure 68:
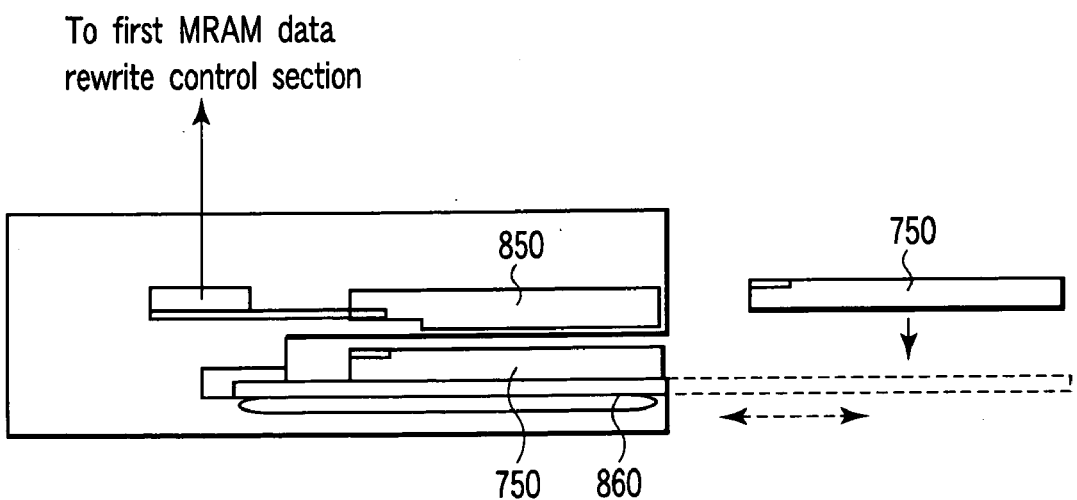
FIG. 68 is a sectional view of the transfer device which transfers the data of the card provided with the MRAM according to the first to sixth embodiments of the present invention.

FIG. 68 shows a slide type transfer device. In this device, a tray slide 860 is disposed in the transfer device 800 in the same manner as in CD-ROM drive and DVD drive. The tray slide 860 operates as shown by an arrow in the drawing. When the tray slide 860 moves to a state shown by a dotted line in the drawing, the second MRAM card 750 is laid on the tray slide 860, and the second MRAM card is conveyed into the transfer device 800. The slide type is the same as the card insertion type in that the second MRAM card is conveyed until a tip portion of the card abuts on the stopper 820 and in the transfer method, and therefore the description is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
   a first wiring layer formed in an interlayer insulating film;
   a second wiring layer formed on the interlayer insulating film;
   a memory cell comprising a first ferromagnetic film formed on the second wiring layer, a tunnel barrier film formed on the first ferromagnetic film, and a second ferromagnetic film formed on the tunnel barrier film; and
   a contact plug which is formed on the first wiring layer and which connects the first wiring layer to the second wiring layer, an upper terminating position of the contact plug being higher than an upper surface of the second wiring layer.

2. The device according to claim 1, wherein the contact plug contacts side and upper surfaces of the second wiring layer.

3. The device according to claim 1, wherein the contact plug extends through the second wiring layer and reaches the first wiring layer.

4. The device according to claim 1, wherein the contact plug contacts an end portion of the second wiring layer.

5. The device according to claim 1, wherein a diameter of the contact plug in a region above the second wiring layer is larger than that of the contact plug in a region below the second wiring layer.

* * * * *